(12) United States Patent
Finn et al.

(10) Patent No.: US 10,599,972 B2
(45) Date of Patent: Mar. 24, 2020

(54) SMARTCARD CONSTRUCTIONS AND METHODS

(71) Applicants: David Finn, Tourmakeady (IE); Mustafa Lotya, Celbridge (IE); Darren Molloy, Galway (IE)

(72) Inventors: David Finn, Tourmakeady (IE); Mustafa Lotya, Celbridge (IE); Darren Molloy, Galway (IE)

(73) Assignee: Féinics AmaTech Teoranta, Lower Churchfield, Tourmakeady, County Mayo (IE)

( * ) Notice: Subject to any disclaimer, the term of this patent is extended or adjusted under 35 U.S.C. 154(b) by 0 days.

(21) Appl. No.: 16/199,271

(22) Filed: Nov. 26, 2018

(65) Prior Publication Data

US 2019/0114526 A1    Apr. 18, 2019

Related U.S. Application Data

(63) Continuation-in-part of application No. 15/969,816, filed on May 3, 2018, now Pat. No. 10,518,518,
(Continued)

(51) Int. Cl.
*G06K 19/06* (2006.01)
*G06K 19/077* (2006.01)
(Continued)

(52) U.S. Cl.
CPC . *G06K 19/07794* (2013.01); *G06K 19/07769* (2013.01); *G06K 19/07783* (2013.01);
(Continued)

(58) Field of Classification Search
CPC ....... G06K 19/07769; G06K 19/07783; G06K 19/07794; H01F 27/2804; H01F 38/14;
(Continued)

(56) References Cited

U.S. PATENT DOCUMENTS 5,084,699 A    1/1992  DeMichele
5,206,494 A *  4/1993  Metzger ........... G06K 19/06187
                                                        235/487

(Continued)

FOREIGN PATENT DOCUMENTS

DE    19632115    12/1997
EP    0782214     7/1997
(Continued)

OTHER PUBLICATIONS

U.S. Appl. No. 15/939,281, filed Mar. 29, 2018, Finn et al.
(Continued)

*Primary Examiner* — Thien M Le
(74) *Attorney, Agent, or Firm* — Gerald E Linden

(57) ABSTRACT

Smartcards having (i) a metal card body (MCB) with a slit (S) overlapping a module antenna (MA) of a chip module (TCM) or (ii) multiple metal layers (M1, M2, M3) each having a slit (S1, S2, S3) offset from or oriented differently than each other. A front metal layer may be continuous (no slit), and may be shielded from underlying metal layers by a shielding layer (SL). Metal backing inserts (MBI) reinforcing the slit(s) may also have a slit (S2) overlapping the module antenna. Diamond like carbon coating filling the slit. Key fobs similarly fabricated. Smart cards with metal card bodies (MCB). Plastic-Metal-Plastic smartcards and methods of manufacture are disclosed. Such cards may be contactless only, contact only, or may be dual-interface (contact and contactless) cards.

18 Claims, 25 Drawing Sheets

Related U.S. Application Data which is a continuation-in-part of application No. 15/939,281, filed on Mar. 29, 2018, which is a continuation-in-part of application No. 15/358,138, filed on Nov. 22, 2016, now Pat. No. 9,960,476, which is a continuation-in-part of application No. 15/072,356, filed on Mar. 17, 2016, now Pat. No. 9,836,684, application No. 16/199,271, filed on Nov. 26, 2018, which is a continuation-in-part of application No. 15/939,282, filed on Mar. 29, 2018, now Pat. No. 10,552,722, which is a continuation-in-part of application No. 15/358,138, which is a continuation-in-part of application No. 15/197,795, filed on Jun. 30, 2016, now Pat. No. 9,812,782, and a continuation-in-part of application No. 15/072,356, filed on Mar. 17, 2016, now Pat. No. 9,836,684, application No. 16/199,271, filed on Nov. 26, 2018, which is a continuation-in-part of application No. 15/818,785, filed on Nov. 21, 2017, now abandoned, and a continuation-in-part of application No. 15/662,305, filed on Jul. 28, 2017, now Pat. No. 10,193,211, which is a continuation-in-part of application No. 15/072,356, application No. 16/199,271, filed on Nov. 26, 2018, which is a continuation-in-part of application No. 15/969,816, which is a continuation-in-part of application No. 15/939,281, which is a continuation-in-part of application No. 15/358,138, which is a continuation-in-part of application No. 15/072,356, which is a continuation-in-part of application No. 14/862,119, filed on Sep. 22, 2015, now Pat. No. 9,697,459, which is a continuation-in-part of application No. 14/619,177, filed on Feb. 11, 2015, now abandoned, and a continuation-in-part of application No. 14/551,376, filed on Nov. 24, 2014, now Pat. No. 9,390,364, and a continuation-in-part of application No. 14/492,113, filed on Sep. 22, 2014, now Pat. No. 9,798,968, which is a continuation-in-part of application No. 14/465,815, filed on Aug. 21, 2014, now Pat. No. 9,475,086, and a continuation-in-part of application No. 14/173,815, filed on Feb. 6, 2014, now Pat. No. 9,195,932, and a continuation-in-part of application No. 13/744,686, filed on Jan. 18, 2013, now abandoned, said application No. 15/072,356 is a continuation-in-part of application No. 14/465,815, which is a continuation-in-part of application No. 14/281,876, filed on May 19, 2014, now Pat. No. 9,272,370, and a continuation-in-part of application No. 14/173,815, which is a continuation of application No. 14/020,884, filed on Sep. 8, 2013, now Pat. No. 9,033,250, said application No. 14/465,815 is a continuation-in-part of application No. 13/744,686.

(60) Provisional application No. 62/748,463, filed on Oct. 21, 2018, provisional application No. 62/712,216, filed on Jul. 31, 2018, provisional application No. 62/478,589, filed on Mar. 29, 2017, provisional application No. 62/371,768, filed on Aug. 7, 2016, provisional application No. 62/300,906, filed on Feb. 28, 2016, provisional application No. 62/289,189, filed on Jan. 30, 2016, provisional application No. 62/281,209, filed on Jan. 21, 2016, provisional application No. 62/258,531, filed on Nov. 22, 2015, provisional application No. 62/204,466, filed on Aug. 13, 2015, provisional application No. 62/201,578, filed on Aug. 6, 2015, provisional application No. 62/175,308, filed on Jun. 14, 2015, provisional application No. 62/163,962, filed on May 19, 2015, provisional application No. 62/150,307, filed on Apr. 21, 2015, provisional application No. 62/136,644, filed on Mar. 23, 2015, provisional application No. 62/102,103, filed on Jan. 12, 2015, provisional application No. 62/088,598, filed on Dec. 7, 2014, provisional application No. 62/080,332, filed on Nov. 16, 2014, provisional application No. 62/061,689, filed on Oct. 8, 2014, provisional application No. 62/044,394, filed on Sep. 1, 2014, provisional application No. 62/039,562, filed on Aug. 20, 2014, provisional application No. 62/035,430, filed on Aug. 10, 2014, provisional application No. 61/978,187, filed on Apr. 10, 2014, provisional application No. 61/971,636, filed on Mar. 28, 2014, provisional application No. 61/955,325, filed on Mar. 19, 2014.

(51) Int. Cl.
    *H01Q 1/22*      (2006.01)
    *H01Q 21/29*     (2006.01)
    *H01Q 7/00*      (2006.01)
    *H05K 1/16*      (2006.01)
    H05K 3/10        (2006.01)
    H01F 38/14       (2006.01)
    H01F 27/28       (2006.01)

(52) U.S. Cl.
    CPC ......... *H01Q 1/2216* (2013.01); *H01Q 1/2225* (2013.01); *H01Q 1/2283* (2013.01); *H01Q 7/00* (2013.01); *H01Q 21/29* (2013.01); *H05K 1/165* (2013.01); H01F 27/2804 (2013.01); H01F 38/14 (2013.01); H05K 3/103 (2013.01); H05K 2201/10098 (2013.01); Y10T 29/49018 (2015.01); Y10T 29/49162 (2015.01)

(58) Field of Classification Search
    CPC .. H01Q 1/2216; H01Q 1/2225; H01Q 1/2283; H01Q 21/29; H01Q 7/00; H05K 1/165; H05K 2201/10098; H05K 3/103; Y10T 29/49018; Y10T 29/49162
    See application file for complete search history.

(56) References Cited

U.S. PATENT DOCUMENTS

| | | |
|---|---|---|
| D341,092 S | 11/1993 | Wild |
| 5,281,855 A | 1/1994 | Hadden et al. |
| 5,581,065 A | 12/1996 | Nishikawa et al. |
| D378,064 S | 2/1997 | Wild |
| D404,319 S | 1/1999 | Deleskiewicz |
| 5,955,723 A | 9/1999 | Reiner |
| 5,982,624 A | 11/1999 | Onada et al. |
| 6,018,299 A | 1/2000 | Eberhardt |
| D423,374 S | 4/2000 | Deleskiewicz |
| 6,107,920 A | 8/2000 | Eberhardt et al. |
| 6,122,704 A * | 9/2000 | Hass ............... G01K 1/028 374/E1.006 |
| 6,147,605 A | 11/2000 | Vega et al. |
| 6,233,818 B1 | 5/2001 | Finn et al. |
| 6,265,977 B1 | 7/2001 | Vega et al. |
| 6,378,774 B1 | 4/2002 | Emori et al. |
| 6,452,563 B1 | 9/2002 | Porte |
| 6,491,782 B1 | 12/2002 | Jaynes |
| 6,581,839 B1 | 6/2003 | Lasch et al. |
| 6,611,199 B1 | 8/2003 | Geiszler et al. |
| 6,634,564 B2 | 10/2003 | Kuramochi |
| 6,698,089 B2 | 3/2004 | Finn et al. |
| 6,749,123 B2 | 6/2004 | Lasch et al. |
| 6,764,014 B2 | 7/2004 | Lasch et al. |
| 6,986,465 B2 | 1/2006 | Kiekhaefer |

(56) References Cited

U.S. PATENT DOCUMENTS

| | | | |
|---|---|---|---|
| 7,183,987 B2 | 2/2007 | Akiho et al. | |
| 7,306,158 B2 | 12/2007 | Berardi et al. | |
| 7,377,443 B2 | 5/2008 | Lasch et al. | |
| 7,420,187 B1* | 9/2008 | Klemic | G01T 1/10 250/484.5 |
| 7,440,771 B2 | 10/2008 | Purk | |
| 7,494,057 B2 | 2/2009 | Lasch et al. | |
| 7,530,491 B2 | 5/2009 | Lasch et al. | |
| 7,588,184 B2 | 9/2009 | Gandel et al. | |
| 7,607,583 B2 | 10/2009 | Berardi et al. | |
| 7,701,350 B2 | 4/2010 | Sakama et al. | |
| 7,721,956 B2 | 5/2010 | Williams et al. | |
| 7,757,957 B2 | 7/2010 | Cranston et al. | |
| 7,819,310 B2 | 10/2010 | Lasch et al. | |
| 7,823,777 B2 | 11/2010 | Varga et al. | |
| 7,837,116 B2 | 11/2010 | Morrill Webb et al. | |
| 7,934,646 B2 | 5/2011 | Yang | |
| 8,033,457 B2 | 10/2011 | Varga et al. | |
| 8,066,190 B2 | 11/2011 | Faenza, Jr. | |
| 8,079,514 B2 | 12/2011 | Lasch et al. | |
| 8,100,337 B2 | 1/2012 | Artigue et al. | |
| 8,130,166 B2 | 3/2012 | Ayala et al. | |
| 8,141,787 B2 | 3/2012 | Savry | |
| 8,186,582 B2 | 5/2012 | Varga et al. | |
| 8,186,598 B2 | 5/2012 | Faenza, Jr. | |
| 8,191,788 B2 | 6/2012 | Morrill-Webb et al. | |
| 8,261,997 B2 | 9/2012 | Gebhart | |
| 8,360,312 B2 | 1/2013 | Varga et al. | |
| 8,366,009 B2 | 2/2013 | Finn et al. | |
| 8,378,911 B2 | 2/2013 | Eray et al. | |
| 8,393,547 B2 | 3/2013 | Kiekhaefer | |
| 8,474,726 B2 | 7/2013 | Finn | |
| 8,523,062 B2 | 9/2013 | Varga et al. | |
| D693,264 S | 11/2013 | Rabassa | |
| 8,608,080 B2 | 12/2013 | Finn | |
| 8,608,082 B2 | 12/2013 | Le Garrec et al. | |
| 8,672,232 B2 | 3/2014 | Herslow | |
| 8,789,762 B2 | 7/2014 | Finn et al. | |
| 8,891,712 B2 | 11/2014 | Sugiyama et al. | |
| 8,991,712 B2 | 3/2015 | Finn et al. | |
| D729,074 S | 5/2015 | Boulangeot | |
| 8,976,075 B2 | 5/2015 | Kato et al. | |
| 9,033,250 B2 | 5/2015 | Finn et al. | |
| 9,112,272 B2 | 8/2015 | Finn et al. | |
| 9,165,240 B2 | 10/2015 | Finn et al. | |
| 9,195,932 B2 | 11/2015 | Finn et al. | |
| 9,203,157 B2 | 12/2015 | Kato et al. | |
| 9,272,370 B2 | 3/2016 | Finn et al. | |
| 9,390,364 B2 | 7/2016 | Finn et al. | |
| 9,449,269 B2 | 9/2016 | Finn et al. | |
| 9,475,086 B2 | 10/2016 | Finn et al. | |
| 9,489,613 B2 | 11/2016 | Finn et al. | |
| 9,564,678 B2 | 2/2017 | Kato et al. | |
| 9,622,359 B2 | 4/2017 | Finn et al. | |
| 9,633,304 B2 | 4/2017 | Finn et al. | |
| 9,634,391 B2 | 4/2017 | Finn et al. | |
| 9,697,459 B2 | 7/2017 | Finn et al. | |
| 9,721,200 B2 | 8/2017 | Herslow et al. | |
| 9,798,968 B2 | 10/2017 | Finn et al. | |
| 9,812,782 B2 | 11/2017 | Finn et al. | |
| 9,836,684 B2 | 12/2017 | Finn et al. | |
| 9,960,476 B2 | 5/2018 | Finn et al. | |
| 2003/0024995 A1* | 2/2003 | Conner | G06K 19/044 235/492 |
| 2003/0057288 A1 | 3/2003 | Salzgeber | |
| 2004/0011874 A1 | 1/2004 | Theodossiou et al. | |
| 2005/0194453 A1* | 9/2005 | Conner | G06K 19/044 235/492 |
| 2006/0192674 A1 | 8/2006 | Roberta | |
| 2006/0243811 A1 | 11/2006 | Koyama et al. | |
| 2007/0164414 A1 | 7/2007 | Dokai et al. | |
| 2009/0152362 A1 | 6/2009 | Ayala et al. | |
| 2009/0159657 A1 | 6/2009 | Chen et al. | |
| 2009/0169776 A1 | 7/2009 | Herslow | |
| 2009/0315320 A1 | 12/2009 | Finn | |
| 2010/0078329 A1 | 4/2010 | Mirsky et al. | |
| 2011/0023289 A1 | 2/2011 | Finn | |
| 2011/0090058 A1 | 4/2011 | Ikemoto | |
| 2011/0163167 A1 | 7/2011 | Artigue et al. | |
| 2011/0181486 A1 | 7/2011 | Kato | |
| 2011/0186641 A1 | 8/2011 | Kato et al. | |
| 2011/0189620 A1 | 8/2011 | Herslow | |
| 2012/0018522 A1 | 1/2012 | Le Garrec et al. | |
| 2013/0126622 A1 | 5/2013 | Finn | |
| 2013/0146670 A1 | 6/2013 | Grieshofer et al. | |
| 2013/0146671 A1 | 6/2013 | Grieshofer et al. | |
| 2013/0168454 A1 | 7/2013 | Oh et al. | |
| 2013/0271265 A1 | 10/2013 | Finn | |
| 2013/0320095 A1 | 12/2013 | Blum | |
| 2013/0332353 A1 | 12/2013 | Aidasani et al. | |
| 2013/0335186 A1* | 12/2013 | Chang | H01F 5/003 336/200 |
| 2014/0014732 A1 | 1/2014 | Finn et al. | |
| 2014/0021261 A1 | 1/2014 | Mosteller | |
| 2014/0070009 A1 | 3/2014 | Zambrano L. | |
| 2014/0102136 A1 | 4/2014 | Warren | |
| 2014/0104133 A1 | 4/2014 | Finn et al. | |
| 2014/0138443 A1 | 5/2014 | Blum | |
| 2014/0144993 A1 | 5/2014 | Seo et al. | |
| 2014/0166762 A1 | 6/2014 | Herslow | |
| 2014/0260424 A1 | 9/2014 | Warren | |
| 2014/0263655 A1 | 9/2014 | Forster | |
| 2014/0284386 A1 | 9/2014 | Finn et al. | |
| 2014/0292477 A1 | 10/2014 | Ahmadloo | |
| 2014/0361086 A1 | 12/2014 | Finn et al. | |
| 2015/0021402 A1 | 1/2015 | Finn et al. | |
| 2015/0021403 A1 | 1/2015 | Finn et al. | |
| 2015/0129665 A1 | 5/2015 | Finn et al. | |
| 2015/0136858 A1* | 5/2015 | Finn | G06K 19/07754 235/492 |
| 2015/0180229 A1 | 6/2015 | Herslow | |
| 2015/0235122 A1 | 8/2015 | Finn et al. | |
| 2015/0269474 A1 | 9/2015 | Finn et al. | |
| 2015/0269477 A1 | 9/2015 | Finn et al. | |
| 2016/0268672 A1* | 9/2016 | Liu | H01Q 1/2208 |
| 2016/0365644 A1 | 12/2016 | Finn et al. | |
| 2017/0017871 A1 | 1/2017 | Finn et al. | |
| 2018/0123221 A1 | 5/2018 | Finn et al. | |
| 2018/0339503 A1 | 11/2018 | Finn et al. | |
| 2018/0341846 A1 | 11/2018 | Finn et al. | |
| 2018/0341847 A1 | 11/2018 | Finn et al. | |
| 2019/0258911 A1* | 8/2019 | Amarnath | G06K 7/087 |

FOREIGN PATENT DOCUMENTS

| | | |
|---|---|---|
| EP | 1031939 | 8/2000 |
| EP | 1158601 | 11/2001 |
| EP | 02063489 | 2/2008 |
| EP | 1854222 | 6/2012 |
| EP | 2525304 | 11/2012 |
| EP | 2541471 | 2/2013 |
| EP | 2372840 | 9/2013 |
| JP | 11025244 | 1/1999 |
| JP | 11238103 | 8/1999 |
| JP | 2002344225 | 11/2002 |
| JP | 2005204038 | 7/2005 |
| WO | WO 2008081224 | 7/2008 |
| WO | WO 2013034426 | 3/2013 |
| WO | WO 2013110625 | 8/2013 |
| WO | WO 2014016332 | 1/2014 |
| WO | WO 2017198842 | 11/2017 |

OTHER PUBLICATIONS

U.S. Appl. No. 15/939,282, filed Mar. 29, 2018, Finn et al.
U.S. Appl. No. 15/818,785, filed Nov. 21, 2017, Finn et al.
U.S. Appl. No. 15/969,816, filed May 3, 2018, Finn et al.
U.S. Appl. No. 62/748,463, filed Oct. 21, 2018, Finn et al.
U.S. Appl. No. 61/978,187, filed Apr. 10, 2014, Finn et al.
U.S. Appl. No. 61/971,636, filed Mar. 28, 2014, Finn et al.
U.S. Appl. No. 61/955,325, filed Mar. 19, 2014, Finn et al.
U.S. Appl. No. 62/712,216, filed Jul. 31, 2018, Finn et al.

(56) References Cited

OTHER PUBLICATIONS

HP Indigo LEP Technology, Laura Field, TAPPI, PaperCon '09, 22 pages.
3L-ALOX™ Three Layer Substrate, Technical Specification, Ver 1.5, MCL Micro Components Ltd., Israel, 2016.
Use of Slits of Defined Width in Metal Layers Within ID-1 Cards, as Reactive Couplers for Nearfield Passive RFID at 13.56 MHz; Ackland, Lotya, Finn, and Stamenov; 2016 IEEE International Conference on RFID (RFID); 978-1-4673-8807-8/16/$31.00 © 2016 IEEE; 4 pages.

\* cited by examiner

Dual Interface (DI) Smart Card, and Readers

FIG. 2A
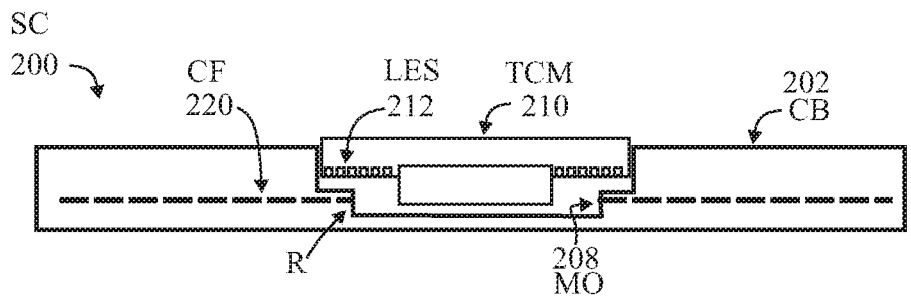
FIG. 2B
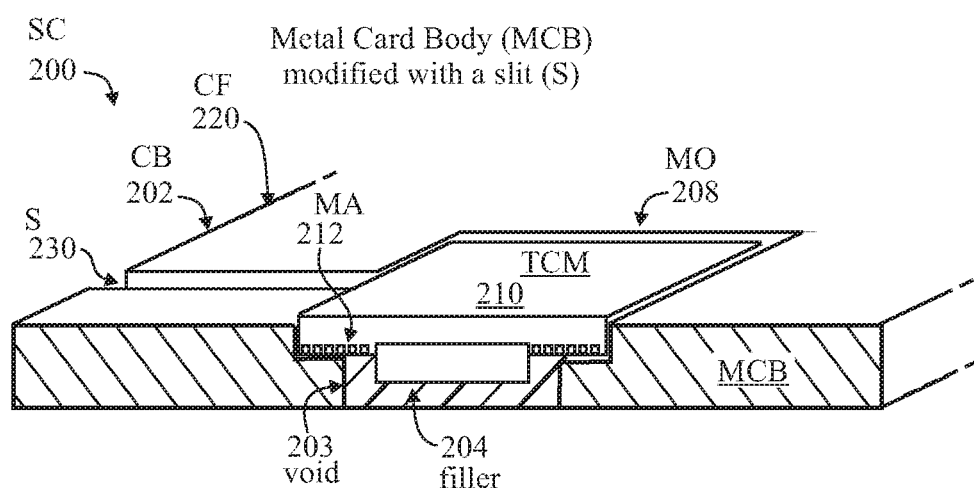
FIG. 2C

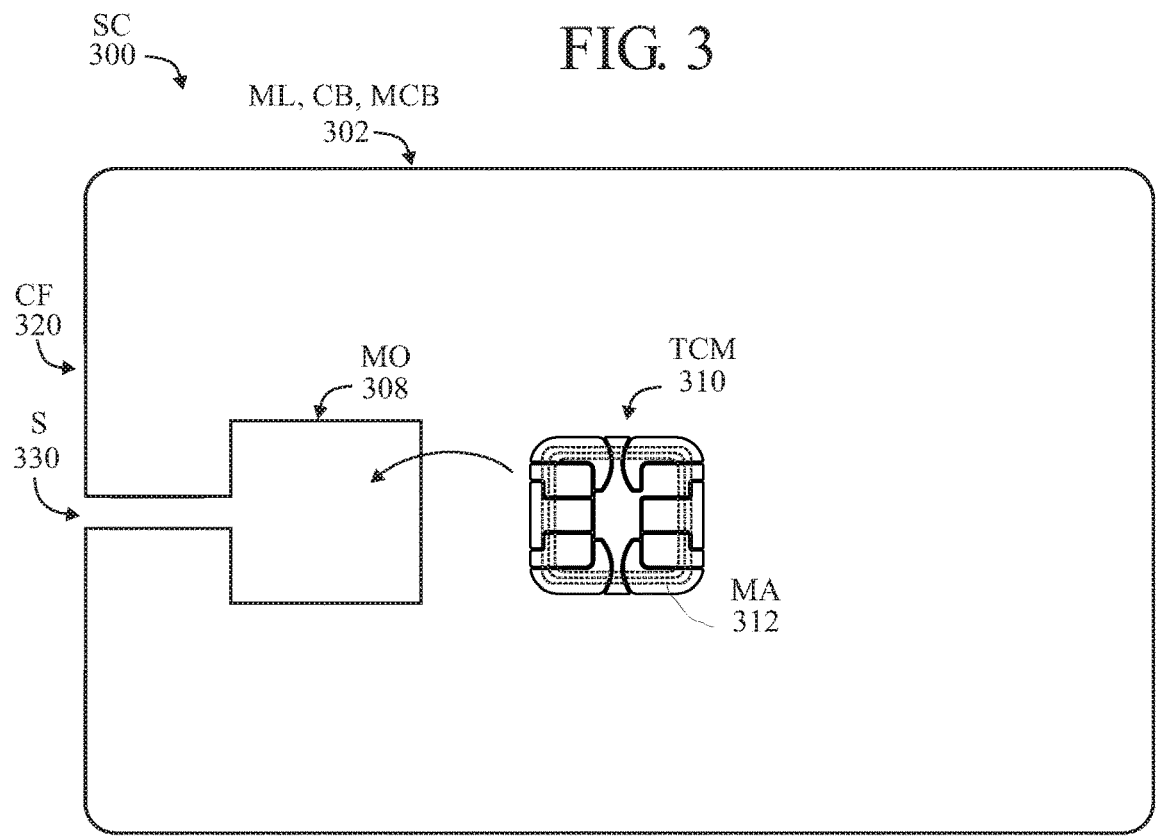
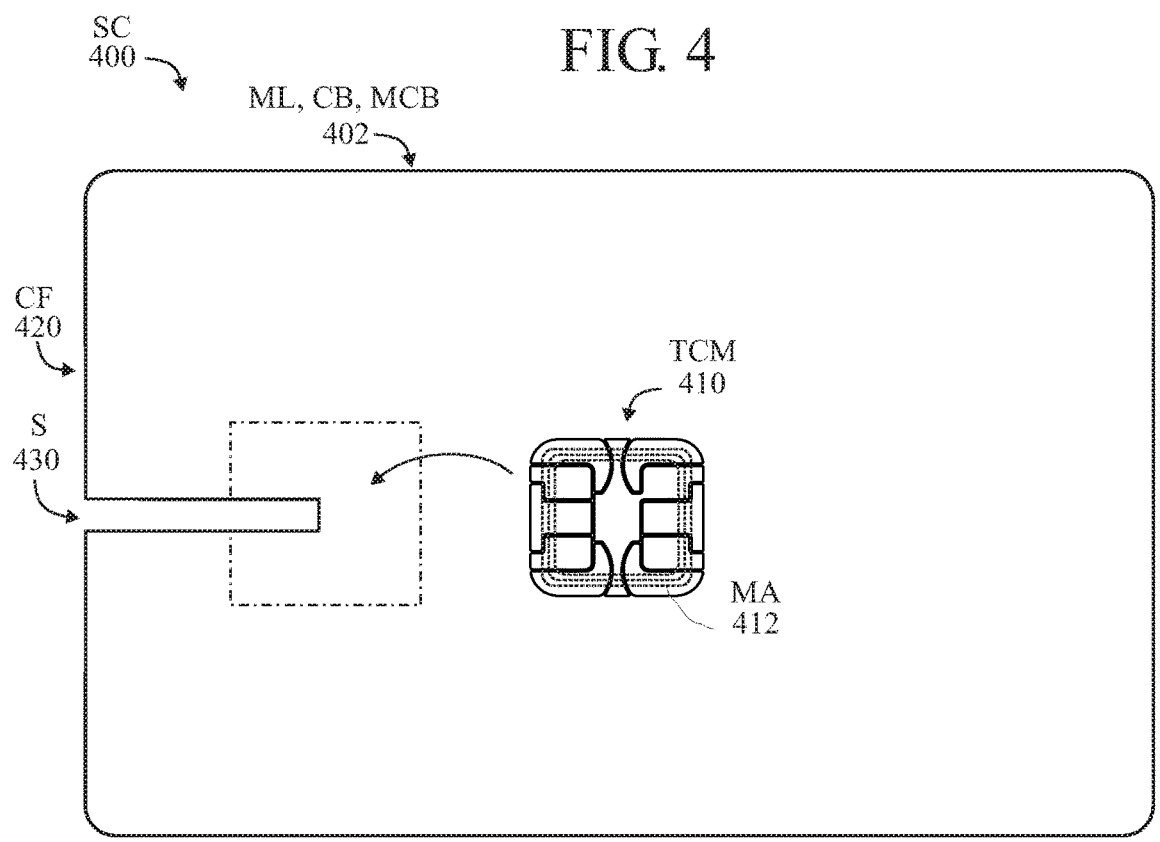

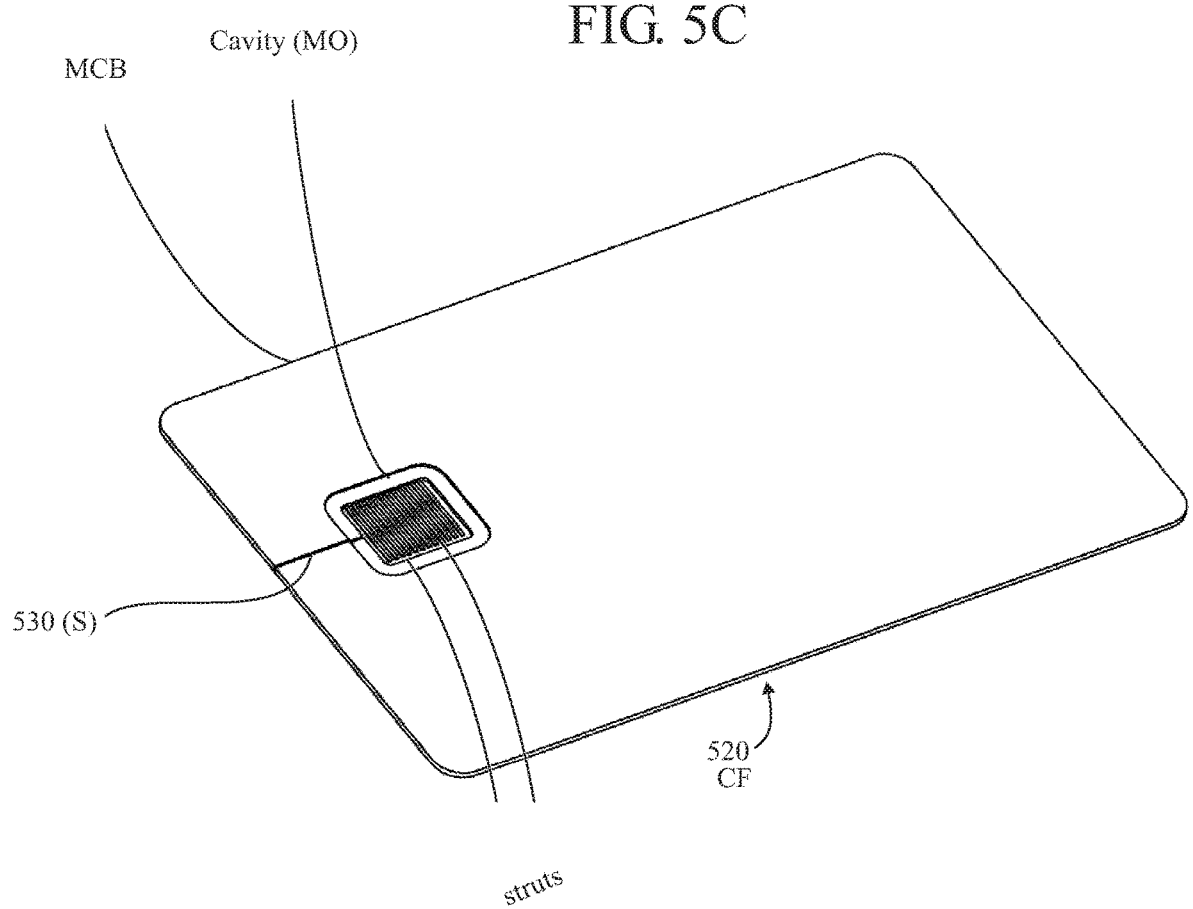

Stacked Coupling Frames card body construction

Transponder Chip Module
with elongated form factor

Transponder Chip Module
with elongated form factor exploded view of a CF disposed over a TCM
with slit S overlapping module antenna MA plan view of a CF disposed over a TCM
aligned to enhance communication plan view of a CF disposed over a TCM
with CF displaced to block communication plan view of a CF disposed over a TCM
aligned to enhance communication plan view of a CF disposed over a TCM
with CF flipped over to block communication Elongated form factor for module antenna and CF one CF, one TCM, enabled one CF, one TCM, disabled one CF, two TCM's
TCM-1 enabled, TCM-2 disabled one CF, two TCM's
TCM-1 disabled, TCM-2 enabled one slit extending to opening for TCM multiple slits extending to opening for TCM smart card with multiple metal layers shielded laminated smartcard key fob with multiple metal layers slit before coating slit after coating smart card with metal card body (MCB)

smart card with metal card body (MCB)

smart card with metal card body (MCB)

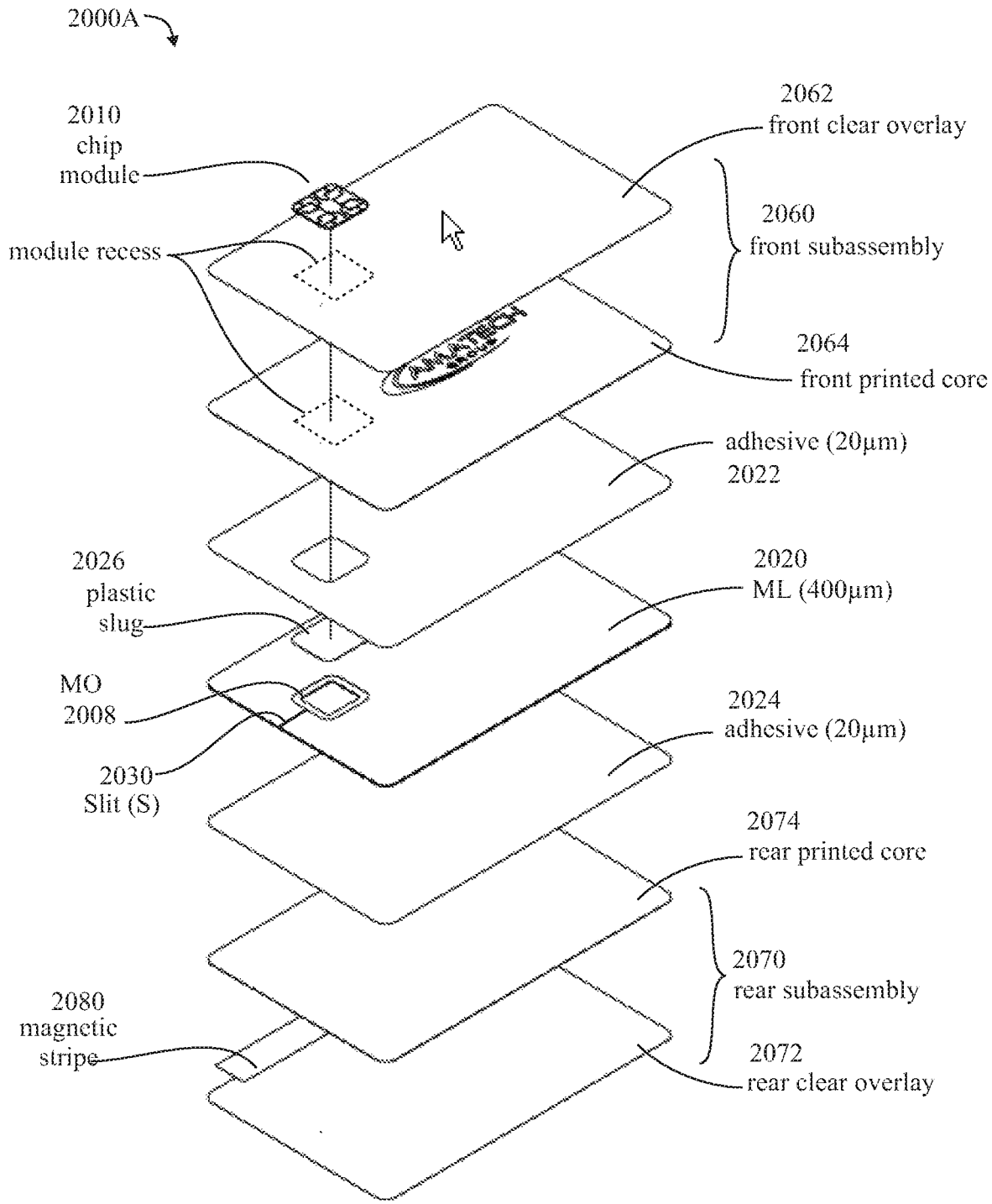

two metal layers slug for recess chip module

SMARTCARD CONSTRUCTIONS AND METHODS

CROSS-REFERENCE TO RELATED APPLICATIONS

This application claims filing date benefit (priority), as a nonprovisional or continuation-in-part from the following US provisional and nonprovisional patent applications, all of which are incorporated by reference herein:

This is a nonprovisional of 62/748,463 filed 21 Oct. 2018
This is a non-provisional of 62/712,216 filed 31 Jul. 2018
This is a continuation-in-part of Ser. No. 15/969,816 filed 3 May 2018
   U.S. Pat. No. 1,596,816 is a continuation-in-part of Ser. No. 15/939,281 filed 29 Mar. 2018
      Ser. No. 15/939,281 is a continuation-in-part of Ser. No. 15/358,138 filed 22 Nov. 2016
         Ser. No. 15/358,138 is a continuation-in-part of Ser. No. 15/072,356 filed 17 Mar. 2016
This is a continuation-in-part of Ser. No. 15/939,282 filed 29 Mar. 2018
   Ser. No. 15/939,282 is a non-provisional of 62/478,589 filed 29 Mar. 2017
   Ser. No. 15/939,282 is a continuation-in-part of Ser. No. 15/358,138 filed 22 Nov. 2016
      Ser. No. 15/358,138 is a nonprovisional of 62/371,768 filed 7 Aug. 2016
      Ser. No. 15/358,138 is a continuation-in part of Ser. No. 15/197,795 filed 30 Jun. 2016
      Ser. No. 15/358,138 is a continuation-in-part of Ser. No. 15/072,356 filed 17 Mar. 2016
         Ser. No. 15/072,356 is a nonprovisional of 62/300,906 filed 28 Feb. 2016
         Ser. No. 15/072,356 is a nonprovisional of 62/289,189 filed 30 Jan. 2016
         Ser. No. 15/072,356 is a nonprovisional of 62/281,209 filed 21 Jan. 2016
   Ser. No. 15/358,138 is a nonprovisional of 62/258,531 filed 22 Nov. 2015
This is a continuation-in part of Ser. No. 15/818,785 filed 21 Nov. 2017
This is a continuation-in-part of Ser. No. 15/662,305 filed 28 Jul. 2017
   Ser. No. 15/662,305 is a continuation-in-part of Ser. No. 15/072,356 filed 17 Mar. 2016
This is a continuation-in-part of Ser. No. 15/969,816 filed 3 May 2018
   Ser. No. 15/969,816 is a continuation-in-part of Ser. No. 15/939,281 filed 29 Mar. 2018
   Ser. No. 15/939,281 is continuation-in-part of Ser. No. 15/358,138 filed 22 Nov. 2016
   Ser. No. 15/358,138 is a continuation-in-part of Ser. No. 15/072,356 filed 17 Mar. 2016
      Ser. No. 15/072,356 is a nonprovisional of U.S. 62/300,906 filed 28 Feb. 2016
      Ser. No. 15/072,356 is a nonprovisional of U.S. 62/289,189 filed 30 Jan. 2016
      Ser. No. 15/072,356 is a nonprovisional of U.S. 62/281,209 filed 21 Jan. 2016
      Ser. No. 15/072,356 is a continuation-in-part of Ser. No. 14/862,119 filed 22 Sep. 2015
         Ser. No. 14/862,119 is a nonprovisional of 62/204,466 filed 13 Aug. 2015
         Ser. No. 14/862,119 is a nonprovisional of 62/201,578 filed 6 Aug. 2015
         Ser. No. 14/862,119 is a nonprovisional of 62/175,308 filed 14 Jun. 2015
         Ser. No. 14/862,119 is a nonprovisional of 62/163,962 filed 19 May 2015
         Ser. No. 14/862,119 is a nonprovisional of 62/150,307 filed 21 Apr. 2015
         Ser. No. 14/862,119 is a nonprovisional of 62/136,644 filed 23 Mar. 2015
      Ser. No. 15/072,356 is a continuation-in-part of Ser. No. 14/619,177 filed 11 Feb. 2015
         Ser. No. 14/619,177 is a nonprovisional of 62/102,103 filed 12 Jan. 2015
         Ser. No. 14/619,177 is a nonprovisional of 62/088,598 filed 7 Dec. 2014
      Ser. No. 15/072,356 is a continuation-in-part of Ser. No. 14/551,376 filed 24 Nov. 2014
         Ser. No. 14/551,376 is a nonprovisional of 62/080,332 filed 16 Nov. 2014
         Ser. No. 14/551,376 is a nonprovisional of 62/061,689 filed 8 Oct. 2014
         Ser. No. 14/551,376 is a nonprovisional of 62/044,394 filed 1 Sep. 2014
      Ser. No. 15/072,356 is a continuation-in-part of Ser. No. 14/492,113 filed 22 Sep. 2014
         Ser. No. 14/492,113 is a continuation-in-part of Ser. No. 14/465,815 filed 21 Aug. 2014
         Ser. No. 14/492,113 is a continuation-in-part of Ser. No. 14/173,815 filed 6 Feb. 2014
         Ser. No. 14/492,113 is a continuation-in-part of Ser. No. 13/744,686 filed 18 Jan. 2013
      Ser. No. 15/072,356 is a continuation-in-part of Ser. No. 14/465,815 filed 21 Aug. 2014
         Ser. No. 14/465,815 is a nonprovisional of 62/039,562 filed 20 Aug. 2014
         Ser. No. 14/465,815 is a nonprovisional of 62/035,430 filed 10 Aug. 2014
         Ser. No. 14/465,815 is a nonprovisional of 61/978,187 filed 10 Apr. 2014
         Ser. No. 14/465,815 is a nonprovisional of 61/971,636 filed 28 Mar. 2014
         Ser. No. 14/465,815 is a nonprovisional of 61/955,325 filed 19 Mar. 2014
         Ser. No. 14/465,815 is a continuation-in-part of Ser. No. 14/281,876 filed 19 May 2014
         Ser. No. 14/465,815 is a continuation-in-part of Ser. No. 14/173,815 filed 6 Feb. 2014
            Ser. No. 14/173,815 a continuation of Ser. No. 14/020,884 filed 8 Sep. 2013
         Ser. No. 14/465,815 is a continuation-in-part of Ser. No. 13/744,686 filed 18 Jan. 2013

TECHNICAL FIELD

The disclosure may relate broadly to RFID (radio frequency identification) devices including "smartcards" or "payment objects" (or "payment devices") such as plastic bank cards, metal embedded cards (aka metal veneer cards—plastic metal plastic), metal hybrid cards (metal front, plastic back), full metal cards, dynamic CVV display cards, RFID enabled SIM cards (or payment cards, electronic tickets, electronic identification cards, chip cards and the like), wearable devices (activity trackers, watches, smart jewelry, wristbands, bangles, cuffs, bracelets, talisman charms, lockets and the like) and accessories (payment sliders, key-fobs, money clips, wallets and the like) having RFID chips (IC) or chip modules (CM) capable of operating in a "contactless" mode (ISO 14443 or NFC/ISO 15693), including dual interface (DI) smartcards and payment objects (or payment devices) which can also operate in "contact" mode (ISO 7816-2).

Some of the disclosure(s) herein may relate to smartcards having only a contact interface. Some of the disclosure(s) herein may relate to smartcards having only a contactless interface.

The disclosure may relate to Antenna Modules (AMs), Transponder Chip Modules (TCMs), Coupling Frames (CFs), Stacks of Coupling Frames (SCFs), including transponders in general and Transponder Chip Modules (TCMs) having an integrated coupling frame (CF), suitable for implanting, embedding, insertion or placement in smartcards, metal housings, metal casing, metal plates, jewelry pieces, tokens, tags or for mechanical and electrical connection to a loop(s) of wire or spiral of wire such as a charm bracelet for use in all payment and identification applications.

The disclosure may relate to a discontinuity in an edge to edge metal layer forming a metal core in a card body, with said metal layer having an opening for a booster antenna.

The techniques disclosed herein may also be applicable to RFID devices including "non-secure smartcards and tags" such as contactless cards in the form of identification tags worn by military personnel, key cards, medic-alert tags, access control cards, security badges, key-fobs, wearables, mobile phones, tokens, small form factor tags, data carriers and the like operating in close proximity with a contactless reader.

This disclosure may also relate to the design and use of laser or chemically etched planar antennas in transponders, tags, transponder chip modules (TCMs) or antenna chip modules (AM).

The disclosure may further relate to transponder chip modules having a wire wound antenna mounted to a chip carrier tape (CCT), coupled with a chemical or laser etched planar antenna, and may also include a silicon capacitor.

This disclosure may also relate to Reactive Coupling (RC) between a Transponder Chip Module (TCM) or an RFID chip connected to an antenna (e.g. in general a Tag, Transponder, Transponder Chip Module) and a Coupling Frame (CF) or a Stack of Coupling Frames (SCFs) when in the presence of an electromagnetic field generated by a contactless reader or terminal, with the antenna structure (or module antenna) of the transponder device overlapping a slit or slits (or discontinuities) provided in the Coupling Frame (CF) or a Stack of Coupling Frames (SCFs). The Coupling Frame(s) may be made of a solid metal structure, a metal foil, or a conductive layer which is not electromagnetically transparent. The slit or a combination of slits which overlap the antenna structure of the transponder device may concentrate surface eddy (Foucault) current density in the area of the slit, to provide power delivery to the RFID chip. Some smartcards as "passive", in that they do not have their own power supply, but rather depend on harvesting energy from an ambient RF field generated by a device such as an external card reader, or point-of-sale (POS) terminal.

The disclosure may also be applicable to coupling frames (CFs) in card bodies (CBs), wearables, jewelry and accessories.

BACKGROUND

Broadly, a "smartcard" (or "smart card"), chip card, or integrated circuit card (ICC) is any pocket-sized card that has embedded integrated circuits. Smartcards are usually made of layers of plastic, generally polyvinyl chloride, but sometimes polyethylene terephthalate based polyesters, acrylonitrile butadiene styrene or polycarbonate. Smartcards can be either contact or contactless smartcard. Some "dual interface" smartcards may incorporate contact and contactless functionality. Modern contactless cards generally also have contact capability.

A smartcard is an example of an RFID device that has a transponder chip module (TCM) or an antenna module (AM) disposed in a card body (CB) or inlay substrate.

The antenna module (AM) or antenna chip module, which may be referred to as a transponder chip module (TCM) may generally comprise:
  a module tape (MT) or chip carrier tape (CCT), more generally, simply a support "substrate";
  an RFID chip (CM, IC) which may be a bare, unpackaged silicon die or a chip module (a die with leadframe, interposer, carrier or the like), typically disposed on a "face-down side" or "bond side" or "chip side" (or surface) of the module tape (MT);
  the RFID chip may have an antenna integrated therein, but generally a separate module antenna (MA) is typically provided to effect contactless communication between the RFID chip and another RFID device such as an external contactless reader; and
  a module antenna (MA) or antenna structure (AS), typically disposed on the same face-down side of the module tape (MT) as the RFID chip (IC), and connected therewith, for implementing a contactless interface, such as ISO 14443 and NFC/ISO 15693 with a contactless reader or other RFID device.
  a wire wound antenna may be mounted to the module tape
  a silicon capacitor may be placed and connected to the module tape The module antenna (MA) may be a planar antenna (PA) which is etched from a foil (which may be supported by the module tape MT) to have a spiral track having a number of turns. The track (hence turns) may measure approximately 100 μm in width. Spaces between adjacent turns of the spiral track may measure approximately 25 μm in width. Etching may be performed by chemical means, or laser ablation, or a combination thereof.

When operating in a contactless mode, a passive antenna module (AM) or transponder chip module (TCM) may be powered by RF from an external RFID reader, and may also communicate by RF with the external RFID reader.

A dual-interface antenna module (AM) or transponder chip module (TCM) may also have a contact pad array (CPA), typically comprising 6 or 8 contact pads (CP, or "ISO pads") disposed on a "face-up side" or "contact side" (or surface) of the module tape (MT), for interfacing with a contact reader in a contact mode (ISO 7816). A connection bridge (CBR) may be disposed on the face-up side of the tape for effecting a connection between two components such as the module antenna and the RFID chip on the other face-down side of the module tape.

Two connection bridges (CBR) on the face up side (contact pads) of a module tape may permit the interconnection of additional components or to modify the electrical parameters of the planar antenna on the rear side of the module tape by introducing clock-wise and anti-clockwise, or interleaving antenna tracks. Connection bridges for dual-interface transponder chip modules may be described in US 20150129665, 14 May 2014.

A smart card is typically "credit card" size having dimensions for identification cards as defined by ISO/IEC 7810, wherein the ID-1 format specifies a size of 85.60×53.98 mm, with rounded corners. A smartcard may include a card body (CB) plus front and rear printed layers and clear overlay layers, and may have an overall thickness of 0.76 mm (760 μm).

A conventional antenna module (AM) or transponder chip module (TCM) may be generally rectangular, having four sides, and measuring approximately 8.2 mm×10.8 mm for a 6-contact module and 11.8 mm×13.0 mm for an 8-contact module. As disclosed herein, a generally rectangular transponder chip module (TCM) may have a larger or smaller form factor than a conventional transponder chip module (TCM). Alternatively, the transponder chip module (TCM) may be round, elliptical, or other non-rectangular shape.

A module antenna (MA) may be disposed on the module tape (MT) for implementing a contactless interface, such as ISO 14443 and NFC/ISO 15693. Contact pads (CP) may be disposed on the module tape (MT) for implementing a contact interface, such as ISO 7816. The module antenna (MA) may be wire-wound, or etched, for example:

The module antenna (MA) may comprise several turns of wire, such as 50 μm diameter insulated wire. Reference may be made to U.S. Pat. No. 6,378,774 (2002, Toppan), for example FIGS. 12A, B thereof.

The module antenna (MA) may be a chemically-etched planar antenna (PA) structure. Reference may be made to U.S. Pat. No. 8,100,337 (2012, SPS), for example FIG. 3 thereof.

The module antenna (MA) may comprise a laser-etched planar antenna (PA) structure (LES). Reference may be made to US 20140284386 (U.S. Pat. No. 9,272,370).

A planar antenna (PA) structure, or simply "planar antenna (PA)", whether chemically-etched (CES) or laser-etched (LES), is a type of antenna structure (AS) and may comprise a long conductive trace or track having two ends, in the form of a planar, rectangular spiral, disposed in an outer area of a module tape (MT), surrounding the RFID chip on the face-down side of the module tape. This will result in a number of traces or tracks (actually, one long spiraling trace or track), separated by spaces (actually, one long spiraling space). The track (or trace) width may be approximately 100 μm. The planar antenna may be fabricated on other than the module tape, such as on a separate substrate, and joined to the module tape. An example of a laser-etched module antenna (MA) which is a planar antenna (PA) may be found in U.S. Pat. No. 9,272,370 (2016 Mar. 1; Finn et al.). The terms module antenna and planar antenna may be used interchangeably herein, unless otherwise specified.

Substituting Booster Antennas (BAs) with Coupling Frames (CFs)

Passive near-field RFID systems for dual interface payment smartcards, operating at 13.56 MHz (HF) as defined by the ISO/IEC 14443 standard for proximity/contactless integrated circuit cards, generally require a booster antenna for inductive coupling with a contactless reader, and to enhance the read/write performance of a transponder chip module. Reference may be made to U.S. Pat. No. 6,378,774 (2002, Toppan).

A coupling frame (CF) made of a metal foil layer having an optimized and well-controlled slit (S) extending through the metal layer, and strategically located vis-à-vis the transponder chip module (TCM), and may be a substitute for (replace, obviate the need for) a large area receiver coil (booster antenna) in a smartcard body which couples with the transponder chip module (TCM). The slit in the coupling frame may be referred to as a "slot". A non-conductive strip (or stripe. NCS) which extends through the metal foil may be used in lieu of a slit, providing a similar discontinuity in the metal foil for concentrating eddy currents and facilitating interaction with the module antenna (MA).

A module antenna (MA) connected to an RFID chip (CM), typically on a substrate or module tape (MT), may be referred to as a "transponder chip module", or simply as a "transponder", or as a "module".

The transponder chip module (TCM) may have a chemical (CES) or laser-etched (LES) antenna structure. The slit (S) or nonconductive stripe (NCS) in the coupling frame (CF), a patterned metal foil layer in conjunction with a rectangular module opening/cut-out, overlaps at least a portion of the module antenna (MA) of the transponder chip module (TCM).

When a dual interface smartcard is subject to an external RF field generated by a contactless terminal, the main role of the coupling frame (CF) may be to act as a matching transformer coupling the magnetic flux penetrating its relatively large card body area ($\sim$46 cm$^2$) to the module antenna (MA) of the transponder chip module (TCM) via the slit (S). The resulting eddy (Foucault) current distribution may be at maximum at the free edges of the coupling frame (CF). The field may be concentrated along the slit (S), with peak field intensity near the top (inner-most section) of the slit (S). In addition, the field may be concentrated to a lesser extent along the coupling frame (CF) perimeter itself.

Reference may be made to US 20150136858 (U.S. Pat. No. 9,390,364), US 20140361086 (U.S. Pat. No. 9,475,086) and US 20150021403 (U.S. Pat. No. 9,798,968), all of which show examples of transponder chip modules (and coupling frames).

In the main, hereinafter, transponder chip modules (TCM) and the RFID devices such as payment objects incorporating the transponder chip modules may be passive devices, not having a battery and harvesting power from an external contactless reader (ISO 14443). However, some of the teachings presented herein may find applicability with cards having self-contained power sources, such as small batteries or supercapacitors.

Transponders can be attached to metal surfaces, if the effects of the metal can be shielded, which is usually achieved using magnetic materials, such as ferrite, and spacing the transponder at a distance off the surface of the metal. See, for example, U.S. Pat. No. 8,366,009. See also US 20090159657 (2009 Jun. 25; Chen et al.) which discloses a contactless integrated circuit card system. A shielding member could be a conductor in form of a sheet, plate, or foil, and could also be a soft magnetic member.

Consideration may also be given to an edge-to-edge metal layer in the stack-up construction of a metal embedded card (Plastic-Metal-Plastic), whereby the metal layer has a discontinuity in its conductive surface and an opening to accept a booster antenna which inductively couples with a transponder chip module. In combination with one another, the metal layer and booster antenna may capture the electromagnetic field. The booster antenna may be adjacent or overlapping the metal layer.

SUMMARIES OF SOME PARENT APPLICATIONS

Some of the parent cases, for which filing date benefit is claimed, may be summarized below.

U.S. Ser. No. 15/939,281 filed 29 Mar. 2018 (waiting publication) discloses a metal smartcard (SC) having a transponder chip module (TCM) with a module antenna (MA), and a card body (CB) comprising two discontinuous metal layers (ML), each layer having a slit (S) overlapping the module antenna, the slits being oriented differently than one another. One metal layer can be a front card body (FCB, CF1), and the other layer may be a rear card body (RCB, CF2) having a magnetic stripe (MS) and a signature panel (SP).

U.S. Ser. No. 15/358,138 filed 22 Nov. 2016 (U.S. Pat. No. 9,960,476 issued 1 May 2018) discloses a conductive coupling frame (CF) or a discontinuous metal layer disposed surrounding and closely adjacent a transponder chip module (TCM), and substantially coplanar with an antenna structure (AS, CES, LES) in the transponder chip module (TCM). A metal card body (MCB, CB) or a transaction card with a discontinuous metal layer having a slit (S), extending from an inner end to a periphery of the metal layer, and not terminating in a distinct opening sized to accommodate a transponder chip module (TCM).

U.S. Ser. No. 15/939,282 filed 29 Mar. 2018 (waiting publication) discloses smartcard (SC) having a card body (CB) and a conductive coupling frame antenna (CFA) extending as a closed loop circuit around a periphery of the card body, and also extending inwardly so that two portions of the coupling frame antenna are closely adjacent each other, with a gap therebetween. The gap may extend from a periphery of the card body to a position corresponding with a module antenna (MA) of a transponder chip module (TCM) disposed in the card body, and may function like a slit (S) in a coupling frame (CF). A portion of the coupling frame antenna may be arranged to surround the ISO position of the transponder chip module in the card body. A coupling frame antenna (CFA) may be incorporated onto a module tape (MT) for a transponder chip module (TCM).

U.S. Ser. No. 15/818,785 filed 21 Nov. 2017 (waiting publication) discloses smartcards having (i) a metal card body (MCB) with a slit (S) overlapping a module antenna (MA) of a chip module (TCM) or (ii) multiple metal layers (M1, M2, M3) each having a slit (S1, S2, S3) offset or oriented differently than each other. A front metal layer may be continuous (no slit), and may be shielded from underlying metal layers by a shielding layer (SL). Metal backing inserts (MBI) reinforcing the slit(s) may also have a slit (S2) overlapping the module antenna. Diamond like carbon coating filling the slit. Key fobs similarly fabricated. Plastic-Metal-Plastic smart cards and methods of manufacture are disclosed. Such cards may be contactless only, contact only, or may be dual-interface (contact and contactless) cards.

U.S. Ser. No. 15/969,816 filed 3 May 2018 (waiting publication) discloses smartcards with metal layers. One or more metal layers of a smartcard stackup may be provided with slits overlapping at least a portion of a module antenna in an associated transponder chip module disposed in the smartcard so that the metal layer functions as a coupling frame. One or more metal layers may be pre-laminated with plastic layers to form a metal core or clad subassembly for a smartcard, and outer printed and/or overlay plastic layers may be laminated to the front and/or back of the metal core. Front and back overlays may be provided. Various constructions of and manufacturing techniques (including temperature, time, and pressure regimes for laminating) for smartcards are disclosed.

U.S. Ser. No. 15/662,305 filed 28 Jul. 2017 (US 20180123221 published 3 May 2018) discloses coupling frames comprising a conductive (metal) surface with a slit (S) or non-conductive stripe (NCS) extending from an outer edge to an inner position thereof, and overlapping a transponder device. A coupling frame with slit for coupling with an inductive or capacitive device (inductor or capacitor) may be used at any ISM frequency band to concentrate surface current around the slit. The coupling frame can be tuned to operate at a frequency of interest by introducing a resistive, inductive or capacitive element. The resonance frequency of the coupling frame can be matched to that of the transponder chip module to achieve optimum performance. Coupling frames with or without a transponder device may be integrated, overlapping, stacked or placed adjacent to one another to enhance system performance. Multiple coupling frames may be electrically isolated from one another by the application of a dielectric coating such Diamond Like Carbon (DLC).

U.S. Ser. No. 15/072,356 filed 17 Mar. 2016 (U.S. Pat. No. 9,836,684 issued 5 Dec. 2017) discloses smartcards having (i) a metal card body (MCB) with a slit (S) overlapping a module antenna (MA) of a chip module (TCM) or (ii) multiple metal layers (M1, M2, M3) each having a slit (S1, S2, S3) offset or oriented differently than each other. A front metal layer may be continuous (no slit), and may be shielded from underlying metal layers by a shielding layer (SL). Metal backing inserts (MBI) reinforcing the slit(s) may also have a slit (S2) overlapping the module antenna. Diamond like carbon coating filling the slit. Key fobs similarly fabricated. Plastic-Metal-Plastic smart cards and methods of manufacture are disclosed. Such cards may be contactless only, contact only, or may be dual-interface (contact and contactless) cards.

U.S. Ser. No. 14/862,119 filed 22 Sep. 2015 (U.S. Pat. No. 9,697,459 issued 4 Jul. 2017) discloses RFID devices comprising (i) a transponder chip module (TCM, 1410) having an RFID chip (IC) and a module antenna (MA), and (ii) a coupling frame (CF) having an electrical discontinuity comprising a slit (S) or non-conductive stripe (NCS). The coupling frame may be disposed closely adjacent the transponder chip module so that the slit overlaps the module antenna. The RFID device may be a payment object such as a jewelry item having a metal component modified with a slit (S) to function as a coupling frame. The coupling frame may be moved (such as rotated) to position the slit to selectively overlap the module antennas (MA) of one or more transponder chip modules (TCM-1, TCM-2) disposed in the payment object, thereby selectively enhancing (including enabling) contactless communication between a given transponder chip module in the payment object and another RFID device such as an external contactless reader. The coupling frame may be tubular. A card body construction for a metal smart card is disclosed.

U.S. Ser. No. 14/619,177 filed 11 Feb. 2015 (US 20150269474 published 24 Sep. 2015) discloses the planar antenna (PA) of a transponder chip module (TCM) may have a U-shaped portion so that an outer end (OE) of the antenna may be positioned close to an RFID chip (IC) disposed at a central area of a module tape (MT) for the transponder chip module. A module tape (MT2) may have contact pads (CP) on one side thereof and a connection bridge (CBR) on another side thereof, and may be joined with a module tape (MT1) having a planar antenna (PA). Metal of a conductive layer (CL) within a conductive element such as a coupling frame (CF) or a planar antenna (PA) may be scribed to have many small segments. A metal sheet may be stamped to have contact side metallization, and joined with a module tape (MT) having a planar antenna (PA). See also U.S. Pat. Nos. 9,489,613, 9,634,391, and 9,622,359.

U.S. Ser. No. 15/197,795 filed 30 Jun. 2016 (U.S. Pat. No. 9,812,782 issued 7 Nov. 2017) discloses a transponder chip module (TCM) comprises an RFID chip (CM, IC), optionally contact pads (CP), a module antenna (MA), and a coupling frame (CF), all on a common substrate or module tape (MT). The coupling frame (CF) may be in the form of a conductive layer having an outer edge (OE) and a slit (S) or non-conductive stripe (NCS) extending from the outer edge to an inner position thereof which may be a central opening (OP). The coupling frame (CF) may be arranged so that the slit (S) or non-conductive strips (NCS) overlaps at least a portion of the module antenna (MA). Methods and apparatus are disclosed. A suppressor diode or capacitor may be connected across the slit (S) of the coupling frame (CF)

U.S. Ser. No. 14/551,376 filed 24 Nov. 2014 (U.S. Pat. No. 9,390,364 issued 12 Jul. 2016) discloses a transponder chip module (TCM) comprises an RFID chip (CM, IC), optionally contact pads (CP), a module antenna (MA), and a coupling frame (CF), all on a common substrate or module tape (MT). The coupling frame (CF, 320A) may be in the form of a ring, having an inner edge (IE), an outer edge IE, 324) and a central opening (OP), disposed closely adjacent to and surrounding the module antenna (MA). A slit (S) may extend from the inner edge (IE) to the outer edge (OE) of the coupling frame (CF) so that the coupling frame (CF) is "open loop". An RFID device may comprise a transponder chip module (TCM) having a module antenna (MA), a device substrate (DS), and an antenna structure (AS) disposed on the device substrate (DS) and connected with the module antenna (MA). A portion of a conductive layer (CL, 904) remaining after etching a module antenna (MA) may be segmented to have several smaller isolated conductive structures.

U.S. Ser. No. 14/492,113 filed 22 Sep. 2014 (U.S. Pat. No. 9,798,968 issued 24 Oct. 2017) discloses a conductive coupling frame (CF) having two ends, forming an open loop having two ends or a discontinuous metal layer disposed surrounding and closely adjacent a transponder chip module (TCM, 610), and substantially coplanar with an antenna structure (AS, CES, LES) in the transponder chip module (TCM). A metal card body (MCB, CB) or a transaction card with a discontinuous metal layer having a slit (S) or a non-conductive strip (NCS, 1034) extending from a module opening (MO) to a periphery of the card body to function as a coupling frame (CF). The coupling frame (CF) may be thick enough to be non-transparent to RF at frequencies of interest. A switch (SW) may be provided to connect ends of the coupling frame (CF) across the slit (S, 630). A reinforcing structure (RS) may be provided to stabilize the coupling frame (CF) and card body (CB). The transponder chip module (TCM) may comprise an antenna structure which may be a laser-etched antenna structure (LES) or a chemical-etched antenna structure (CES), and may comprise a non-perforated contact pad (CP) arrangement. A coupling frame (CF) may be incorporated onto the module tape (MT, CCT) for a transponder chip module (TCM).

U.S. Ser. No. 14/465,815 filed 21 Aug. 2014 (U.S. Pat. No. 9,475,086 issued 25 Oct. 2016) discloses a smartcard (SC) may comprise: a metal layer (ML); and an opening (MO) in the metal layer for receiving a transponder chip module (TCM); characterized by: a slit (S) extending into the metal layer, from the opening to a periphery of the metal layer, whereby the metal layer comprises an open-loop coupling frame (CF) having two ends. The coupling frame may be disposed closely adjacent to the transponder chip module. A portion of the coupling frame may overlap a portion of an antenna structure (AS) in the transponder chip module. The coupling frame may extend over substantially the entire area of the smartcard. The metal layer may comprise a metal card body (MCB) of a metal smartcard.

U.S. Ser. No. 14/281,876 filed 19 May 2014 (U.S. Pat. No. 9,272,370 issued 1 Mar. 2016) discloses laser etching antenna structures (AS) for RFID antenna modules (AM). Combining laser etching and chemical etching. Limiting the thickness of the contact pads (CP) to less than the skin depth (18 m) of the conductive material (copper) used for the contact pads (CP). Multiple antenna structures (AS1, AS2) in an antenna module (AM). Incorporating LEDs into the antenna module (AM) or smartcard (SC).

U.S. Ser. No. 14/020,884 filed 8 Sep. 2013 (U.S. Pat. No. 9,033,250 issued 19 May 2015) discloses a booster antenna (BA) for a smart card comprises a card antenna (CA) component extending around a periphery of a card body (CB), a coupler coil (CC) component at a location for an antenna module (AM), and an extension antenna (EA) contributing to the inductance of the booster antenna (BA). A method of wire embedding is also disclosed, by controlling a force and ultrasonic power applied by an embedding tool at different positions on the card body (CB). See also U.S. Ser. No. 14/173,815 filed 6 Feb. 2014 (U.S. Pat. No. 9,195,932 issued 24 Nov. 2015)

U.S. Ser. No. 13/744,686 filed 18 Jan. 2013 (US 20130126622 published 23 May 2013) discloses a dual-interface smart card having a booster antenna with coupler coil in its card body, and a metallized face plate having a window opening for the antenna module. Performance may be improved by one or more of making the window opening substantially larger than the antenna module, providing perforations through the face plate, disposing ferrite material between the face plate and the booster antenna. Additionally, by one or more of modifying contact pads on the antenna module, disposing a compensating loop under the booster antenna, offsetting the antenna module with respect to the coupler coil, arranging the booster antenna as a quasi-dipole, providing the module antenna with capacitive stubs, and disposing a ferrite element in the antenna module between the module antenna and the contact pads.

In U.S. Ser. No. 13/744,686, FIG. 4A shows that a conductive "compensation loop" CL may be disposed (such as in Layer 5, FIG. 2) behind the booster antenna BA (Layer 3), extending around the periphery of the card body CB. The compensation loop CL may be an open loop having two free ends, and a gap ("gap") therebetween. The compensation loop CL may be made of copper cladding, can be printed on a support layer, etc. FIG. 4B shows that the compensation loop CL may comprise ferrite material, in which case since ferrite is not an electrical conductor (in contrast with copper) the loop may be closed, having no gap and no free ends.

Generally, the coupling frames disclosed herein comprise a metal layer (or card body) extending over (covering) substantially the entire area of the smartcard, e.g. ID-1 format, except for an opening (MO) for the transponder chip module and the slit (S), and may sometimes be referred to as "discontinuous", because they have a slit. As mentioned, for example, in U.S. Ser. No. 15/818,785 filed 21 Nov. 2017, a front metal layer which is not a coupling frame, may be "continuous" (no slit), and may be shielded from underlying metal layers by a shielding layer (SL).

Generally, the coupling frames disclosed herein, may be made from a continuous metal layer (except for the slit, and module opening). Alternatively, a coupling frame may be made from a mesh, or from embedding wire in a suitable pattern in a substrate, both of which would be arranged to cover substantially the entire area of the card (except for the slit, and module opening). In either case, the coupling frames disclosed herein may overlap and interact with the module antenna, and the resulting smartcard may function, contactlessly, without the need for a booster antenna (BA).

Coupling frames made of mesh or wire, are exemplary of "discontinuous" surface coupling frames. Reference may be made to FIG. 6A of US 20150136858 which shows a smartcard (SC) having a coupling frame (CF) formed by embedding wire. In either case (continuous surface or discontinuous surface), the coupling frame comprises a "surface" or a "conductive surface", and a slit. The slit may be referred to as a slot or a gap.

In use, a coupling frame may be disposed closely adjacent to (in close proximity, or juxtaposed with) a transponder chip module (TCM) having a module antenna (MA) so that the slit (S) overlaps (traverses, over or under) at least a portion of the module antenna. For example, the slit (S) may extend from a position external to the module antenna, crossing over (or overlapping) at least some of the traces of the module antenna, such as extending over all of the traces on one side of the module antenna and may further extend into the interior area (no-man's land) of the module antenna.

A compensation loop (CL) such as disclosed in U.S. Ser. No. 13/744,686 (US 20130126622, 23 May 2013) may cover only an area around the periphery of the card, with a large open area in its interior, and is intended to interact with the booster antenna (BA), rather than replace it, and may not interact with the module antenna (MA). On the other hand, a coupling frame (CF) may cover substantially the entire area of the card (less, of course, the slit and the module opening), and is specifically intended and arranged to interact with the module antenna (MA).

U.S. 62/748,463 filed 21 Oct. 2018 discloses smartcard (SC) having a card body (CB) having at least two conductive (metal) layers (ML1, ML2, etc.), each metal layer being provided with a slit (S1, S2, etc.) or nonconductive stripe (NCS) so as to function as a coupling frame (CF1, CF2, etc.) The coupling frames may be arranged (disposed, oriented) so that the slits of the metal layers are not aligned with one another. The transponder chip module (TCM) may be modified to lower its resonance frequency, which may then be upwardly shifted by the presence of a coupling frame (CF), contact pads (CP) and the like (any conductive metal elements in or near the module). Various features of the module antenna (MA) may be modified. Various features of the coupling frame (CF), such as its dimensions, may be modified.

U.S. Ser. No. 14/660,941 filed 18 Mar. 2015 (US 20150269477 published 24 Sep. 2015) shows, in FIG. 2H, (two) front views labeled "(1)" and "(2)" of a dual-interface metal hybrid smartcard with a discontinuous metal frame (DMF) around the perimeter of the card body and the booster antenna inside the free space of the metal frame. FIG. 2H a portion of the metal slug, or one of two metal slugs may extend as a frame around the periphery of the card body, with the card antenna component of the booster antenna disposed within the frame.) This application (and Ser. No. 14/465,815 filed 21 Aug. 2014; now U.S. Pat. No. 9,475,086 25 Oct. 2016) claimed priority from 61/978,187 filed 10 Apr. 2014, 61/971,636 filed 28 Mar. 2014, and 61/955,325 filed 19 Mar. 2014.

SOME PATENT REFERENCES

US 20140292477 (2014 Oct. 2; Ahmadloo) discloses a system and method is provided for the identification and authentication of precious metals and small jewelry. The system can include an embedded RFID tag, RFID tag reader and reader based unit (wired or wireless), and a basic tag information system for tag capture, look-up and display. The RFID tag can be embedded in absorbing dielectric medium inside epoxy in a tiny cavity placed in the metal or jewelry. A thin layer of epoxy placed over the tag can ensure that the tag will not be damaged from rubbing against skin, abrasion or chemicals while still allowing the desired electromagnetic properties (antenna and the circuitry performance). The RFID tag information can be transferred to a computer through the reader, and can be matched with preprogrammed information in a database.

US 20140260424 (2014 Sep. 18; Warren) discloses an apparatus for conveniently and unobtrusively carrying a radio frequency identification (RFID) tag. A RFID tag is disposed within a channel defined by a jewelry piece and covered with a decorative element or cap. The RFID tag is a passive-, battery-assisted passive-, or active-type RFID tag.

US 20140102136 (2014 Apr. 17; Warren) discloses an apparatus for conveniently and unobtrusively carrying a radio frequency identification (RFID) tag. A jewelry piece is operatively connected to a housing using a screw post and threaded slot. A radio frequency identification tag and buffer ring are disposed within the housing and enclosed by a cap.

US 20130332353 (2014 Dec. 12; Aidasani et al.) discloses systems and methods comprising RFID data acquisition technology which may be embedded in a fob or tag for use in completing financial transactions. This fob may a self-contained device which includes a transponder and which may be contained on any portable form factor and may comprise flexible circuitry. For instance, the fob may be housed in a wearable transaction instrument, such as a bracelet, ring, wrist band, retractable id, necklace, jewelry charm, lanyard, key ring fob, watch, band, pin, and/or the like. The fob is configured to be used in concert with an RFID reader device.

US 20060192674 (2006 Aug. 31; Roberta) discloses Jewelry/personal articles in the form of sets of items which may be sold in pairs or groups, each article of the group being provided with the RFID circuitry unique to that pair or group and an electrical display which will illuminate when two or more of the items of the group are in proximity to each other, but not requiring one to be in physical contact with another. In one embodiment the personal article comprises a heart necklace and a circular pendant, each provided with an electrical display such as a lamp and a normally open battery powered electrical circuit interconnected with the electrical display and uniquely coded RFID containing a tag and reader. Operation of the electrical display is initiated by bringing the two articles within proximity of each other and the uniquely coded RFID circuitry of the one item recognizes the matched uniquely coded RFID circuitry of another item of the same pair or group.

SOME PATENTS AND PUBLICATIONS OF INTEREST

The following patents and/or publications ("references") may be of interest or relevant to the invention(s) disclosed herein, and some commentary may be provided to distinguish the invention(s) disclosed herein from the following references.

US 20130126622 (23 May 2013, Feinics) discloses offsetting shielding and enhancing coupling in metallized smart cards. As disclosed therein (FIG. 4A), a conductive "compensation loop" CL may be disposed behind the booster antenna BA, extending around the periphery of the card body CB. The compensation loop CL may be an open loop having two free ends, and a gap ("gap") therebetween. The compensation loop CL may be made of copper cladding.

It may be noted that the compensation loop (CL) of Feinics is disposed below a booster antenna, and is sized accordingly. Typically, when a coupling frame (CF) is being used, there is no booster antenna. Moreover, the compensation loop (CL) does not overlap the antenna (MA) in the transponder chip module (TCM).

U.S. Pat. No. 8,608,082 (17 Dec. 2013; La Garrec et al.; Oberthur Technologies) discloses microcircuit device including means for amplifying the gain of an antenna. The electronic device (10) comprising a microcircuit (18) module (20), a near-field communication antenna (36) electrically connected to the microcircuit (18) of the module (20), delimiting an antenna surface (S), and a body (12) incorporating the module (20). More precisely, the antenna (36) is arranged within the module (20) and the body (12) incorporates means (40) of amplifying the gain of the antenna (36) comprising an electrically conductive element (42) electrically isolated from the microcircuit (18) and the antenna (36), of an annular general shape arranged around an area (R) of the body (12) forming a volume generated by the projection of the antenna surface (S) along a direction (Z) substantially orthogonal to the surface (S).

Oberthur's electrically conductive element (42) is analogous to a coupling frame (CF), and Oberthur's antenna (36) corresponds to a module antenna (MA). However, it should be noted that Oberthur's electrically conductive element (42) does not overlap the antenna. Rather, Oberthur goes to great lengths to clarify that there is NO overlap. For example, Oberthur states that [the] element 42 has . . . an annular general shape and is arranged so as to surround a region R of the body 12 constituting a volume generated by the projection of the antenna surface along a direction substantially orthogonal to the antenna surface S. Oberthur states that the metal layer can be the size of the card. Oberthur does not talk about a metal card body.

Oberthur's metal layer does not overlap the antenna structure of the transponder, nor does it consider such an overlap as being an enhancing factor: "In conformity with an embodiment of the invention, the element extends around the antenna outside of an area defined by the projection of the antenna along a direction substantially orthogonal to the antenna surface. Thus, the antenna and the ring must not extend facing one another so as not to mask the magnetic field flux through the antenna surface. In other words, the element extends outside the outer perimeter of the antenna in a plane parallel to that containing the antenna or part of the antenna, or possibly in the same plane. However, when the element extends within the same plane as the antenna or part of the antenna, a minimum spacing is provided between the element and the antenna to ensure electrical isolation."

EP 2372840 (25 Sep. 2013; Hashimoto; Panasonic) describes problems associated with a loop antenna used in a portable terminal, like a portable phone and a smart phone, in order to read information from a non-contact IC card and an IC tag and exchange information with a reader/writer. A metallic body 7 has a slit 17 that overlaps an antenna pattern 3 (FIGS. 8,9).

Panasonic does not disclose a smartcard. The antenna 3 is on a board 2, but there is no RFID chip on the board 2. There is no transponder chip module (TCM).

Moreover, in Panasonic, a magnetic sheet 4 appears to be critical. The magnetic sheet 4 is intended for lessening influence which arises when the metallic body is placed on the magnetic sheet 4. It is desirable that the magnetic sheet 4 shall completely cover the antenna pattern 3.

It should be noted that, according to some embodiments of the invention(s) disclosed herein, when using a coupling frame (CF), a magnetic sheet 4 is not required.

US 20110181486 (28 Jul. 2011; Kato) discloses a wireless IC device includes a wireless IC chip arranged to process a radio signal, a feeder circuit board coupled to the wireless IC chip and including a feeder circuit, and a radiation electrode arranged at least one principal surface of the feeder circuit board. (Abstract) A wireless IC chip 5 is disposed on one (upper) side of a feeder circuit board 10 . . . . A radiation electrode 30 is disposed on a lower surface of the feeder circuit board 10 to be electromagnetically coupled to the feeder circuit 20 and has two adjacent open ends 30a and 30b.

Kato discloses a board with a chip, and various radiation electrodes. However, it should be noted that Kato is not a smartcard. It does not have a card body, it does not have a transponder chip module with an RFID chip and an antenna. It does not have contact pads.

SUMMARY

It is a general object of the invention to provide techniques for incorporating a transponder chip module (TCM), particularly a passive transponder chip module, in a payment object such as a smartcard or a key fob. The invention may additionally be applicable to smart jewelry, wearables and accessories, particularly full metal smartcards, laminated metal smartcards, dynamic CVV display cards, jewelry pieces, activity trackers and key-fobs having metal components for housing the transponder chip module (TCM).

An example of a dynamic CVV display card may be found in WO 2017/198842 (2017 Nov. 23; ORE et al.; ASK).

The terms "antenna module" and "transponder chip module" may be used interchangeably herein, unless specified otherwise. Both of these "chip modules" may have an antenna (module antenna, planar antenna, antenna structure) for communicating contactlessly with an external RFID reader device, or point-of-sale (POS) terminal. It may be noted that, in some examples or embodiments described herein, a chip module (hence, the overall smartcard, e.g.) may be contactless only (e.g., ISO 14443, 15693), contact only (e.g., ISO 7816), or dual-interface (having both contact and contactless interfaces).

It is a further object of the invention to provide improved transponder chip modules (TCM) and improved techniques for manufacturing transponder chip modules (TCM) using capacitors.

It is a further object of the invention to provide improved coupling of smartcards without the use of a booster antennas for inductive coupling, or in conjunction with ferrite material for flux concentration (as an example of RFID devices and the like, including dual-interface smartcards and metal or metallized smartcards) with a contactless reader.

As used herein, a transponder chip module (TCM) may generally comprise an RFID chip and a module antenna (MA) disposed on one (face-down) side of a module tape, and contact pads (CPs) on an opposite (face-up) side of the module tape (MT). In the main, hereinafter, discussions may be directed to passive transponder chip modules operating primarily or exclusively in a contactless mode (e.g., ISO 14443, 15693). It is noted that transponder chip modules (TCM) operating solely in contactless mode do not require contact pads (CPs) on the face-up side of a module tape (MT). However, the techniques disclosed herein may be applicable to dual-interface transponder chip modules capable of operating in both contactless and contact modes (e.g., ISO 7816).

According to the invention, generally, RFID devices comprising (i) a transponder chip module (TCM) having an RFID chip (IC) and a module antenna (MA), and (ii) a coupling frame (CF) having a slit (S) may operate on the principle of reactive coupling, and may not require a booster antenna (BA) to enhance the performance of the transponder chip module (TCM) with a contactless reader. The coupling frame (CF) may be disposed closely adjacent the transponder chip module (TCM) so that the slit (S) overlaps at least a portion (such as one side) of the module antenna (MA).

Multiple coupling frames (CF1, CF2, etc) may be incorporated into the card body (CB) of a smartcard (SC), each having discontinuity in the form of a slit (S) or nonconductive stripe (NCS). The slit (S) or nonconductive stripe (NCS) of one or more of the coupling frames may overlap the module antenna (MA) of a transponder chip module (TCM) disposed in the card body (CB) of the smartcard (SC). Generally, in discussions set forth herein, the term "slit" may apply equally to a nonconductive stripe, both being electrical discontinuities extending through a defined area of a metal layer forming a coupling frame.

The slit may sometimes be referred to as a slot or a gap, such as in some related applications. The slit may extend completely through a metal layer (or metal card body functioning as a coupling frame), extending from a periphery (outer edge) thereof to a position at an interior area of the metal layer or metal card body. The interior area may comprise an opening for receiving a portion of a transponder chip module, and the slit/opening may be arranged so that the slit extends over (or under)—or overlaps—at least a portion of the transponder chip module, particularly the module antenna of the transponder chip module. The slit may have various widths, may be disposed at various angles, and may or may not extend in a straight line. Slits in multiple metal layers may be arranged so as to extend in different directions from the area of the transponder chip module so that the various metal layers may reinforce the slits of other areas. A metal card body having a slit may be thinned in the area of the slit, and be reinforced by a metal insert in the thinned area. The metal insert may also have a slit. The slit represents an electrical discontinuity in the metal layer or card body, allowing eddy currents to be concentrated around the slit. A similar result may be accomplished by rendering a comparable portion of the metal layer or card body non-conductive, such as by anodizing.

The RFID device may be a payment object such as a jewelry item having a metal component modified with a slit (S) to function as a coupling frame (CF). The coupling frame (CF) may be moved (such as rotated) to selectively position the slit to selectively overlap the module antennas (MA) of one or more transponder chip modules (TCMs) disposed in the payment object, thereby selectively enabling contactless communication between a given transponder chip module in the payment object and another RFID device such as an external contactless reader.

The RFID device may be a payment object such as a smartcard or key fob having multiple (such as 3) metal layers, each comprising a slit to function as a coupling frame. The slit of a given layer may be offset (positioned or oriented differently) from the slit(s) in the other layer(s), so that when there is a stackup of multiple metal layers with slits (i.e., multiple coupling frames), the slit of a given layer, which may constitute a mechanical weakness in the given layer, may be reinforced or supported by a "slit-free" area of an adjacent layer. When multiple metal layers are stacked, there may be an insulating layer, such as an adhesive-backed film disposed therebetween, so that the slit of a given layer is not shorted out by a slit-free area of an adjacent layer.

Coupling frames (CF) in combination with transponder chip modules (TCMs) may provide for inductive and capacitive coupling (so-called reactive coupling) with a contactless reader or point of sale terminal, or another RFID device. Coupling frames (CF) in combination with transponder chip modules (TCMs) may enhance (including enable) contactless communication between an RFID device and a contactless terminal (or other RFID device).

As used herein, a "coupling frame" (CF) may comprise a metal layer, metal frame, metal plate or any electrically-conductive medium or surface with an electrical discontinuity such as in the form of a slit (S) or a non-conductive stripe (NCS) extending from an outer edge thereof to an inner position thereof, the coupling frame (CF) capable of being oriented so that the slit (S) overlaps (crosses-over) the module antenna (MA), such as on at least one side thereof. The slit (S) may be straight, and may have a width and a length. In some embodiments, the slit (S) may extend to an opening (MO) for accepting the transponder chip module (TCM). In other embodiments, there may only be a slit (S), and no opening for the transponder chip module (TCM).

The coupling frame (CF) may also comprise (or be formed as) a conductive path or a track of wire formed around the transponder chip module (TCM), such as by embedding wire. The coupling frame (CF) may be substantially planar or it may be three-dimensional (such as a curved surface, including a tubular surface). The coupling frame (CF) for reactive coupling with a reader may couple with either a passive or an active transponder chip module (TCM). The terms non-conductive stripe (NCS) and slit (S) may be used interchangeably herein, unless specified otherwise.

The overlap of the slit (S) with the module antenna (MA) may be less than 100%. In addition, the width and length of the slit (S) can significantly affect the resonance frequency of the system and may be used as a tuning mechanism. As the width (or length) of slit (S) changes, there is a resulting change in the overlap of the slit (S) with the antenna.

In use, the coupling frame (CF) may be disposed in close proximity to a transponder chip module (TCM), such as atop (or beneath) the module, so that the slit (S) (or other discontinuity) overlaps at least a portion of the module antenna (MA) of the transponder chip module (TCM), so that the coupling frame (CF) enhances (including enables) coupling between the transponder chip module (TCM) and another RFID device such as a contactless reader. When the slit (S) is not overlapping the antenna, communication with the transponder chip module (TCM) may be suppressed (or inhibited, including disabled). The coupling frame (CF) may be incorporated into an RFID device such as a smartcard, it may constitute substantially the entire body of a metal smartcard, it may be incorporated into the transponder chip module (TCM), and it may comprise a component of a payment object. When a single "thick" coupling frame (with slit, or NCS) constitutes substantially the entire card body of a smartcard, the smartcard may be referred to as a "metal card" (MC) having a metal card body (MCB).

In order to satisfy communication requirements for a given smartcard application, in terms of maximum communication read/write range for example, the RFID chip (IC) must have a minimum power level delivered to it. The module antenna (MA) inductance, resistance and capacitance all affect the power level delivered to the chip (IC); at the maximum communication distance from the reader antenna, the module antenna (MA) is delivering the minimum chip (IC) power level. The better the performance of a given module antenna (MA) with a given chip (IC), the greater the maximum communication distance of the transponder chip module (TCM) with respect to the external reader antenna.

According to some embodiments (examples) of the invention, an RFID device may comprise: a transponder chip module (TCM) comprising an RFID chip (IC) and a module antenna (MA), and may be characterized by: a coupling frame (CF) comprising a conductive surface and having an electrical discontinuity comprising a slit (S) or non-conductive stripe (NCS) extending through the surface from an outer edge thereof to an inner position thereof, wherein the coupling frame (CF) is disposed so that the slit (S) overlaps at least a portion of the module antenna (MA).

At least one of the coupling frame (CF) and the module antenna (MA) may be moveable with respect to the other so that communication with the transponder chip module (TCM) may selectively be enhanced or suppressed (including enabled or disabled, respectively). In a first position, the slit (S) of the coupling frame (CF) overlaps the module antenna (MA); and in a second position, the silt (S) of the coupling frame (CF) does not overlap the module antenna (MA). The coupling frame (CF) can be rotated, toggled, slid, or flipped with respect to the transponder chip module (TCM).

The slit (S) of the coupling frame (CF) may cover at least a substantial portion of an entire central area of the module antenna (MA), including at least 50%, at least 60%, at least 90%, and at least 100% thereof.

According to some embodiments (examples) of the invention, a method of selectively enabling or disabling communication with a transponder chip module (TCM) in an RFID device may comprise: providing a coupling frame (CF) having a slit (S); and moving at least one of the transponder chip module and the coupling frame so that (i) the slit overlaps the module antenna to enable communication; and (ii) the slit does not overlap the module antenna to disable communication. The RFID device may comprise a second transponder chip module; and moving the coupling frame may enable one or the other of the two transponder chip modules.

The RFID device may be a plastic smartcard, metal smartcard, metal veneer cards (aka metal embedded card), hybrid metal plastic smartcard, payment object, wearable device, jewelry item or key-fob.

According to some embodiments (examples) of the invention, a card body construction for a smartcard (SC) may comprise: at least one metal layer having an opening for receiving a transponder chip module (TCM) and a slit (S) extending from the opening to an outer edge of the layer, so that the layer may function as a coupling frame (CF). A first metal layer may have an opening for receiving the transponder chip module (TCM); a second metal layer may have an opening for receiving a mold mass of the transponder chip module (TCM) so that the slit (S) overlaps a module antenna (MA) of the transponder chip module (TCM); and a third metal layer may have a slit (S). The third metal layer may not have an opening for receiving the transponder chip module. This stack of coupling frames (SCFs) may be laminated together to form a metal card body.

A given layer of a multi-layer card (smartcard of key fob) may not have an opening, but may nevertheless have a slit (or discontinuity) extending from an edge of the layer to a position of the transponder chip module so that the slit overlaps at least a portion of the module antenna of the transponder chip module.

Some features which may be discussed herein may include:

the coupling frame (CF) has a slit (S) extending from an outer edge to an inner position thereof, and overlaps at least a portion, such as the traces on one side of the module antenna (MA), extending into the trace-free interior area ("no man's land") of the module antenna (MA). The slit (S) may be straight, L-shaped, T-shaped and the like. The width and length of the slit (S) may be established with respect to the dimensions of the no-man's land, and the slit (S) may overlap some turns on other sides of the antenna. (As used herein, "no-man's land" may refer to an area inside a planar antenna which is devoid of antenna tracks. Antenna tracks may be referred to as "windings", or "turns".)

the coupling frame (CF) may be moved relative to the transponder chip module (TCM), more particularly with respect to the module antenna (MA) thereof, to selectively enable/disable communications with the transponder chip module (TCM). Movement may include rotating, flipping, toggling, sliding, and the like.

a second coupling frame having a slit can interact with a first coupling frame having a slit so that the coupling frame(s) are effective only when their slits are aligned with one another.

a second coupling frame having a slit can interact with a first coupling frame having two slits associated with two transponder chip modules to selectively enable one or the other of the transponder chip modules when the slits of the two coupling frames are aligned.

multiple coupling frames overlapping a transponder chip module (in particular, one of the coupling frames overlapping the tracks of the module antenna (MA)) may be used to form a stack of metal layers in a laminated metal card body, whereby the slit in each of the coupling frames extending from the opening (MO) in the coupling frame to accept the transponder chip module (TCM) may end at a different position, providing mechanical strength in the card body construction. Each coupling frame in the stack of coupling frames is isolated from one another using a dielectric medium.

Some additional features may include:

An LED may be connected across the slit (S) of a coupling frame (CF) in conjunction with transponder chip module (TCM), and may be powered when in the interrogation field of an external contactless reader, such as to indicate a transaction taking place.

A capacitor connected in parallel with the module antenna (MA) may be used to lower the resonance frequency while at the same time reducing the number of turns to compensate for the drop in frequency, resulting in the enhancement of the RF performance.

Magnetic material may be disposed in the center area of a laser etched antenna structure as a flexible substrate for insertion in a wearable device.

A module antenna (MA) which is U-shaped along a side thereof may be oriented to that the turns of the antenna do not cross over the slit (S) in a coupling frame (CF), but rather are routed around the slit.

A capacitor can be connected across the slit of a coupling frame to alter its resonant frequency, and improve its performance (such as coupling with the module antenna and with the antenna of an external reader.)

The improvements disclosed herein may enhance the power delivery to an RFID chip connected to a planar antenna with a confined surface area forming a transponder chip module, to improve on the read/write range with a contactless point of sale terminal.

This disclosure also relates to passive RFID devices which may operate on the combined principle of capacitive and inductive coupling (reactive coupling) to effectuate data communication and harvest energy with and from a contactless reader and to drive active elements, in particular for integration into payment and identification objects.

This disclosure also relates to metal cards produced through additive manufacturing including sintering, said metal cards modified to function as coupling frames. Metals such as gold, sterling silver, titanium and brass, and insulating materials such as polyamide, ABS, resin, ceramics and rubber may be 3D printed in combination. Payment objects may be 3D printed, made from a variety of metals with a slit printed with an insulating material.

This disclosure also relates to overlapping coupling frames in the form of metal layers (such as made of sterling silver or stainless steel) with a transponder chip module embedded between the layers to function as a payment object, such as a piece of jewelry. The overlapping coupling frames may be riveted or laser welded, enclosing the transponder chip module entirely.

The disclosure also relates to smartcards having metal card bodies with a slit (or non-conductive stripe) to function as a coupling frame.

According to the invention, generally, smartcards having (i) a metal card body (MCB) with a slit (S) overlapping a module antenna (MA) of a chip module (TCM) or (ii) multiple metal layers (M1, M2, M3) each having a slit (S1, S2, S3) offset or oriented differently than each other. A front metal layer may be continuous (no slit), and may be shielded from underlying metal layers by a shielding layer (SL). Metal backing inserts (MBI) reinforcing the slit(s) may also have a slit (S2) overlapping the module antenna. Diamond like carbon coating filling the slit. Key fobs similarly fabricated. Plastic-Metal-Plastic smartcards and methods of manufacture are disclosed. Such cards may be contactless only, contact only, or may be dual-interface (contact and contactless) cards.

According to an embodiment (example) of the invention, an RFID device having a card body comprising multiple metal layers, at least some of the layers having a slit (S) or discontinuity (NCS) extending from an outer edge of a given layer to a position corresponding to the location of a transponder chip module (TCM) which may be an opening (MO) for accepting the transponder chip module, wherein the slit in each layer overlaps a module antenna (MA) of the transponder chip module and is located in a different position or orientation than the slits of other layers so that the slits of the various layers are not aligned with one another. The RFID device may further comprise a front metal layer (ML1) which is continuous, not having a slit or discontinuity, shielded from the other metal layers by a shielding layer (SL). The RFID device may be a smartcard or a key fob. The RFID device may be operable in both contact and contactless modes.

According to an embodiment (example) of the invention, a solid metal smartcard may comprise: a metal card body (MCB) having an opening (MO) for receiving a transponder chip module (TCM); a slit (S1) extending from an edge of the card body to the opening; wherein the card body is thinned in an area including the slit so that a back side of the metal card body is recessed; and a metal backing insert (MBI) disposed in the recess, spanning the slit and reinforcing the card body at the slit area. A module cover (MC) may be inserted into the module opening in the back of the card body. The thinned area may extend to the area of the transponder chip module (TCM), including surrounding the opening. The metal backing insert (MBI) may comprise a module opening and a slit (S2) extending from an edge of the MBI to the module opening. The metal backing insert (MBI) may be oriented in the card so that the slit (S2) does not extend to an edge of the card body, but rather is located in a central area of the card body. The thinned area may extends to the area of the transponder chip module (TCM), including surrounding the opening. The metal backing insert (MBI) may not have a module opening, and may have a slit (S2) extending from an edge of the metal backing insert (MBI) to a position at the interior of the metal backing insert (MBI) so that the slit is under a portion of and overlaps a module antenna (MA) of the transponder chip module (TCM).

According to an embodiment (example) of the invention, a method of manufacturing smartcards may comprise: providing a front subassembly by joining a front clear overlay and a front printed core; providing a rear subassembly by joining a rear clear overlay and a rear printed core; providing a metal layer (ML) having an opening (MO) for accepting a portion of a chip module; providing adhesive layers on both sides of the metal layer; and pre-press laminating the front and rear subassemblies against the metal layer to form a card blank. A slit (S) or a non-conductive stripe (NCS) may be provided extending from the opening in the metal layer to an edge of the metal layer so that the metal layer functions as a coupling frame for a contactless interface. A plastic slug may be disposed in the recess opening in the metal layer prior to laminating. A recess area may be milled through the front subassembly and into the plastic slug for accepting the chip module. A magnetic strip may be included in the rear plastic subassembly. The smartcard may be a "Plastic-Metal-Plastic" Hybrid Card.

According to an embodiment (example) of the invention, method of making plastic-metal-plastic smartcards having a metal core or metal face laminated to one or more layers of plastic may comprise: performing a cycle of heating one or more of the plastic layers to a value T1a above their Tg or Vicat temperatures, and then cooling the plastic layers; and repeating the cycle at alternate temperatures T1b, T1c, etc. The cycle of heating and cooling may be performed under pressure with the plastic layers in sheet form, roll-to-roll, or on coils of plastic material bearing optional spacer layers to prevent sticking of layers to each other. Following thermal cycling, the plastic layers may be trimmed to a required shape or size. Following thermal cycling, the plastic layers may be printed. The plastic layers may comprise Polyvinyl Chloride (PVC), Polycarbonate (PC), Polyethylene terephthalate (PET) or Polyethylene Terephthalate Glycol-modified (PET-G). Different layers may comprise different plastic materials.

According to an embodiment (example) of the invention, a method of manufacturing a shrouded metal inlay for a smartcard may comprise: providing a metal core layer having a plurality of sites, each site corresponding to an individual smartcard; disposing PVC layers on the front and back of the metal core layer; and digitally printing at least one of the PVC layers. The sites may be arranged in an array having rows and columns. The metal core layer may have a thickness of approximately 350 µm. The PVC layers may each have a thickness of approximately 125 µm. Protective overlay layers may be laminated to both sides of the pre-printed laminate. Openings may be milled for accepting transponder chip modules (at each site, for each card). The sheets may be cut into a corresponding plurality of individual ID-1 size smartcards.

In their various embodiments, the invention(s) described herein may relate to industrial and commercial industries, such RFID applications, payment smartcards, secure identity cards, access control cards, payment objects, wearable devices, smart jewelry and the like.

Other objects, features and advantages of the invention(s) disclosed herein, and their various embodiments, may become apparent in light of the descriptions of some exemplary embodiments that follows.

BRIEF DESCRIPTION OF THE DRAWINGS

Reference will be made in detail to embodiments of the disclosure, non-limiting examples of which may be illustrated in the accompanying drawing figures (FIGs). Some figures may be in the form of diagrams. Some elements in the figures may be exaggerated, others may be omitted, for illustrative clarity.

Any text (legends, notes, reference numerals and the like) appearing on the drawings are incorporated by reference herein.

Some elements may be referred to with letters ("AM", "AS", "BA", "CES", "CF", "CP", "LES", "MA", "MT", "MO", "PA", "RC", "S", "SCF", "TCM", etc.) rather than or in addition to numerals. Some similar (including substantially identical) elements in various embodiments may be similarly numbered, with a given numeral such as "310", followed by different letters such as "A", "B", "C", etc. (resulting in "310A", "310B", "310C"), and variations thereof, and may be collectively (all of them at once) or individually (one at a time) referred to simply by the numeral ("310").

The figures presented herein may show different embodiments of RFID devices, such as smartcards or payment objects such as wearable devices. Some of the drawings may omit components such as the transponder chip module or module antenna, for illustrative clarity. Some of the figures may show only components of an RFID device, such as coupling frames.

Figure 1:
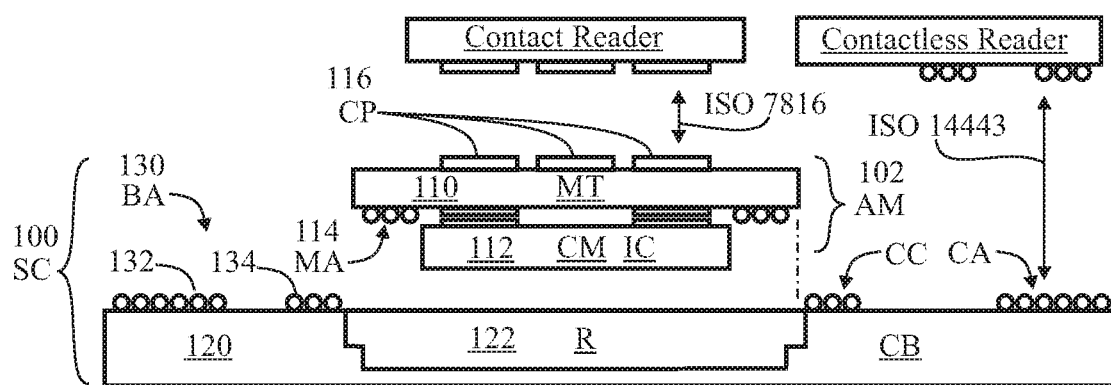

FIG. 1 is a diagram (cross-sectional view) of a dual-interface smartcard having a booster antenna, and external contact and contactless readers.

FIG. 2A is a diagram (cross-sectional view) illustrating a smartcard having metal layer modified with a slit to function as a coupling frame.

FIG. 2B is a diagram (partial perspective view) illustrating smartcard having a metal card body modified with a slit to function as a coupling frame.

FIG. 2C is a diagram (cross-sectional view) illustrating transponder chip module with a coupling frame integrated therein.

FIG. 3 is a diagrammatic view of a front surface of a smartcard which may be a metal card or composite metal card having a slit to function as a coupling frame.

FIG. 4 is a diagrammatic view of a front surface of a smartcard which may be a metal card or composite metal card having a slit to function as a coupling frame.

Figure 5A:
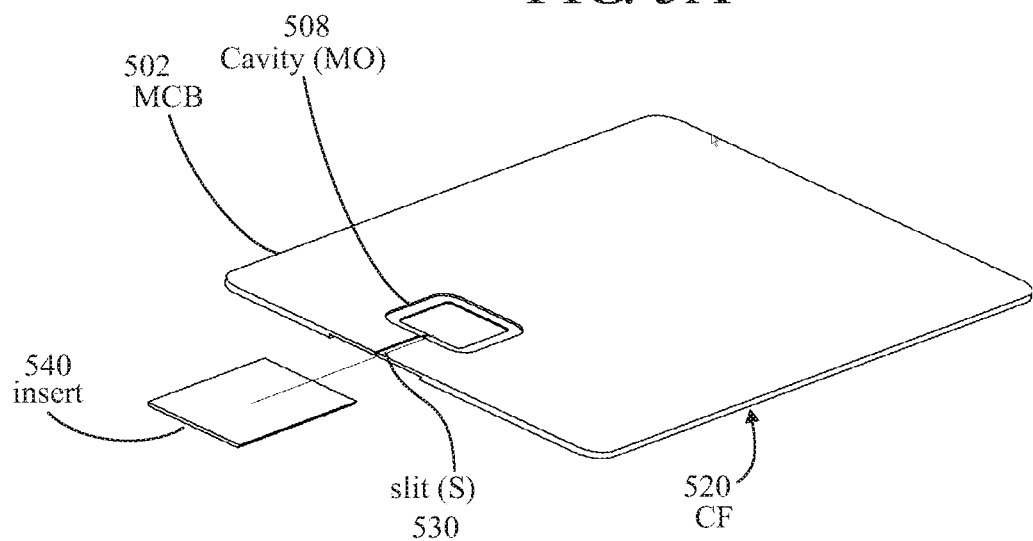
Figure 5B:
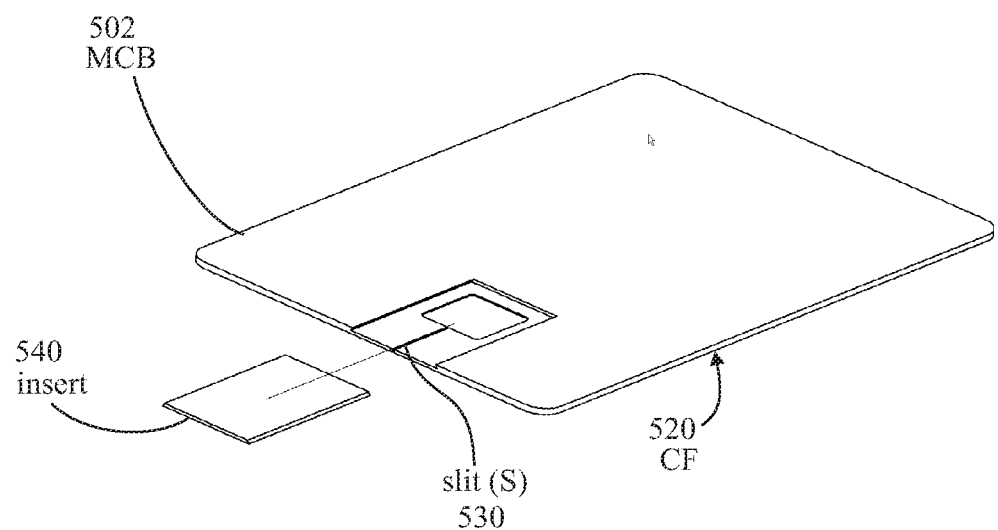

FIGS. 5A,B are two perspective views (front and back) of a metal card body (MCB) having an opening or cavity (MO) for a transponder chip module (TCM, not shown), and a slit (S) extending from the cavity to an outer edge of the metal card body. The card body has a thinned area encompassing the slit, and may receive an insert for supporting the card body at the slit.

FIG. 5C is a perspective view showing a metal card body (MCB) having an opening or cavity (MO), but rather than the cavity being entirely open at the bottom, portions of the card body which may be referred to as struts may be left in place, spanning the cavity, to reinforce the card body behind the transponder chip module (when it is installed in the card body).

Figure 6:
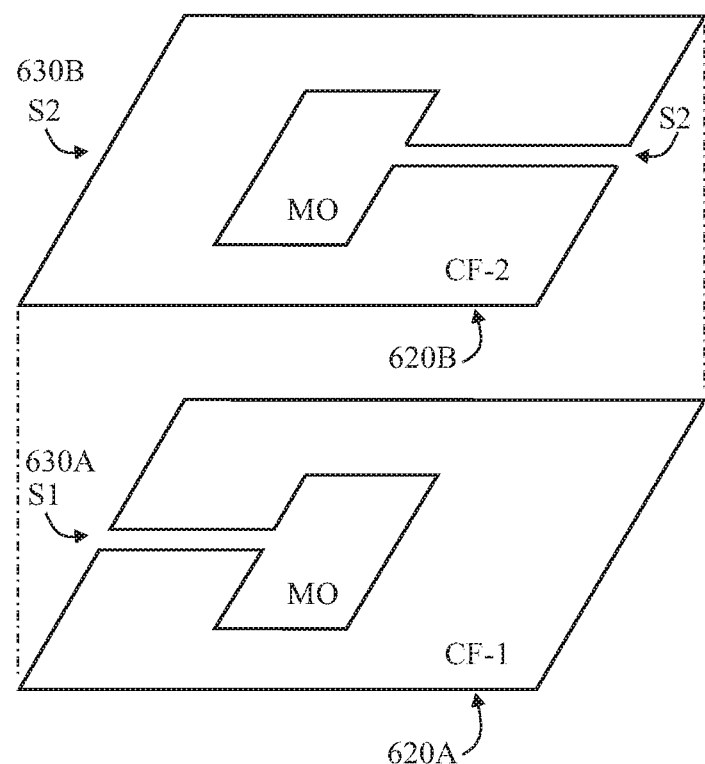

FIG. 6 is a diagram (in perspective view, exploded) of two coupling frames (CF-1, CF-2) stacked one atop the other. Module openings (MO) in the two coupling frames are aligned. Slits (S1, S2) extend in different directions from the module openings.

Figure 7A:
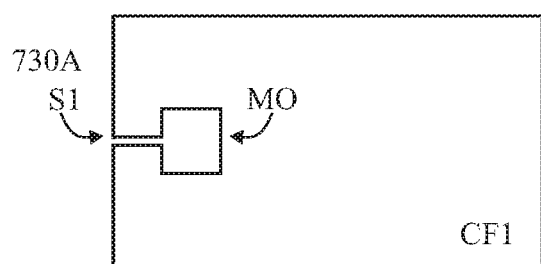
Figure 7B:
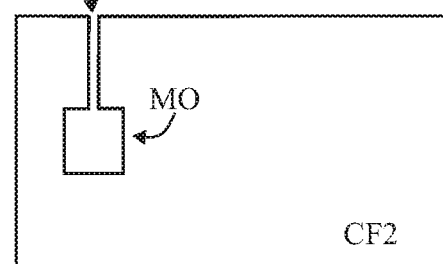
Figure 7C:
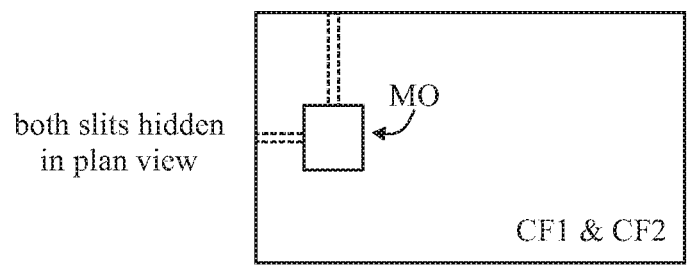

FIGS. 7A,B,C are diagrams (in plan view) showing two coupling frames (CF-1, CF-2) being joined together and overlapped. Module openings (MO) in the two coupling frames are aligned. Slits (S1, S2) extend in different directions from the module openings.

Figure 8:
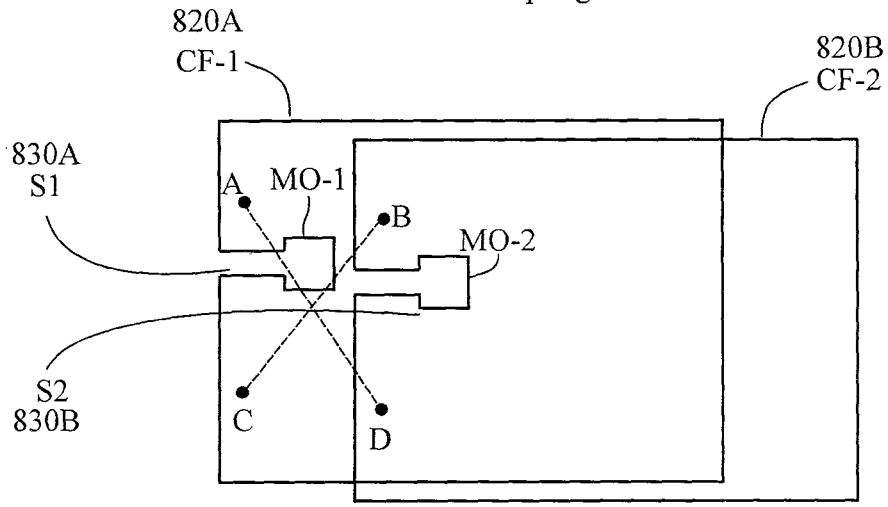

FIG. 8 is a diagram (plan view, exploded) showing two coupling frames (CF-1, CF-2) each having two ends, and illustrates alternative ways of connecting the ends of one coupling frame to the ends of the other coupling frame.

Figure 9:
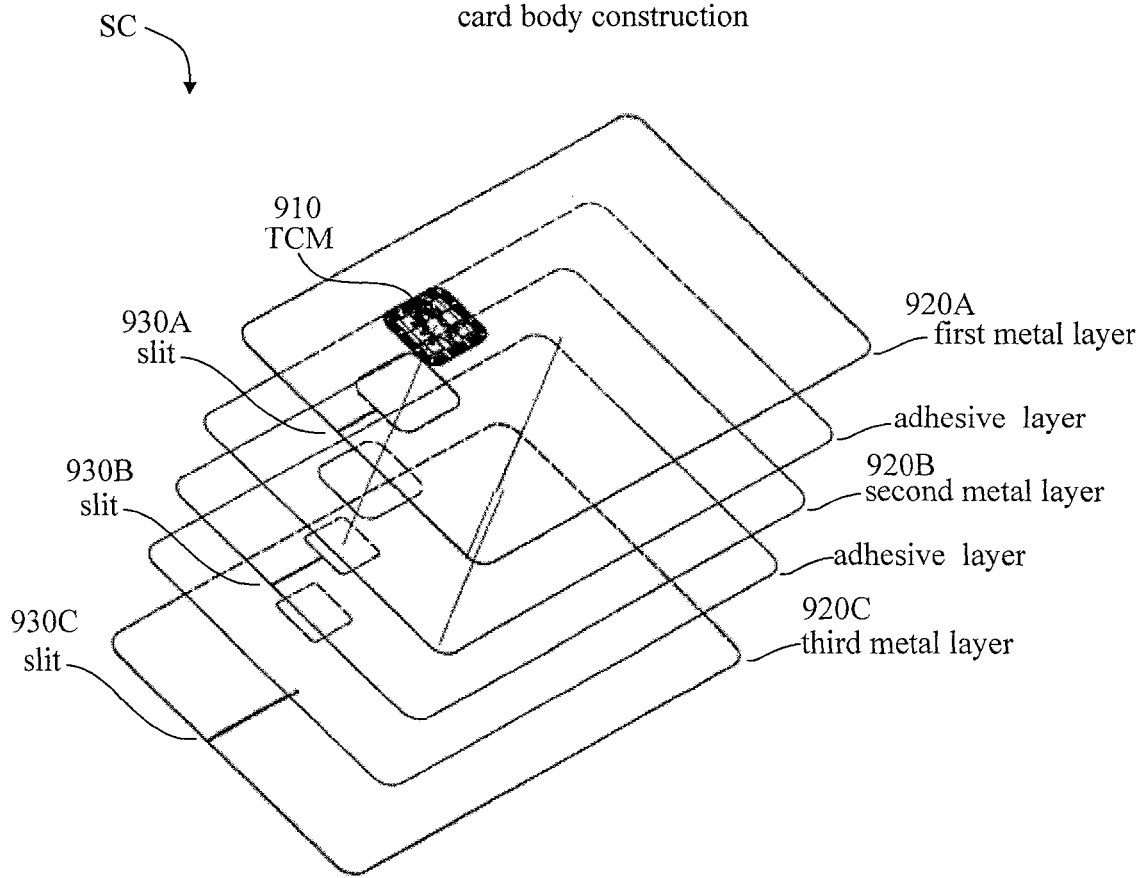

FIG. 9 is a diagram (perspective view, exploded) of a construction of a card body of a smartcard. Three metal layers (ML1, ML2, ML3) are isolated from each other by adhesive layers, and each layer has a slit.

Figure 10A:
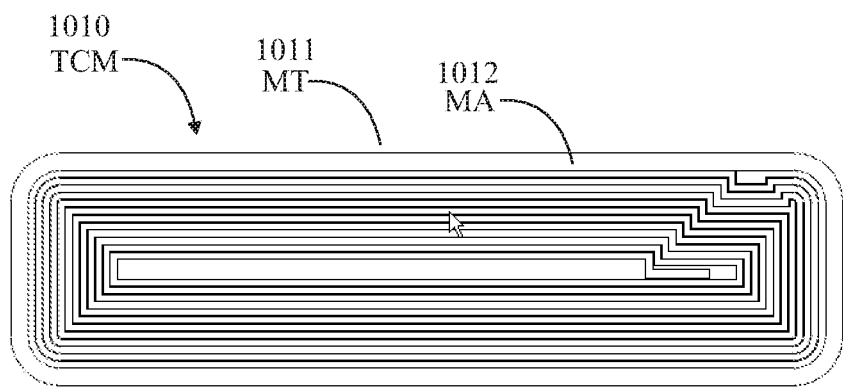
Figure 10B:
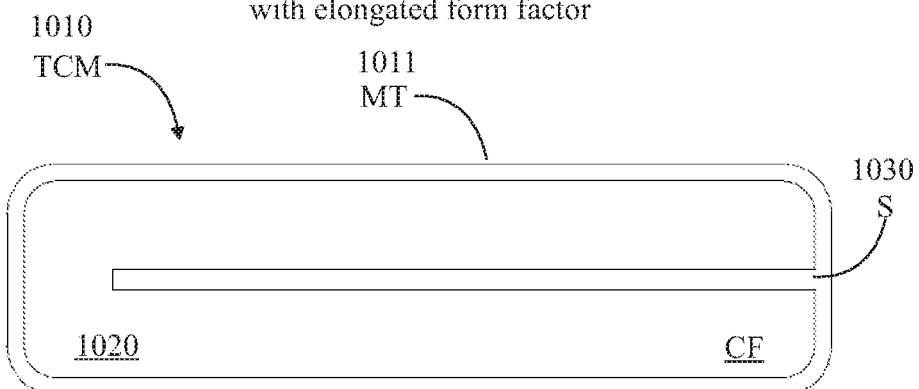

FIG. 10A is an illustration (top plan view) of a transponder chip module (TCM) having a module antenna (MA) and a coupling frame (CF), and FIG. 10B is an illustration (bottom plan view) of the transponder chip module showing a coupling frame (CF) with a slit (S).

Figure 11A:
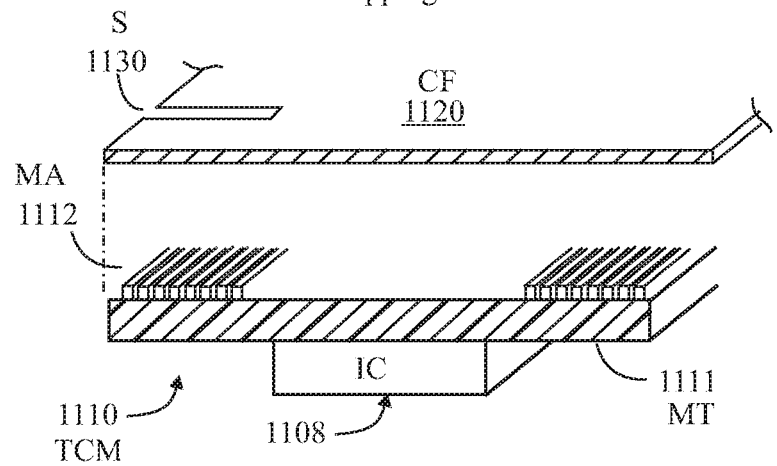

FIG. 11A is an exploded, partial perspective view of a coupling frame (CF) and transponder chip module (TCM).

Figure 11B:
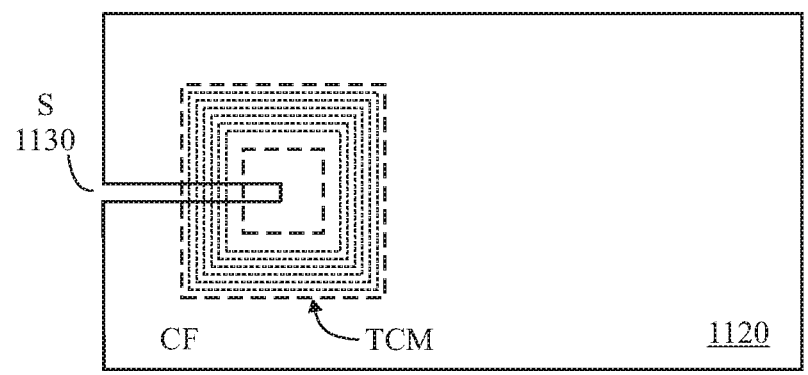

FIG. 11B is a plan view of the coupling frame (CF) and transponder chip module (TCM) of FIG. 11A, aligned to enhance communication.

Figure 11C:
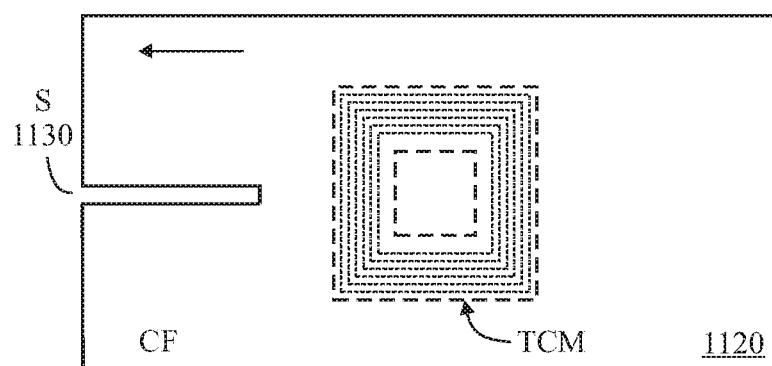

FIG. 11C is a plan view of the coupling frame (CF) and transponder chip module (TCM) of FIG. 11A, displaced to block communication.

Figure 11D:
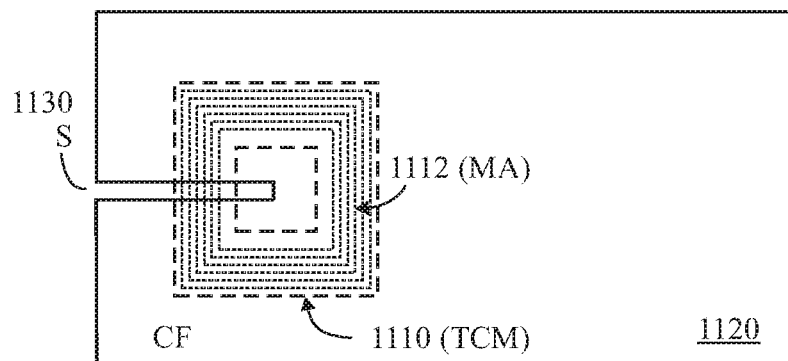

FIGS. 11D, E are plan views of a coupling frame (CF) and transponder chip module (TCM).

Figure 12:
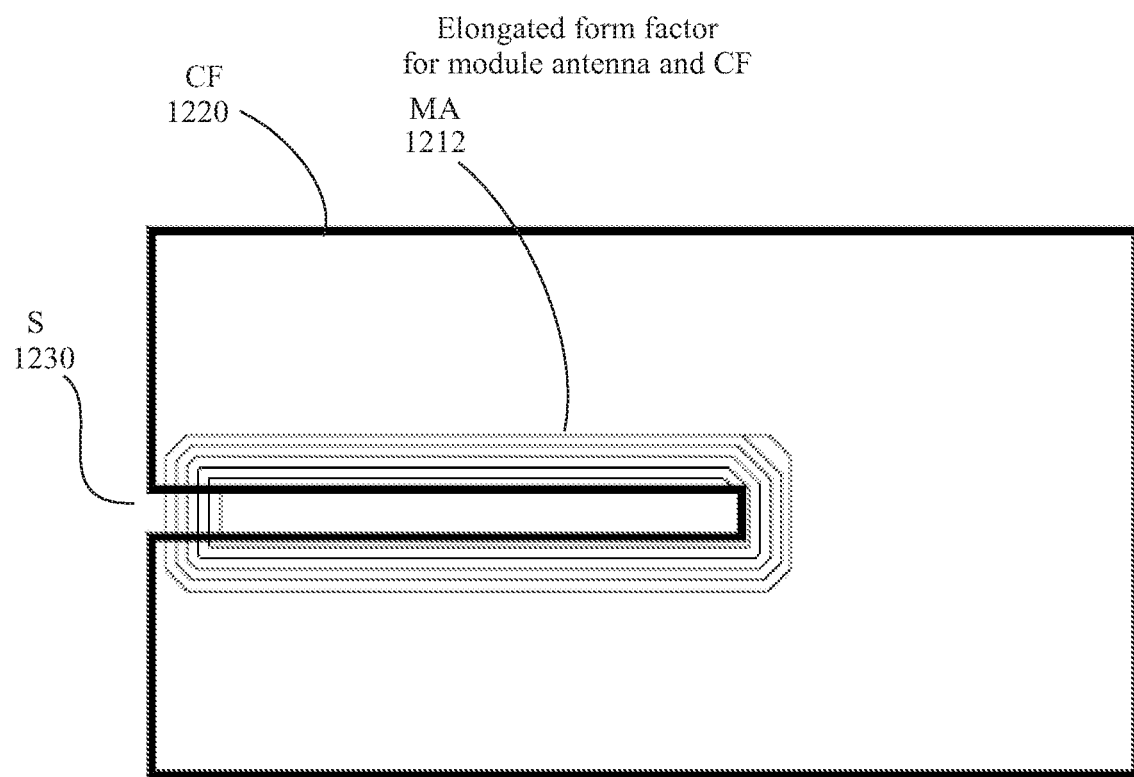

FIG. 12 is a diagram (plan view) of a coupling frame (CF) and module antenna (MA) of a transponder chip module (TCM) having an elongated form factor.

Figure 13A:
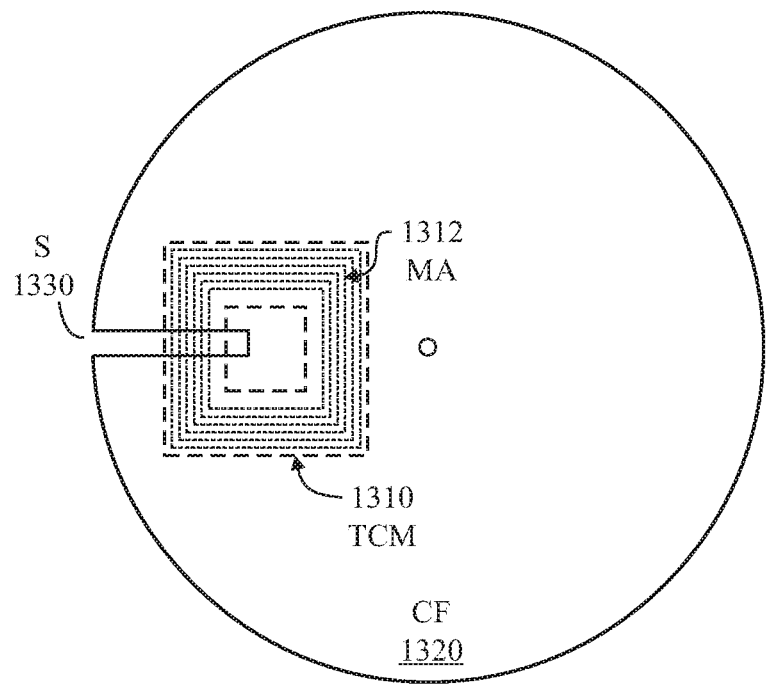

FIG. 13A is a plan view of a coupling frame (CF) and transponder chip module (TCM).

Figure 13B:
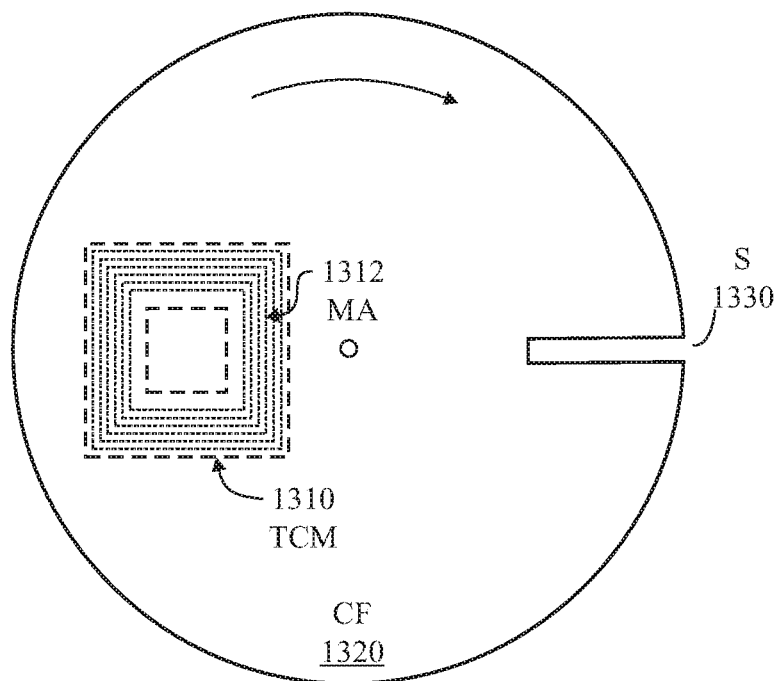

FIG. 13B is a plan view of a coupling frame (CF) and transponder chip module (TCM).

Figure 14A:
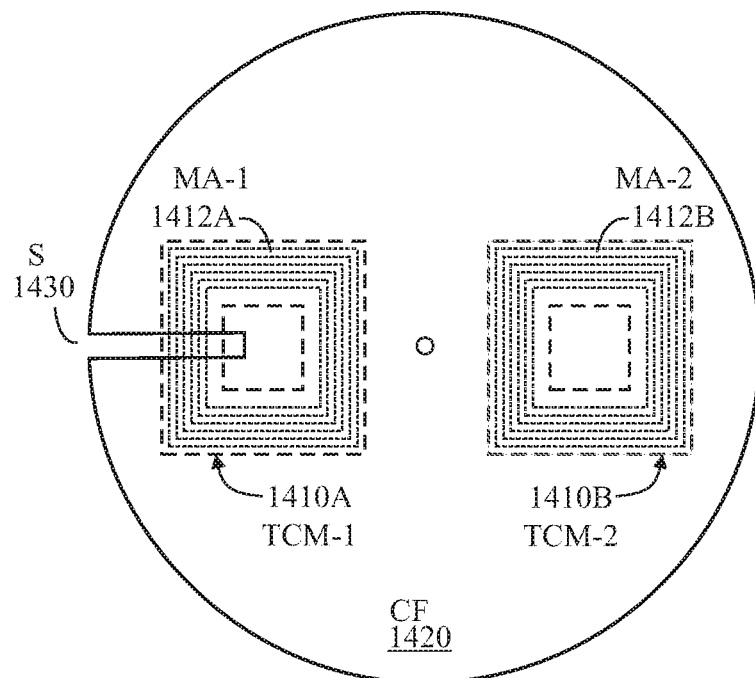

FIG. 14A,B are diagrams (plan view) of a coupling frame (CF) and two transponder chip modules (TCM), with payment selection (enabling one of two transponder chip modules).

Figure 15A:
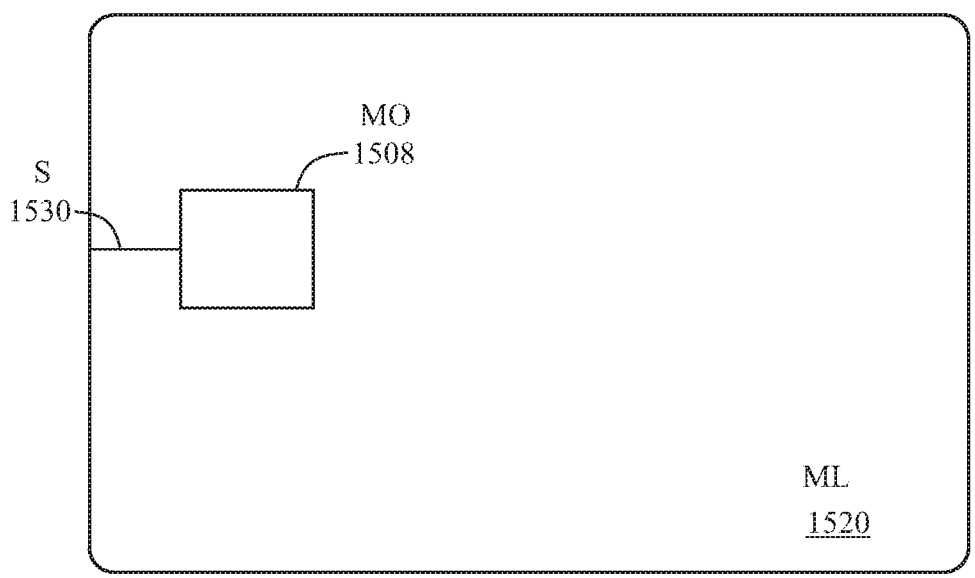

FIG. 15A is a diagram (plan view) showing a typical arrangement of a metal layer (or body) of a smartcard having a slit extending from an outer edge to an opening for a transponder chip module, thereby forming a coupling frame. It should be understood that a portion of the module may overlap the metal layer, or a portion thereof (compare FIGS. 2A, 2B) so that the slit in the coupling frame overlaps the module antenna of the transponder chip module.

Figure 15B:
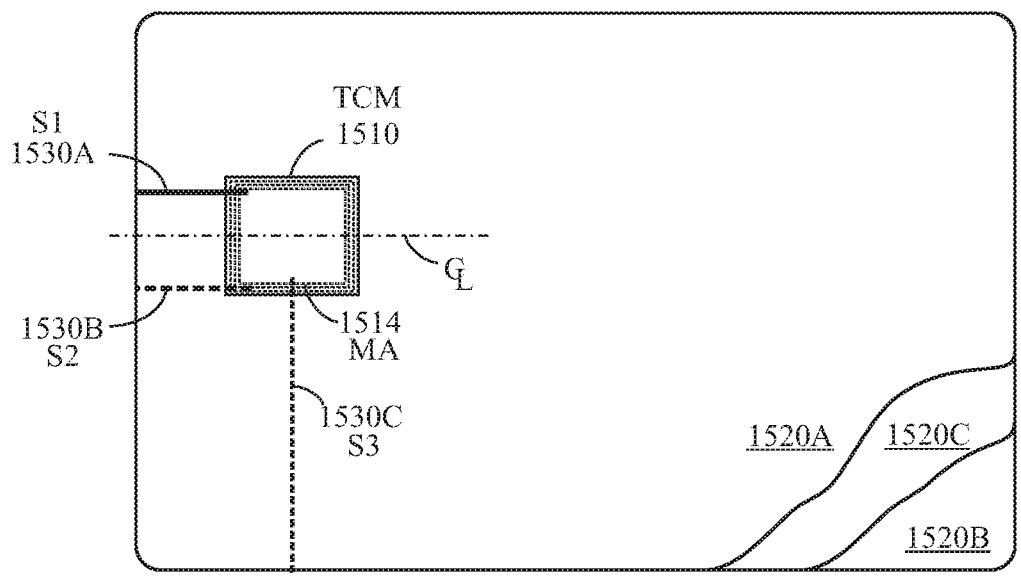

FIG. 15B is a diagram (plan view) showing a smartcard having multiple metal layers, each metal layer having a slit extending from an outer edge of the layer to an opening for a transponder chip module, and the slits are offset from one another (extend in different directions from different positions of the respective openings, or cavities).

Figure 16A:
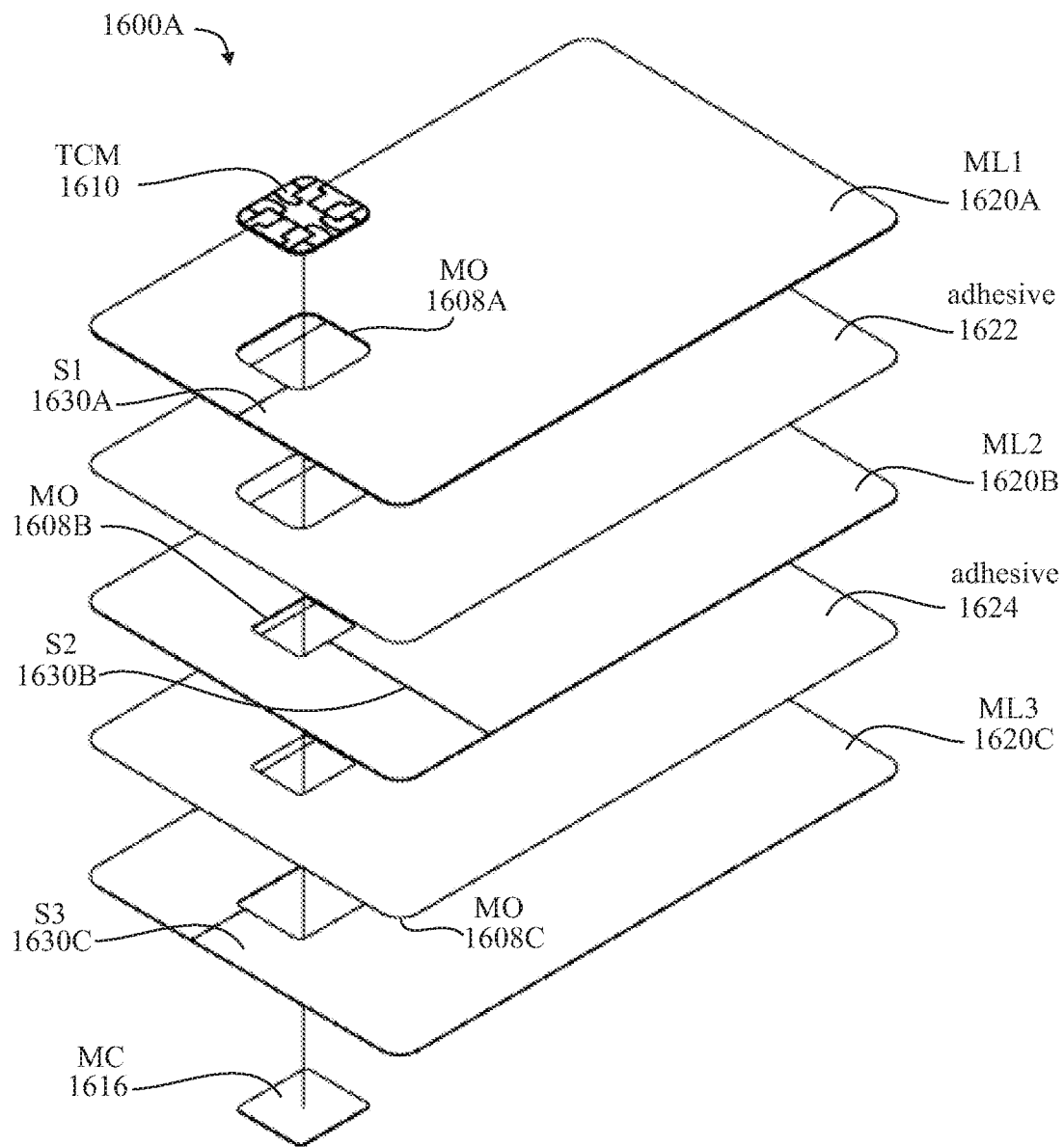

FIG. 16A is a diagram (exploded perspective view) of a metal laminated smartcard (RFID device) having multiple metal layers with slits.

Figure 16B:
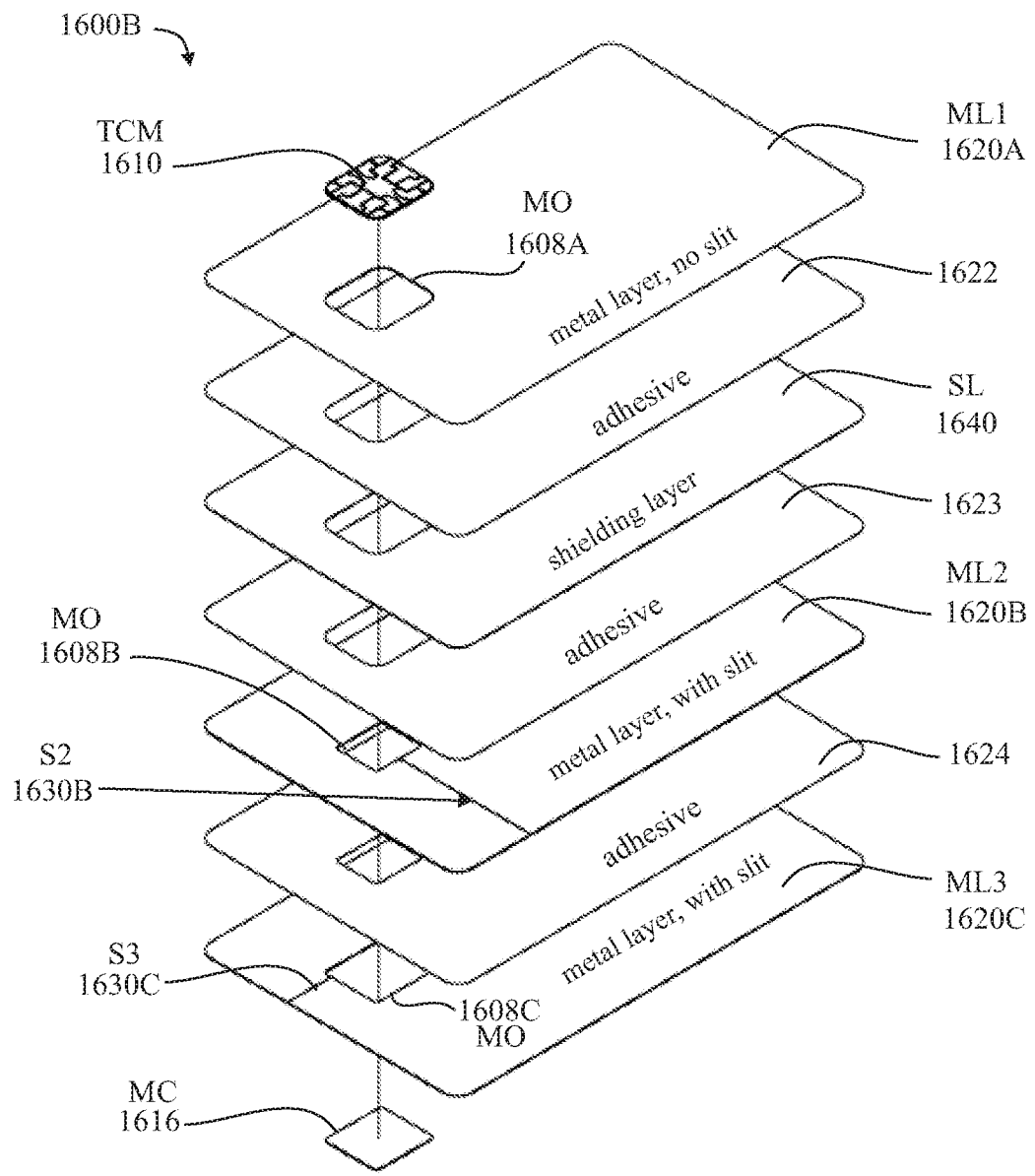

FIG. 16B is a diagram (exploded perspective view) of a metal laminated smartcard (RFID device) having metal layers with slits, one metal layer without a slit, and a shielding layer.

Figure 17:
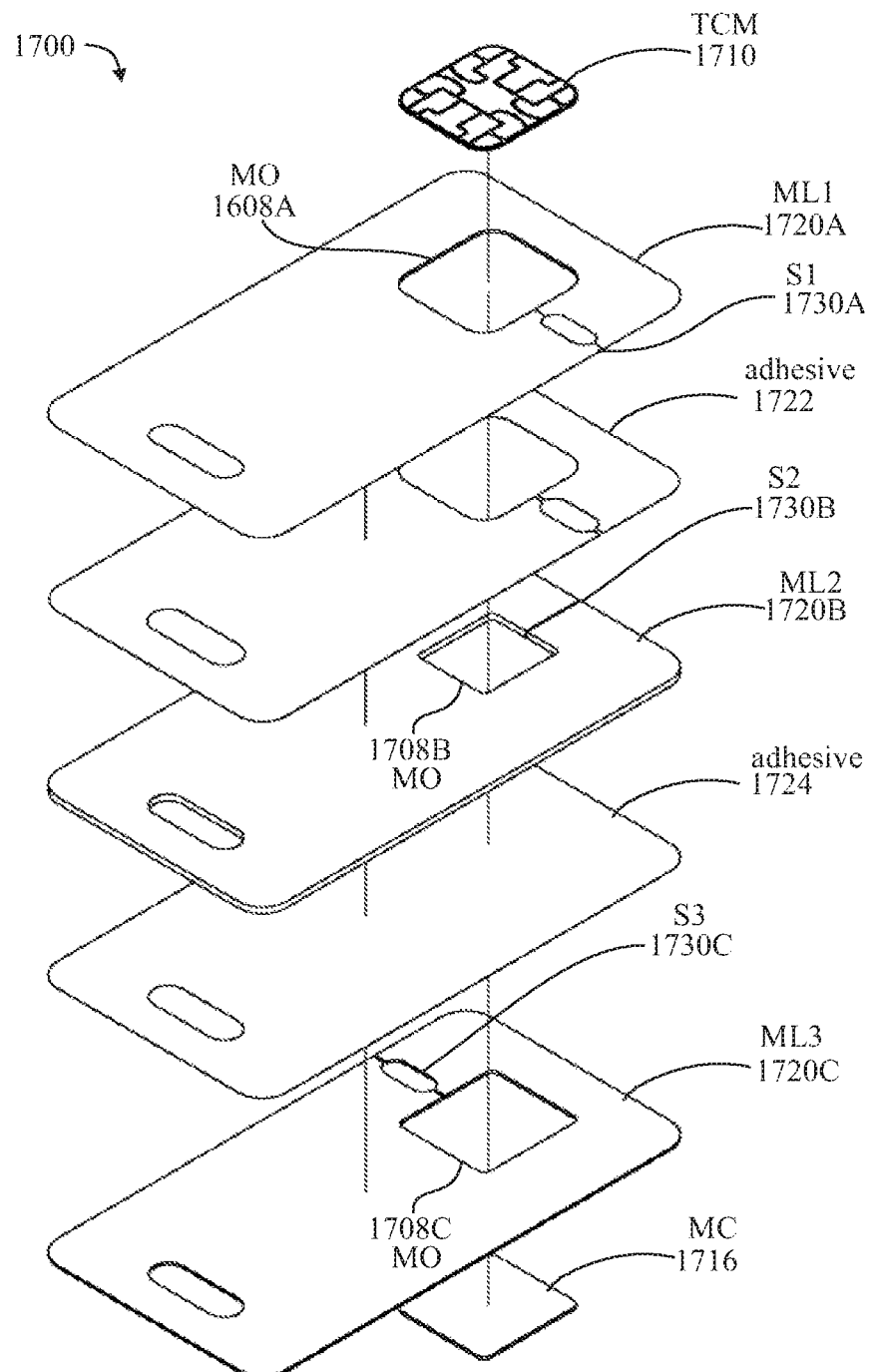

FIG. 17 is a diagram (exploded perspective view) of a key fob laminated card (RFID device) having multiple metal layers with slits.

Figure 18A:
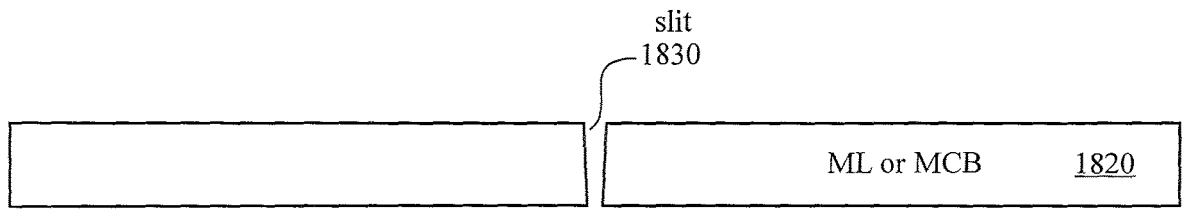

FIG. 18A is a diagrammatic view (cross-sectional view) of a metal layer or card body with a slit.

Figure 18B:
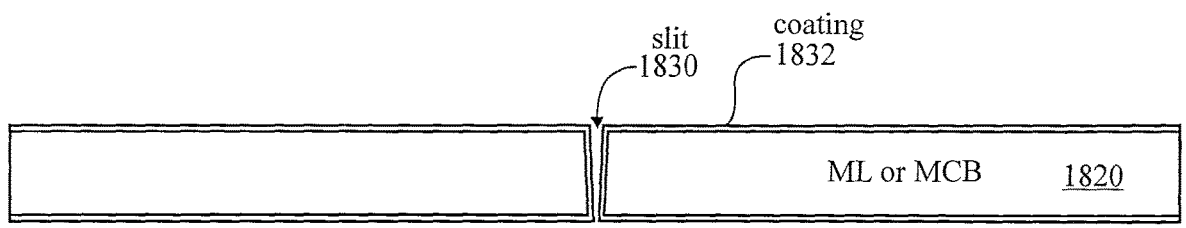

FIG. 18B is a diagrammatic view (cross-sectional view) of the metal layer or card body of FIG. 18A after coating.

Figure 19A:
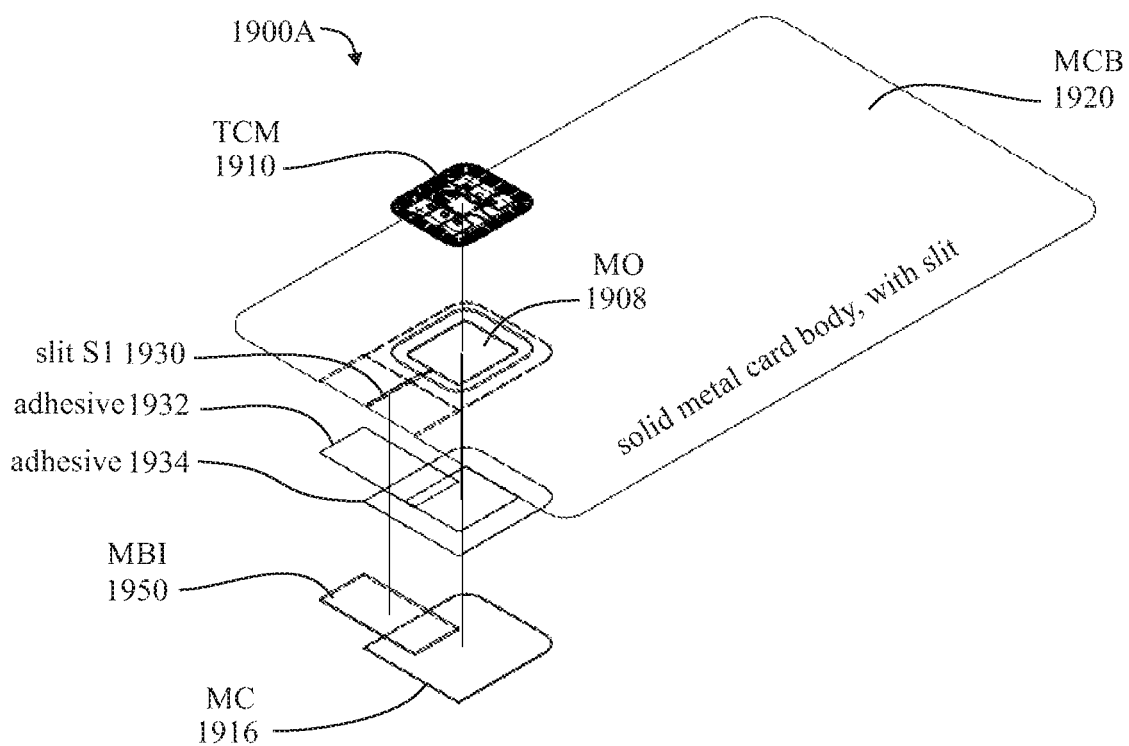

FIG. 19A is a diagrammatic view (perspective exploded view) of a smart card (RFID device) with a solid metal card body having a slit.

Figure 19B:
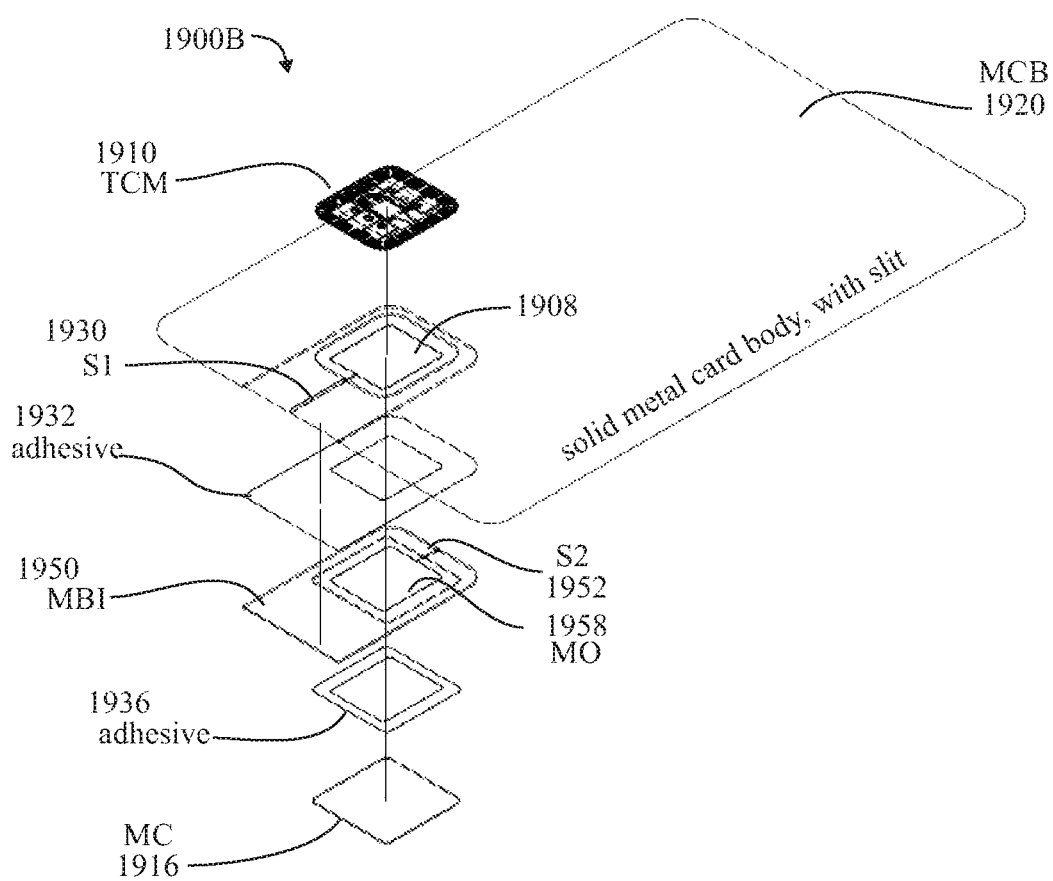

FIG. 19B is a diagrammatic view (perspective exploded view) of a smart card (RFID device) with a solid metal card body having a slit.

Figure 19C:
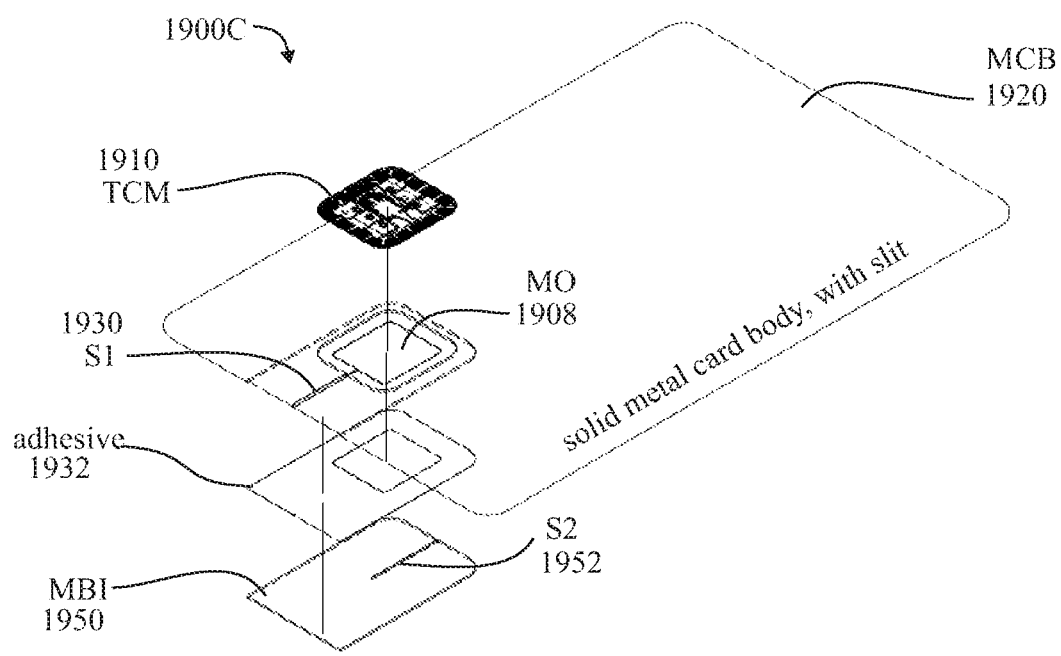

FIG. 19C is a diagrammatic view (perspective exploded view) of a smart card (RFID device) with a solid metal card body having a slit.

FIG. 20A is a diagram (exploded perspective view) of a "Plastic-Metal-Plastic" Card (aka metal Embedded Card) (RFID device), before lamination. A chip module is shown for insertion into the card.

Figure 20B:
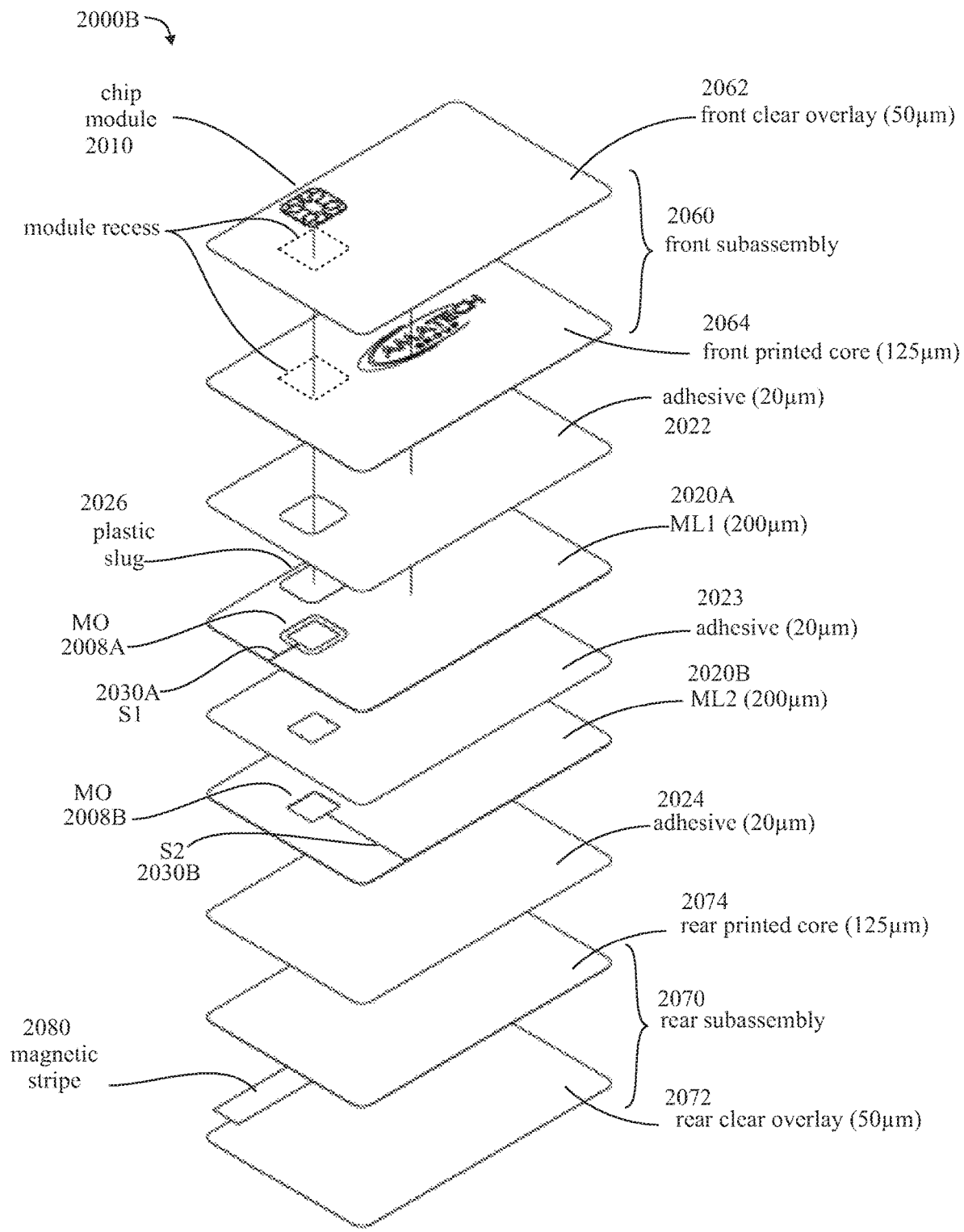

FIG. 20B is a diagram (exploded perspective view) of an alternate construction for a "Plastic-Metal-Plastic" Card (aka metal Embedded Card) (RFID device), before lamination. A chip module is shown for insertion into the card.

Figure 20C:
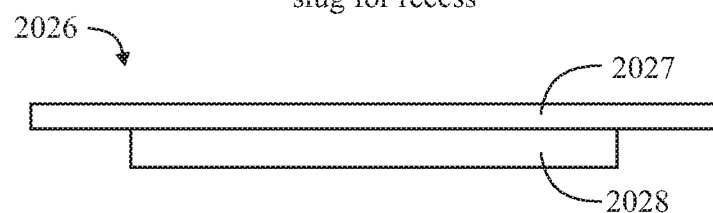

FIG. 20C is a diagram (perspective view) of a slug for fitting in the stepped recess of the "Plastic-Metal-Plastic" Cards (aka metal Embedded Card).

Figure 20D:
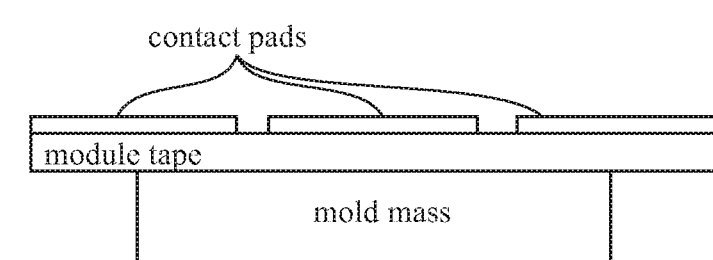

FIG. 20D is a more detailed view of a chip module showing contact pads on one (top) side of a module tape, a mold mass covering an RFID chip (not shown) on the other (bottom) side of the module tape. A module antenna (not shown) may be disposed on the bottom side of the module tape.

DETAILED DESCRIPTION

Various embodiments (or examples) may be described to illustrate teachings of the invention(s), and should be construed as illustrative rather than limiting. It should be understood that it is not intended to limit the invention(s) to these particular embodiments. It should be understood that some individual features of various embodiments may be combined in different ways than shown, with one another. Reference herein to "one embodiment", "an embodiment", or similar formulations, may mean that a particular feature, structure, operation, or characteristic described in connection with the embodiment is included in at least one embodiment of the present invention. Some embodiments may not be explicitly designated as such ("an embodiment").

The embodiments and aspects thereof may be described and illustrated in conjunction with systems, devices and methods which are meant to be exemplary and illustrative, not limiting in scope. Specific configurations and details may be set forth in order to provide an understanding of the invention(s). However, it should be apparent to one skilled in the art that the invention(s) may be practiced without some of the specific details being presented herein. Furthermore, some well-known steps or components may be described only generally, or even omitted, for the sake of illustrative clarity. Elements referred to in the singular (e.g., "a widget") may be interpreted to include the possibility of plural instances of the element (e.g., "at least one widget"), unless explicitly otherwise stated (e.g., "one and only one widget").

In some figures, abbreviations (e.g., CF, S, etc.) which have been established for devices and components thereof may be used without accompanying reference numbers to identify various elements in the figures, for illustrative clarity.

In the following descriptions, some specific details may be set forth in order to provide an understanding of the invention(s) disclosed herein. It should be apparent to those skilled in the art that these invention(s) may be practiced without these specific details. In some descriptions, parameters such as dimensions, activation distance, frequency of operation, mode of operation and the like may be discussed, and these should be regarded as exemplary. Any dimensions and materials or processes set forth herein should be considered to be approximate and exemplary, unless otherwise indicated. Headings (typically underlined) may be provided as an aid to the reader, and should not be construed as limiting.

Some processes may be presented and described in a series (sequence) of steps. It should be understood that the sequence of steps is exemplary, and that the steps may be performed in a different order than presented, some steps which are described may be omitted, and some additional steps may be omitted from the sequence and may be described elsewhere.

Reference may be made to disclosures of prior patents, publications and applications. Some text and drawings from those sources may be presented herein, but may be modified, edited or commented to blend more smoothly with the disclosure of the present application. Citation or identification of any reference should not be construed as an admission that such reference is available as prior art to the disclosure.

In the descriptions that follow, smartcards (or "smart cards") operating in both contactless and contact modes may be described. It should be understood that the teachings set forth herein may be applicable to smartcards having only a contact interface. Also, the teachings set forth herein may be applicable to RFID devices (which may operate only in a contactless mode) other than smartcards, such as key fobs, etc.

FIG. 1 is a diagram (cross-sectional view) of a conventional dual-interface smartcard (SC) and readers, as exemplary of an RFID device. This RFID device is "dual interface" since it can interact either with external contact readers (e.g., ISO 7816) or with contactless readers (e.g., ISO 14443, 15693).

FIG. 1 illustrates a smartcard SC (100) in cross-section, along with a contact reader (e.g., ISO 7816) and a contactless reader (e.g., ISO 14443). An antenna module (AM, or transponder chip module TCM) 102 may comprise a module tape (MT) 110, an RFID chip (CM or IC) 112 disposed on one side (face-down) of the module tape MT along with a module antenna (MA) 114 for interfacing with the contactless reader. The antenna module (AM) may comprise contact pads (CP) 116 disposed on the other (face-up) side of the module tape (MT) for interfacing with the contact reader. The card body (CB) 120 comprises a substrate which may have a recess (R) 122 extending into one side thereof for receiving the antenna module (AM). (The recess R may be stepped—such as wider at the surface of the card body (CB)—to accommodate the profile of the antenna module AM.) The booster antenna (BA) 130 may comprise turns (or traces) of wire (or other conductor) embedded in (or disposed on) the card body CB, and may comprise a number of components such as (i) a card antenna (CA) component 132 and (ii) a coupler coil (CC) component 134. It may be noted that, as a result of the recess R being stepped, a portion of the card body (CB) may extend under a portion of the antenna module (AM), more particularly under the module antenna (MA).

In the main, hereinafter, RFID devices having only a contactless interface (and not having a contact interface) may be described. In the main, hereinafter, RFID devices having a coupling frame rather than a booster antenna may be described.

Some Definitions

As used herein, a transponder chip module TCM, which may be referred to simply as a "transponder", is typically a component of an RFID device such as a smartcard, or a payment object and may comprise (i) a support substrate or module tape MT, (ii) an RFID chip (IC, CM) and (iii) a module antenna (MA), connected with the RFID chip. The transponder chip module may be referred to in some descriptions simply as the "module" or as the "transponder". It may also sometimes be referred to as an "antenna module" (AM) or antenna chip module.

A transponder chip module may be capable of communicating at least contactlessly (e.g., ISO 14443, 15693) with another RFID device such as an external contactless reader (such as at a point of sale terminal). The RFID chip in the transponder may also support a contact interface (e.g., ISO 7816), resulting in a dual-interface module. Typically, the payment objects disclosed herein may operate purely in a contactless mode.

A transponder may be a "passive" transponder which does not have its own power source (e.g., battery), but rather which receives (harvests) its operating power from an external reader (interrogator) rather than, for example, from a battery. An "active transponder" may have its own internal power source, such as a battery. A battery-assisted passive device may have a small battery on board and is activated when in the presence of an RFID reader.

The module antenna (MA) may be planar antenna structure comprising a single long conductive track having two ends connected with corresponding two terminals of the RFID chip. The module antenna may be laid out in a spiral pattern comprising several (such as 10-15) "traces" (sometimes referred to as "tracks"), separated by spaces (sometimes referred to as "gaps"). The module antenna may be formed by etching (either chemical etching or laser etching) of a conductive layer on the module tape (or a conductive foil applied to the module tape). The track (or trace) width may be approximately 100 µm, and may vary from end-to-end. The gap width may be approximately 25 µm and may vary along the length of the module antenna. The overall length of the module antenna may be approximately 400 mm. The traces of the module antenna may sometimes be referred to as "windings" since the module antenna MA (or antenna structure AS) may be analogous to a wire-wound antenna. The techniques disclosed herein may also be applicable to module antennas which are wire-wound or formed by embedding wire, having a number of turns and two ends.

The module antenna may be disposed as a single long conductive track which may be in the form of a rectangular spiral disposed in a generally rectangular path or band around a peripheral annular area of the module tape. An annulus is a plane figure consisting of the area between a pair of concentric circles—i.e., the area inside the outer circle and outside the inner circle). A square annulus is the planar shape contained between two concentric axis-parallel squares, i.e., two squares with a common center whose sides are parallel to the x- and y-axes. The annular area occupied by the module antenna may be rectangular, or other than rectangular, such as square or circular. In the examples described herein, the module antenna typically resides in a generally square rectangular annular area, and the module antenna may be considered to have four "sides".

The module antenna (or simply "antenna", or "planar antenna", or "antenna structure", or "laser-etched antenna structure") may be disposed on the same face-down side of the module tape as the RFID chip. The RFID chip may be disposed in a central area of the module tape which is devoid of antenna traces, and which may be referred to as "no man's land". The RFID chip may be disposed on an opposite side of the module tape from the module antenna. Additional antenna structures such as a second module antenna or capacitive stubs may be connected with the module antenna. See U.S. Pat. No. 8,474,726. In "no-man's land", a metal foil or layer (or cladding), on either side of the module tape may be segmented, as disclosed for example in US 20150269474.

The traces on a given side of the module antenna may be modified so that the turns thereof extend inward into the "no-mans land", typically to relocate an outer end of the module antenna closer to the RFID chip for connecting (such as by wire bonding) thereto. This may result in one side of the module antenna being U-shaped. See US 20150269474. See WO 2014016332 (2014 Jan. 30, Linxens Holding).

Magnetic materials may be used to increase the effective size of an RFID antenna and the concentration of magnetic flux. As used herein, "magnetic particles" may refer to particles that are conductive, having a resistance of hundreds of ohms, in contrast with ferrite particles. The materials may be performed by sintering or high pressure lamination (with or without an additional binder) into a size approximately matching the internal area of the antenna. The magnetic material may comprise ferrites or conductive non-ferrites (having a resistance of hundreds of ohms). The magnetic material may in the form of flakes of the order of a hundred microns in lateral size and a few microns in thickness. The magnetic material, once formed into a suitable shape, may be deposited or placed in the plane of the antenna or adjacent to the antenna. In addition, such magnetic material may be used in conjunction with a coupling frame whereby the magnetic is placed over some or all of the coupling frame in order to redirect magnetic flux lines and improve the performance of the transponder chip module (TCM).

Compensation Loops

Reference may be made to US 20130126622 published 23 May 2013.

A compensation loop (CL), (aka "open loop" discontinuous metal frame (DMF)), is conductive layer such as a metal layer having a gap or a break in its conductivity.

A compensation loop (CL) may be disposed behind the booster antenna. The compensation loop may have a gap, and two free ends, may comprise a conductive material such as copper, and may comprise ferrite.

Generally, a dual-interface smart card comprises a booster antenna (BA) with coupler coil (CC) in its card body (CB), and a metallized face plate (202, 302) having a window opening (220, 320) for an antenna module (AM) having a module antenna (MA). Attenuation caused by the metallized face plate may be reduced (overall performance may be improved) by one or more of making the window opening substantially larger than the antenna module (AM), providing perforations through the face plate, disposing ferrite material between the face plate and the booster antenna, modifying contact pads (CP) on the antenna module (AM), disposing a compensating loop (CL) under the booster antenna (BA), offsetting the antenna module (AM) with respect to the coupler coil (CC), arranging the booster antenna as a quasi-dipole, providing the module antenna (MA) with capacitive stubs, and disposing a ferrite element (FE) in the antenna module (AM) between the module antenna (MA) and the contact pads (CP).

FIG. 4A of US 20130126622 shows that a conductive "compensation loop" CL may be disposed (such as in Layer 5, FIG. 2) behind the booster antenna BA (Layer 3), extending around the periphery of the card body CB. The compensation loop CL may be an open loop having two free ends, and a gap ("gap") therebetween. The compensation loop CL may be made of copper cladding, can be printed on a support layer, etc.

FIG. 4B of US 20130126622 shows that the compensation loop CL may comprise ferrite material, in which case since ferrite is not an electrical conductor (in contrast with copper) the loop may be closed, having no gap and no free ends.

The compensation loop may be referred to as a "frame". The compensation frame on the reverse side of the booster antenna BA (FIG. 1) may help with the stabilization of the resonance frequency.

The compensation loop CL may be used in addition to the booster antenna BA. The booster antenna BA may be embedded into one side of an inlay substrate while the compensation frame may be inkjet printed or adhesively attached to the opposite side of the inlay substrate. The compensation loop CL can be mounted using a subtractive (etching away of material) or additive (depositing material) process.

Reference may be made to U.S. Ser. No. 14/660,941 filed 18 Mar. 2015 (US 20150269477, 24 Sep. 2015), which claimed filing date benefit from and incorporated by reference the following (which the present application also claims filing date benefit from:

61/978,187 filed 10 Apr. 2014
61/971,636 filed 28 Mar. 2014
61/955,325 filed 19 Mar. 2014

FIG. 2H of US 20150269477 shows two views (1,2)—of a metal hybrid dual-interface smartcard (MC) 200 with a metal slug component (MS-1) 220F (contrast 220D) which forms an "open loop" discontinuous metal frame (DMF) extending substantially fully, but not completely, around the perimeter of the card body (CB), with the booster antenna (BA) disposed inside the free space of the metal frame. There is a gap (G) or slit (S) 250 in the frame (MS-1), extending from an inner edge of the frame to an outer edge thereof, so it is not a "closed loop". Insulating layers (not shown), such as dielectric material or a layer of plastic may be disposed on at least one side of the metal frame, covering or filling the slit, and may comprise a dielectric medium such as an oxide layer. The frame may be covered on at least one side thereof with a layer of plastic over (and/or under) the slit (S). The slit (S) is shown at a corner of the frame (MS-1), but may be located at any suitable position along the extent of the frame, extending from an inner edge of the frame to the outer edge thereof. (See, for example, FIG. 4A where a slit extends from an opening in (or inner edge of) a slug to the outer edge thereof, at the "9 o'clock" position.) The slit may extend across a side of the frame, a corner of the frame, etc. There may also be two slits, separating the frame into two pieces.

See also FIG. 2G of the aforementioned U.S. 61/955,325 filed 19 Mar. 2014 which shows two similar front views of a dual interface smartcard with a metal frame around the perimeter of the card body and the booster antenna inside the free space of the metal frame. The card may have a "closed loop" metal frame around the perimeter of the card body and a booster antenna (BA) inside the free space of the metal frame. The metal frame would be used instead of a plug. The top view is without the booster antenna (BA), the bottom view is with the booster antenna (BA).

Coupling Frames

According to some embodiments of the invention, the booster antenna (BA) in an RFID device may be eliminated, or replaced by a "coupling frame" (CF). Generally, the overall function of both a booster antenna and a coupling frame are to enhance (improve) coupling and communication between a transponder chip module (TCM) and an external contactless reader (or with another RFID device).

As used herein, a coupling frame (CF) may generally comprise a conductive, planar surface or element (such as a conductive layer, or a conductive foil) having an outer edge, and discontinuity such as a slit (S) or a non-conductive stripe (NCS) extending from the outer edge of the conductive surface to an interior position thereof. The coupling frame may be a curved surface, rather than being planar.

Most of the coupling frames described herein may have a "continuous" surface, and may comprise a foil or sheet or layer of metal having a slit (an electrical discontinuity) for overlapping a module antenna and, in some cases having an appropriate opening (MO) for accommodating mounting the transponder chip module. Coupling frames may be printed (such as with silver nanoflakes), and may be made up of a wire grid or array (such as wire embedding wire (copper or silver) and making a physical connection through overlapping wires to create a coupling frame. The coupling frame could also be a metal mesh. Coupling frames made of mesh or wire, are exemplary of "discontinuous" surface coupling frames. Reference may be made to FIG. 6A of US 20150136858 (U.S. Pat. No. 9,390,364) which shows a smartcard (SC) having a coupling frame (CF) formed by embedding wire. In either case (continuous surface or discontinuous surface), the coupling frame comprises a "surface" or a "conductive surface", and a slit.

When referring to the overall coupling frame as being "continuous", it should be understood that the slit (S) represents a mechanical and electrical discontinuity. A "discontinuous" coupling frame could be made from a mesh, or from embedding wire in a suitable pattern in a substrate, both of which would be arranged to exhibit a slit/discontinuity.

In use, a coupling frame may be disposed closely adjacent to (in close proximity, or juxtaposed with) a transponder chip module (TCM) having a module antenna (MA) so that the slit (S) overlaps (traverses, over or under) at least a portion of the module antenna. For example, the slit (S) may extend from a position external to the module antenna, crossing over (or overlapping) at least some of the traces of the module antenna, such as extending over all of the traces on one side of the module antenna and may further extend into the interior area (no-man's land) of the module antenna.

In use, the coupling frame (CF) may be positioned so that the slit (S) overlaps or traverses at least some of the traces of the module antenna (MA) on at least one side thereof. The slit (S) may extend at least partially, including completely across only one side of the module antenna (MA), and may extend further across a central area ("no-mans land") of the module antenna (devoid of traces) to the opposite side of the module antenna. The coupling frame and the module antenna may both be substantially planar, positioned very close together, parallel with one another, and separated by an air gap or dielectric layer which may be no greater than 100 µm, 50 µm or 20 µm. Generally, the closer the coupling frame is to the module antenna (smaller separation), the better the communication (such as read/write performance) with the external contactless reader will be. With increasing separation distance, the read/write performance may degrade.

The coupling frame may enhance communication (signal, power) between an external contactless reader and the transponder chip module when the slit is positioned across (to traverse) the traces of the module antenna on at least one side thereof.

Transponder chip modules are conventionally incorporated into RFID devices which are smartcards (including plastic smartcard, metal smartcard, hybrid plastic metal smartcard). A coupling frame can be incorporated into the smartcard. Refer to US 20140361086 (U.S. Pat. No. 9,475,086) and US 20150021403 (U.S. Pat. No. 9,798,968). A coupling frame may be incorporated into the transponder chip module itself. Refer to US 20150136858 (U.S. Pat. No. 9,390,364). Transponder chip modules may be incorporated into other RFID devices, such as payment objects comprising wearable devices, smart jewelry and payment accessories.

A coupling frame may be incorporated in metal payment devices to enable contactless communication. A coupling frame may be incorporated in any RFID device having multiple transponder chip modules to selectively enable communication with a given one of the transponder chip modules. Multiple coupling frames may be incorporated into a given RFID device. A coupling frame may substitute (eliminate the need) for a booster antenna (BA) in an RFID device.

Although the frequency of operation of the transponder chip module is 13.56 MHz for RFID applications, the use of a coupling frame with slit for coupling with an inductive or capacitive device may be used at any ISM frequency band to concentrated surface current around the opening of the slit when in the presence of an electromagnetic field, and for the purpose of amplifying a signal, driving a battery or powering a passive device.

Incorporating Coupling Frames into RFID Devices

According to the invention, generally, a transponder chip module (with or without its own coupling frame) can be incorporated into an RFID device such as a smartcard or a payment object. The device may constitute a passive transponder.

- A smartcard may comprise a metal layer which is modified (typically with a slit appropriately located vis-à-vis the module antenna) to function as a coupling frame.
- An entire metal card body of a metal smartcard may be provided with a slit (S, or other discontinuity) to function as a coupling frame.
- A metal layer of a hybrid smartcard (having a dielectric layer and metal layer) may be provided with a slit (S, or other discontinuity) to function as a coupling frame.
- A card body (or layer thereof) can be made from aluminum and may be directly colored by anodizing procedures.

Payment objects may have metal surfaces or components incorporated therein, or they may be incorporated into metal objects. The metal surfaces tend to attenuate contactless communication between the payment object and an external reader. As disclosed herein, by providing a slit (or an insulating strip or stripe) in a metal component so that the component may function as a coupling frame. By incorporating a coupling frame into the device, contactless communication between the RFID chip of the transponder chip module and an external RFID reader or another RFID device may be enhanced or enabled.

The slit (S) in a coupling frame (CF) may be linear (straight), and may have a width of approximately 1-2 mm and a length of approximately 8-13 mm, but may have other dimensions and form factors. The slit (S) may be arranged to overlap (traverse) the traces of the module antenna (MA) at 90° thereto, or at another angle. The slit (S) may be other than straight.

It should be understood that the coupling frame (CF) may be on a different plane than the module antenna. The slit (S) of the coupling frame (CF) may overlap or traverse at least some outer turns (or traces) of the module antenna (MA) on one side thereof, including overlapping all of the turns of the module antenna (MA) on the one side thereof and extending into (above) the inner area (no-mans land) of the module antenna (MA). The slit may be long enough to overlap one or more turns of the module antenna on an opposite side of the module antenna. The slit may be wide enough to overlap one or more inner turns of the module antenna on one or both adjacent side(s) of the module antenna.

A transponder chip module (with or without its own coupling frame) can be incorporated into an RFID device which may be a smartcard or other payment object.

A coupling frame may be movable so as to selectively enable (enhance) or disable (suppress) communication with a transponder chip module incorporated into the RFID device. A coupling frame may be associated with two or more transponder chip modules in a single RFID device, and may be movable to selectively enable one or the other of, or neither one of the transponder chip modules.

Smartcard with Coupling Frame

US 20140361086 (U.S. Pat. No. 9,475,086) discloses a conductive coupling frame (CF) having two ends, forming an open loop, disposed surrounding and closely adjacent a transponder chip module (TCM), and substantially coplanar with an antenna structure (AS, LES) in the transponder chip module (TCM). A metal card body (MCB) having a slit (S) extending from a module opening (MO) to a periphery of the card body to function as a coupling frame (CF). The coupling frame (CF) may be thick enough to be non-transparent to RF at frequencies of interest. A switch may be provided to connect ends of the coupling frame (CF) across the slit (S). The transponder chip module (TCM) may comprise a module antenna (MA) which may be a laser-etched antenna structure (LES) and a non-perforated contact pad (CP) arrangement. The slit (S) may be filled with a resin, such as colorit. See http://www.heimerle-meule.com/en/chemicals-equipment/colorit.html.

FIG. 2A shows an example of a smartcard 200 with a coupling frame (CF) 220 incorporated into its card body (CB) 202 which has a stepped recess (R). A transponder chip module (TCM) 210 has a planar antenna (PA) which may be a laser-etched antenna structure (LES) 212. The coupling frame (CF) has an opening (MO) 208 for receiving the transponder chip module (TCM). The coupling frame (CF) may have a slit (not visible) extending from the opening (MO) to an outer edge of the coupling frame (CF). The dashed line indicates, schematically, that the coupling frame may comprise a metal layer in a stackup of a card body. An inner edge of the coupling frame (CF) may overlap (or underlie) at least some outer turns of the module antenna (MA), which may be a planar antenna (PA) which is laser-etched antenna structure (LES) in the transponder chip module (TCM). Viewed from another perspective, an outer portion of the module antenna (MA may overhang an inner portion of the coupling frame (CF). The coupling frame (CF) may enhance communication between the transponder chip module and another RFID device such as a contactless reader. The transponder chip module may be dual-interface, supporting both contactless and contact communication with external readers.

Regarding the recess (R), the opening (MO) may be stepped so that a portion of the transponder chip module (TCM) having the module antenna (MA) resides in the larger (wider) portion of the opening and extends beyond the smaller (narrower) portion of the opening, so that the module antenna (MA) extends beyond the smaller portion of the opening so that it may overlap the slit (S). A stepped opening is also shown in FIG. 2B.

FIG. 2B illustrates a transponder chip module (TCM) 210 disposed in the card body (CB) 202 of a metal smartcard (SC) 200, or metal card (MC), wherein substantially the entire card body (e.g., 760 μm thick) comprises metal, and may be referred to as a metal card body (MCB). The transponder chip module (TCM) may reside in an opening (MO) 208 extending completely through the card body, The opening may be stepped, having a larger area portion and smaller area portion, as shown. This may result in a void 203 behind the transponder chip module (TCM), and the void may be filled with non-conductive filler 204. In a conventional metal smartcard (not having a slit to function as a coupling frame), the void behind the transponder chip module may allow electromagnetic radiation from an external reader to interact with the transponder chip module.

A slit (S) 230 extends from an outer edge of the metal card body (MCB) to the opening (MO) and may overlap (underneath, as viewed) an outer portion of the module antenna (MA) 212 which may be a laser-etched antenna structure (LES). Similarly, a slit may be provided through a metal layer of a hybrid smartcard. The slit (S) modifies the metal card body (MCB) or layer, allowing it to operate as a coupling frame 220 to enhance contactless communication with the transponder chip module.

FIG. 2B is illustrative of a coupling frame 220 substantially surrounding a transponder chip module and having an opening to accommodate the transponder chip module.

Although a module opening for the transponder chip module may be shown in the illustrations of this and some other embodiments, it should be understood that many of the techniques described herein may be applicable to coupling frames having a slit, without a module opening. Such coupling frames may not be strictly coplanar with the transponder chip module, but they may be disposed closely adjacent and parallel thereto.

Alternatively, the opening (MO) may be stepped, as in FIG. 2A, without extending completely through the metal card body (MCB) and without requiring a filler 204.

Metal payment objects such as metal smartcards may feature a cavity to accommodate the transponder chip module (TCM). The cavity may not completely penetrate the payment object, or it may be covered from one face by a continuous metal. The transponder chip module may be shielded from the continuous metal layer by magnetic shielding material. This allows the cavity to be concealed. In addition the slit may be concealed by jewels or crystals.

The magnetic shielding may be in the form of a pre-laminated composite material made of beads or flakes of a magnetic material, e.g. iron-based alloy such as Sendust (a ferrite material) within a polymer matrix. Alternatively a sintered block of magnetic material may be used. Any composition of magnetic shielding material may be used so as to reduce (including prevent) attenuation of electromagnetic signal strength and/or compensate for resonance frequency shifts resulting from the metal cavity cover or cavity body.

As discussed in US 20140361086 (U.S. Pat. No. 9,475,086), a coupling frame CF is typically a planar element having a opening or cavity in its body, and a slit (or other electrical discontinuity) extending from the opening to a periphery (edge) of the coupling frame CF. The slit makes the coupling frame "open loop". Typically, the coupling frame CF is disposed closely adjacent to a transponder chip module TCM so that the slit S of the coupling frame CF extends generally perpendicular to and over (overlaps) at least a portion the module antenna MA of the transponder chip module TCM. Since the coupling frame is generally coplanar with the transponder chip module, a "central" opening MO in the coupling frame may accommodate a portion of the transponder chip module, such as the mold mass thereof, which may extend into the opening.

For example, FIG. 2C thereof (compare FIG. 2A herein) shows a transponder chip module TCM disposed in the card body CB of a smartcard SC wherein the coupling frame CF overlaps (or underlies) the laser-etched antenna structure LES in the transponder chip module TCM. Compare FIG. 2A herein.

For example, FIG. 2D thereof (compare FIG. 2B herein) shows a transponder chip module TCM disposed in the card body CB of metal smartcard SC, or metal card MC, wherein substantially the entire card body CB comprises metal, and may be referred to as a metal card body MCB.

US 20150021403 22 Jan. 2015 (U.S. Pat. No. 9,798,968) discloses a smartcard (SC) may comprise: a metal layer (ML); and an opening (MO) in the metal layer for receiving a transponder chip module (TCM); characterized by: a discontinuity comprising a slit (S) or a non-conductive stripe (NCS), in the metal layer (ML), extending from the opening to a periphery of the metal layer, whereby the metal layer (ML) comprises an open-loop coupling frame (CF) having two ends. The coupling frame may be disposed closely adjacent to the transponder chip module when the transponder chip module is disposed in the opening. A portion of the coupling frame (CF) may overlap a portion of an antenna structure (AS) in the transponder chip module (TCM). The coupling frame may extend over substantially the entire area of the smartcard. The metal layer may comprise a metal card body (MCB) of a metal smartcard. As further disclosed therein:

The slit may extend completely through the metal layer. The slit may extend only partially through the metal layer, and remaining material of the metal layer below the slit may have a thickness below a transparency threshold for the metal layer. The slit may have a width which is smaller than the opening. The slit may be at least partially filled with an electrically non-conducting material selected from the group consisting of polymer and epoxy resin, reinforced epoxy resin. A reinforcing structure (RS) disposed at a location of the slit (S) to reinforce the metal layer (ML).

When properly oriented with respect to the transponder chip module, the coupling frame may enhance communication (including power transfer) between an external contactless reader and the RFID chip (IC) of the transponder chip module. This may be due to the slit in the coupling frame forcing eddy currents in the coupling frame in one direction around the antenna structure (module antenna) of the transponder chip module, thus inducing voltage into the module antenna which provides the power delivery to the chip.

US 20150136858 (U.S. Pat. No. 9,390,364) discloses a capacitive coupling enhanced (CCE) transponder chip module (TCM) comprises an RFID chip (CM, IC), optionally contact pads (CP), a module antenna (MA), and a coupling frame (CF), all on a common substrate or module tape (MT). The coupling frame (CF, 320A) may be in the form of a ring, having an inner edge (IE), an outer edge IE, 324) and a central opening (OP), disposed closely adjacent to and surrounding a module antenna (MA) structure of the transponder chip module (TCM). A slit (S, 326) may extend from the inner edge (IE) to the outer edge (OE) of the coupling frame (CF) so that the coupling frame (CF) is "open loop". An RFID device may comprise a transponder chip module (TCM) having a module antenna (MA), a device substrate (DS), and an antenna structure (AS) disposed on the device substrate (DS) and connected with the module antenna (MA). A portion of a conductive layer (CL) remaining after etching a module antenna (MA) may be segmented to have several smaller isolated conductive structures. Refer, for example, to FIGS. 3A-L, 4A, 4B, 5A, 5B thereof.

The Opening in the Coupling Frame

It is noteworthy that, in some of the figures of prior publications discussed above, such as FIGS. 2C and 2D of US 20140361086 there is typically a sizeable opening (module opening MO, central opening CO) in the body of the coupling frame to accommodate the transponder chip module, and the slit S in the coupling frame extends from the opening to an outer edge of the coupling frame. This was driven by the form factor of smartcards and the desire to keep the coupling frame as close as possible to the module antenna. The coupling frame was typically substantially coplanar with the module antenna, and typically surrounded it.

As disclosed herein, a coupling frame CF may be a planar (or non-planar, 3D) conductive element having an outer periphery (edge) and having a slit S extending from its outer edge to an inner location on the conductive element. In an RFID device, the coupling frame may be disposed (arranged) to overlap the transponder chip module, and may be oriented (arranged) so that the slit S overlaps (traverses over, or under) the turns (traces) of the module antenna on one side thereof. As distinguished from the coupling frames disclosed for example in US 20140361086, in the coupling frames disclosed herein the inner end of the slit S need not terminate in a distinct opening sized to accommodate the transponder chip module TCM. Essentially, it is the slit rather than the opening that dictates the electrical characteristics of the coupling frame. Some of the coupling frames disclosed herein may be non-planar, including curved or tubular.

FIG. 2C illustrates a capacitively-coupling enhanced (CCE) transponder chip module 210 comprising a capacitive coupling enhanced (CCE) transponder chip module (TCM) which may be referred to as a transponder chip module with an "integrated coupling frame". Contact pads CP for a contact interface (e.g., ISO 7816) may be disposed on the top (face-up) surface of the module tape. An RFID chip (IC) and a module antenna MA 212 which may be a planar antenna PA are disposed on the bottom (face-down) side of a module tape MT. A coupling frame (CF) 220 having slit (S, not visible in this view) may be disposed on the module tape, such as on the face-up side thereof so the slit of the coupling frame may overlap at least some of the turns of the module antenna (planar antenna). In this example, the coupling frame has a opening (OP) for allowing the contact pads CP to be disposed on the same side of the tape as the coupling frame. If contact pads are not needed (e.g., for a contactless-only smartcard), the area otherwise occupied by contact pads could be occupied by more of the coupling frame, resulting for example in an entire top surface of the smartcard being covered by a layer of metal (except for the slit).

In this example, the coupling frame (CF) closely adjacent to the module antenna, although not on the exact same plane as the module antenna, and both surrounds and overlaps the module antenna.

Some Exemplary Dimensions

The following dimensions are approximate, and are presented to provide a sense of the relative scale of the various components of the transponder chip module and other elements of an RFID device which may be described herein.

A transponder chip module, including module antenna and RFIC chip—in other words, the module tape for the transponder chip module, may measure approximately 10 mm×10 mm, but may have other dimensions and form factors. For example, a transponder chip module may measure approximately 7 mm×15 mm, or 7 mm×24 mm. The module tape may be an epoxy-glass tape having a thickness of approximately 110 μm. A conductive layer (cladding or foil) on one or both sides of the module tape may have a thickness of approximately 18 μm or 30 μm.

The RFID chip may measure approximately 2.5 mm×2.5 mm, but may have other dimensions and form factors.

An etched module antenna may be disposed in a peripheral, rectangular annular area of the module tape having outer dimensions of approximately 10 mm×10 mm and inner dimensions of approximately 8 mm×8 mm, but may have other dimensions and form factors.

The traces of an etched module antenna may be formed by chemical or laser etching of a conductive layer on the module tape (or a conductive foil applied to the module tape), may have a width of approximately 100 μm, and the traces may be separated by spaces having a width of approximately 25 μm, but may have other dimensions and form factors.

A coupling frame (CF) may be generally rectangular, and measure approximately 20 mm×20 mm (having an area of approximately 400 mm$^2$), but may have other dimensions and form factors. For example, a coupling frame may measure approximately 7.5 mm×17.5 mm (131 mm$^2$) for an antenna measuring approximately 15 mm×7 mm (105 mm2). The coupling frame is generally larger than the antenna, such as twice as large or four times larger than the module antenna. The slit in the coupling frame may have a width of between approximately 1.4 mm and 2 mm, and may cover substantially all of the no-man's land at the interior of the module antenna. The slit, having traversed one side of the module antenna, may be wider than the no-man's land to overlap some inner turns of the antenna on adjacent sides of the module antenna. The slit may have an L-shape, a T-shape or other shape. The coupling frame may also be referred to as a "coupling layer" or "coupling element".

FIG. 3 illustrates the front side of a smartcard (SC) 300 which may be a metal card having a metal layer (ML), which may constitute substantially the entire thickness of the card body (CB) 302. The card body (CB) may have a module opening (MO) 308 wherein a transponder chip module (TCM) 310 may be disposed, and a slit (S) 330 extending from the module opening (MO) to the outer perimeter of the metal layer (ML) so that the metal card body (MCB) 302 may function as a coupling frame (CF) 320. The metal layer (ML) (or card body CB, or metal card body MCB) may comprise titanium, and is provided with a slit or gap in the metal to create an open loop coupling frame closely adjacent to and substantially fully surrounding the transponder chip module (TCM). The slit (S) may overlap a portion of the module antenna (MA) 312 of the transponder chip module (TCM).

In some examples and embodiments of coupling frames incorporated into RFID devices disclosed herein, there may not need to be an opening (MO) in the coupling frame (CF) for the transponder chip module (TCM).

FIG. 4 illustrates the front side of a smartcard (SC) 400 which may have a metal layer 402 modified with a slit (S) 430 to function as a coupling frame (CF) 420. The slit may extend from a perimeter of the metal layer to a position which is underneath a portion of the module antenna (MA) 312 of the transponder chip module (TCM) 410. In this embodiment, there is no module opening, a dashed line shows where the module opening would be (compare FIG. 3).

The concept of modifying a metal element to have a slit (S) to function as a coupling frame (CF) may be applied to other products which may have an antenna module (AM) or transponder chip module (TCM) integrated therewith, such as watches, wearable devices, and the like.

The slit (S) may extend completely (fully) through the metal layer (ML) forming the coupling frame (CF). The slit (S) may extend only partially through the metal layer, and remaining material of the metal layer below the slit (S) may have a thickness below a transparency threshold or skin depth for the metal layer. The slit (S) may have a width which is smaller than the opening. The slit (S) may be at least partially filled with an electrically non-conducting material selected from the group consisting of polymer and epoxy resin, reinforced epoxy resin. A reinforcing structure (RS) may be disposed at a location of the slit (S) to reinforce the metal layer (ML).

An activation distance for a transponder chip module (TCM) disposed in (or under, or above) the opening (MO) of the coupling frame may be at least 20 mm; at least 25 mm; at least 30 mm; at least 35 mm; up to 40 mm; and more than 40 mm.

FIGS. 5A,B are two views (front and back) of a metal card body (MCB) 502 having a cavity (MO) 508 which is an opening for the transponder chip module (not shown) and a slit (S) 530 extending from the cavity to an outer edge of the metal card body. A reinforcing insert 540 is shown inserted into the card body at the position of the slit S.

Reference may be made to FIG. 8 of US 20150021403 which shows a metal smartcard (SC) 800 comprising a full metal card body (CB) 802 with an opening (MO) 808 for a transponder chip module (TCM, not shown) and a slit (S) 830 extending from the opening (MO) to a periphery of the card body (CB) to allow the flux lines to propagate around the area of the transponder chip module (TCM). The full metal card body (CB) may be formed of an electrically conductive material, such as titanium, may have a thickness of 760 μm, and may act a coupling frame (CF) for capacitive and inductive coupling with a contactless reader or point of sale terminal. The card body (CB) may comprise conductive nanoparticles.

To reinforce the card body (CB) (or metal layer (ML)) having a slit (S), a reinforcing insert (or structure or plate), of a non-conductive material such as plastic or reinforced plastic, may be disposed at (including around and covering) the location (area) of the slit (S) in a recess (R, not shown) on the underside of the card body (CB), and may extend beyond the slit. For example, the slit (S) may be 50 μm wide, the reinforcing structure may be up to or more than 8000 μm wide (approximately the size of a side of the TCM). The reinforcing structure (RS) may have a logo or design. The thickness of the reinforcing structure (and corresponding depth of the recess R on the underside of the card body CB) may be 350 μm. The opening (MO) may extend completely through the card body (CB) and the transponder chip module (TCM) may extend through the opening (MO) to the underside of the card body (CB) to allow the propagation of the electromagnetic flux lines.

Cavity with Struts

Normally, the cavity or opening in a metal card body MCB extends completely through the card body, so that an antenna module AM or a transponder chip module TCM inserted into the cavity/opening can interact contactlessly (via RF) with an external reader. Having an insert to reinforce the card body at the position of the slit S is discussed above. A metal card body may have a thickness of approximately 800 μm (0.8 mm).

A metal card body (MCB) which has been modified to perform as a coupling frame (CF) may have a slit (S) that extends not only to an area (recess R or cavity MO) for the transponder chip module (TCM), but which extends further across the area for the transponder chip module.

A partial milled or etched cavity may be used to accommodate the transponder chip module (TCM), as per a normal (plastic) smartcard. The slit (S) would extend through the entire card body (MCB), providing the discontinuity in the coupling frame (CF). The use of a slit (S) through the card body rather than a fully penetrating cavity (module opening) at the transponder chip module (TCM) in a metal card may increase the mechanical strength/integrity of the metal card.

FIG. 5C shows a metal card body (MCB) 502 having a cavity (MO) 508, but rather than the cavity being entirely open at the bottom of the card body, portions of the metal card body which may be referred to as struts 504 may be left in place, spanning the cavity, to reinforce the card body. The struts 504 may be disposed perpendicular to the slit (S).

Stacked and Overlapping Coupling Frames

FIG. 6 shows having two coupling frames (CF-1) 620A and (CF-2) 620B disposed such that their slits (S1) 630A and (S2) 630B are oriented in different directions from one another. Here they are shown oriented 180° apart from one another. The two coupling frames may be stacked, one atop the other, but with an insulating layer or film (not shown) disposed therebetween, such as an adhesive. (The insulating layer prevents the slit in a given one of the coupling frames from being shorted out by the other coupling frame.) The module openings (MO) of the two coupling frames may be aligned with one another to accept the antenna module (AM). When overlapped, the slits do not line up with one another. Coupling frames stacked in this manner and incorporated into an RFID device may not need a module opening.

If two coupling frames were stacked, one atop the other, with their slits aligned, the one coupling frame would not short out the slit in the other coupling frame, and it may not be necessary to have an insulating layer disposed therebetween. The coupling frame shown here has a module opening MO, but the techniques disclosed herein are not limited to coupling frames having module openings, they may simply have a slit.

This concept of having two coupling frames stacked one atop another may be applied to wearable devices. For example, a slit in a watch back may enable the watch back to function as a coupling frame, and a slit in the watch housing may enable the watch housing to also function as a coupling frame. The slits may be aligned with one another.

Two or more coupling frames may be connected together. They may be co-planar with one another, or stacked on top of each other. If desired, an electrical connection between coupling frames may be made in any suitable manner. (In some cases, such as stacked coupling frames, the coupling frames may be separated by a dielectric material). Electrically connecting or otherwise combining multiple coupling frames may be used to tune the resonant frequency of the combined transponder chip module/coupling frame "system" by up to the order of a few megahertz and improve the overall communication performance of the device.

Magnetic materials may be used in conjunction with coupling frames. The magnetic material may be laminated over the entire coupling frame, or localized near the transponder chip module (TCM) (or antenna module (AM)), such as in an area proximal with the module antenna (MA).

Magnetic or conductive flakes may be used to form a coupling frame. The flakes may have a cross-dimension (such as diameter) of approximately 20-500 µm, and a thickness of a few microns. The flakes may be bound inside a polymer resin, and laminated to a suitable carrier substrate which may be an existing coupling frame or a module tape (MT) substrate for the antenna module (AM). Sintering may be performed. The flakes may comprise a conductive, yet highly resistive material.

FIGS. 7A,B,C show that a first coupling frame (CF-1) 720A may be overlapped with a second coupling frame (CF-2) 720B and still function with a transponder chip module (TCM). The coupling frames may be in contact (physically) and separated by a dielectric. The slits (S1) 730A and (S2) 730B of the coupling frames may be disposed in different directions, as shown. The coupling frames 720A and 720B may have an insulating layer (such as adhesive) between them. The module openings MO of the coupling frames should be overlapping with each other. The use of more than one coupling frame allows the slits to be concealed by having the slits at different positions on each coupling frame, when viewed in plan view there is no continuous slit penetrating the stack of coupling frames. If the two coupling frames were not separated by dielectric, each coupling frame could short out the slit in the other coupling frame, rendering both coupling frames ineffective for improving communication between the transponder chip module and an external reader.

A given layer (or one of the coupling frames) may have a slit extending from its outer edge and extending inward to overlap the module antenna, but may not need an opening for the module itself. (The module may sit atop or beneath the layer with slit) some examples of coupling frames having slits, but no module openings, may be presented herein.

Connected Coupling Frames ("Composite Coupling Frame")

Coupling frames rely, generally, on the "slit", which represents an electrical discontinuity. Two or more coupling frames, which may be metal components of payment objects such as bracelets or phones, may be stacked, one atop the other, so that their slits are aligned in the same or in different directions.

One or more coupling frames may be connected together, they may be co-planar or stacked on top of each other and separated by dielectric material. The connection(s) may link any part of the coupling frames. The connection(s) may be made from regions adjacent the slit on one coupling frame to similar regions on the second or subsequent coupling frame. Electrically connecting multiple coupling frames in this manner may be used to tune the resonant frequency of the TCM/CF system by up to the order of a few megahertz and improve the overall communication performance of the device.

FIG. 8 is an exploded perspective view showing a first coupling frame (CF-1) 820A having two opposing end portions A & C separated by a slit (S1) 830A and a second coupling frame (CF-2) 820B having two opposing end portions B & D separated by a slit (S2) 830B. The slits S1 and S2 may be aligned with one another. Alternatively, the slits S1 and S2 may not be aligned with one another. The end portions A and B may be aligned with one another. The end portions C and D may be aligned with one another. The end portions of one coupling frame may be connected with the end portions of another coupling frame, in various combinations. The metal region to each side of the slit on two co-planar or overlapping coupling frames may be denoted by the letters A, B, C and D. Various connection options may be . . .

A connected with D, B connected with C (as illustrated).
A connected with D, B and D not connected
B connected with C, A and D not connected
A connected with B, C connected with D
A connected with B, C and D not connected
C connected with D, A and B not connected The connection may be any form of electrical connection including soldered wire, plated through hole, wire bond, conductive adhesive, crimp, ribbon wire, etc. The use of different connection configurations may yield different resonant frequency values when the "composite" coupling frame (2 or more connected coupling frames) is paired with a suitable TCM. The use of multiple coupling frames can be used to increase communication performance of the device by tuning and/or by increasing the effective size of the coupling frame by electrically linking individual coupling frames that are spatially separated. This may be particularly relevant in the case of payment objects such as payment bracelets.

In FIG. 8, module openings MO-1 and MO-2 are shown at the ends of the slits S-1 and S-2 in the two coupling frames CF-1, CF-2, respectively, for receiving a transponder chip module (not shown). It should be understood that the slits S-1 and S-2 need not terminate in module openings, in many of the embodiments disclosed herein, a opening for the module is not required. The important thing is that the slit(s) are positioned to overlap the module antenna of the transponder chip module. The techniques disclosed herein may be applicable to coupling frames having slits, without module openings, and disposed so that the slit of a coupling frame overlaps at least a portion (such as one side of) a module antenna (such as a rectangular spiral planar etched antenna structure).

A Card Body Construction

FIG. 9 shows a card body construction for a smartcard (SC). Typically, a metal card body would have an opening on the rear (back side) of the card body to allow contactless communication with a transponder chip module inside of the metal card. (The back side opening may also accommodate the size of the mold mass on the transponder chip module.) A dual-interface module would have contact pads on the front side, also blocking contactless communication with the chip module.

In this construction, there is a conventional recess (opening) extending into the front side of the card to accommodate a dual-interface transponder chip module (TCM), with its the contact pads exposed. The card body construction may be layered, as follows:
- a first (top) metal layer, having a thickness of approximately 300 μm, and having an opening for receiving the transponder chip module and a slit 930A extending from the opening to an outer edge of the layer, so that the layer may function as a coupling frame 920A. The slit may extend entirely across no-man's land, and its width may be approximately equal to the width (or transverse height) of no-man's land;
- a layer of adhesive, having a thickness of approximately 20 μm;
- a second (middle) metal layer having a thickness of approximately 100 μm. The second metal layer may have an opening for the mold mass of the transponder chip module and a slit 930B extending from the opening to an outer edge of the layer, so that the layer may function as a coupling frame 930B. The module antenna of the chip module may reside on this layer, so that the slit overlaps the module antenna outside of the opening.
- a layer of adhesive, having a thickness of approximately 20 μm;
- a third (bottom) metal having a thickness of approximately 320 μm. The third metal layer may have a slit 930C extending from an interior position of the layer to the outer edge of the layer so that the layer may function as a coupling frame 920C. This layer does not need an opening for the chip module or mold mass. The slit overlaps (underlies) the module antenna.

Alternatively, this card body construction could be produced having only two layers of metal or even one layer of metal. The layers can be separated electrically by an adhesive or the layers can be welded together to form a homogenous conductive layer.

In an electromagnetic field generated by a point of sale terminal, the surface current around the slit may provide the power delivery to the chip by coupling the energy to the overlapping module antenna of the transponder chip module. The coupling may be a combination of capacitive and inductive coupling, i.e. reactive coupling.

TCM with Overlap Control

The antenna of the TCM may be formed by laser or chemical etching of one or more metal foils on a dielectric substrate such as glass epoxy or polyimide, for example. One or both sides of the TCM antenna substrate may feature a coupling frame with a slit and/or cavity designed to maximize coupling between the coupling frame CF and the module antenna MA. A coupling frame may be used in similar manner from a separate substrate to the antenna. When implanted into a payment object such as a metal bracelet, one or more of the coupling frames thus mentioned may themselves capacitively couple to the payment object provided a suitable slit and/or cavity is located in the payment object. In addition, the coupling frame on the antenna or other substrate may be directly electrically connected across the slit on the payment object. The coupling frame in the TCM may be connected with the coupling frame of the payment object, or there may dielectric material between the two coupling frames.

An advantage of having a coupling frame in the TCM itself is that tolerances may be better controlled, particularly with regard to the spacing between the module antenna and the coupling frame of the TCM. Overlap of the coupling frame in the TCM and the module antenna MA may be precisely controlled. Compare FIG. 2D.

FIGS. 10A, 10B show a transponder chip module (TCM) 1010 having a module antenna (MA) 1012 which may be disposed on one side (such as the front side) of a module tape (MT) 1011 and which may be elongated along an axis corresponding to the circumference of a bracelet-type payment object. A coupling frame (CF) 1020 may be formed on the opposite side (such as the rear side) of the module tape MT. The slit (S) 1030 in the coupling frame may be aligned (such as parallel) with the circumferential portion of a (L-shaped) slit in the wristband of a bracelet-type payment object (for example).

Moveable Coupling Frames

FIG. 11A is an exploded view of a coupling frame (CF) 1132 disposed over a transponder chip module (TCM) 1110, oriented so that the slit (S) 1130 overlaps the turns of the module antenna (MA) 1112 on one side.

FIG. 11B is a plan view of the coupling frame (CF) 1120 disposed over the transponder chip module (TCM) 1110, with the coupling frame oriented (aligned) oriented so that the slit (S) 1130 overlaps the turns of the module antenna (MA) 1112 on one side thereof to enhance (allow) communication between the transponder chip module (TCM) and an external contactless reader (not shown).

FIG. 11C is a plan view of the coupling frame (CF) disposed over the transponder chip module (TCM), with the coupling frame oriented (displaced) so that the slit (S) does NOT overlap the turns of the module antenna (MA) to attenuate (block, suppress) communication between the transponder chip module (TCM) and an external contactless reader (not shown).

The coupling frame (CF) 1120 comprises a generally planar, electrically-conductive element having a slit (S) 1130 extending from an outer edge (periphery) thereof to a location within an inner area of the coupling frame, and may be oriented so that the slit overlaps the module antenna (MA) 1112 of a transponder chip module (TCM) 1110.

The transponder chip module TCM has an RFID chip (IC) 1108 disposed on a substrate which is a module tape (MT) 1111 The module antenna (MA) 1112 may also be disposed on the module tape (MT), on the same side as or on the opposite side from the RFID chip (IC) 1108. The module antenna may generally be in the form of a rectangular spiral having a number (such as 10-15) traces separated by spaces disposed in a track extending around a peripheral area (all four sides) of the module tape. The antenna traces would comprise an inner trace, an outer trace, and several traces therebetween. An inner (central) area of the module tape may be free of antenna traces.

FIG. 11B shows the coupling frame (CF) aligned over the transponder chip module (TCM so that the slit (S) extends over (traverses, overlaps) a set of traces of the module antenna (MA) on one of the four sides of the module tape, from beyond an outermost one of the traces, past an innermost one of the traces, to the central area (no-mans land). With the coupling frame (CF) in this position, the communication (and power) link between the external contactless reader and the RFID chip may be enhanced, or enabled.

FIG. 11C shows the coupling frame (CF) aligned over the transponder chip module so that the slit (S) does not extend over (traverse, overlap) any of the traces of the module antenna (MA). With the coupling frame (CF) in this position, the communication (and power) link between the external contactless reader and the RFID chip may be deteriorated, or blocked or disabled.

The arrow in FIG. 11C indicates that the coupling frame (CF) may be displaced (slid, toggled, moved) from the enhanced/enabled position (FIG. 11B) to the suppressed/disabled position (FIG. 11C) by sliding the coupling frame with respect to the transponder chip module (TCM), or vice-versa.

The coupling frame (CF) and transponder chip module (TCM) may each be disposed in a separate component of a payment object. One of the components of the payment object may be modified to function as a coupling frame.

FIGS. 11B and 11C are exemplary of the ability of a user to selectively enhance or suppress (including enable or disable) communication between the transponder chip module and the external reader, such as by sliding the coupling frame (or a component of a payment object carrying or functioning as the coupling frame) with respect to the transponder chip module (or a component of the payment object carrying the transponder chip module).

Visual indications may be provided to the user to indicate whether the payment device is enabled or disabled. For example, with reference to FIGS. 11B and 11C, in the enabled position (11B) the transponder chip module may (TCM) be visible to the user through the slit, and may be colored green (for example). In the disabled position (11C), the transponder chip module (TCM) is not visible through the slit the user may see another color such as red.

Colors, or other visual indicia may be incorporated into a payment object, and revealed at different positions of a moveable coupling frame (for example) to indicate whether the coupling frame is positioned to enable communication with an external reader, or is positioned to disable communication with the external reader.

Figure 11E:
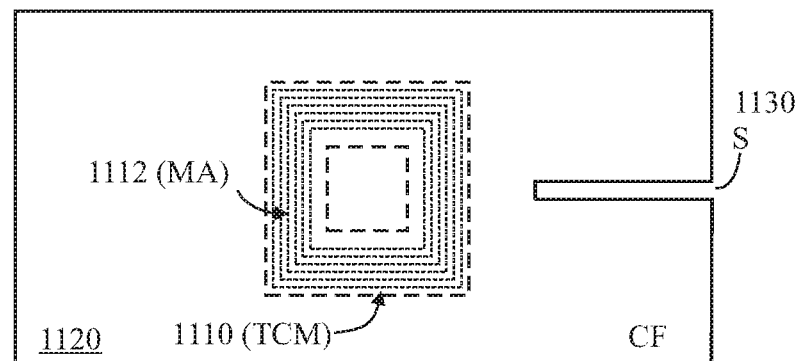

FIGS. 11D,E illustrate another example of displacing the coupling frame (CF) 1120 with respect to the transponder chip module (TCM) 1110 to selectively enable/disable communication between the RFID device (payment object) and an external contactless reader (or other RFID device). In this variation, the coupling frame (or component of a payment object carrying or functioning as the coupling frame) may be in a first position (FIG. 11D) with the slit traversing the traces of the module antenna MA to enable communication, and may be flipped (or toggled) over to a second position (FIG. 11E) so that the slit (S) 1130 of the coupling frame does not traverse the traces of the module antenna, to disable (inhibit) communication. Alternatively, the payment object component comprising the coupling frame may be stationary, and the transponder chip module may be carried by a component that flips over and positions the transponder chip module with its antenna selectively over or not over the slit in the coupling frame to respectively enable or disable communications.

An Elongated Form Factor

FIG. 12 shows a coupling frame (CF) 1220 superposed over a module antenna (MA) 1212 of a transponder chip module (TCM) 1210. The overlap of the slit (S) 1230 of the coupling frame with at least a portion of the module antenna is very clearly illustrated and demonstrated in this figure.

In this example, the module antenna MA may have an elongated form factor (much longer than it is high), having an overall height of approximately 5 mm and an overall length of approximately 20 mm. An overall area covered by the antenna (including no-man's land) may be 5 mm×20 mm=100 mm². The RFID chip (IC) is omitted from the view, for illustrative clarity.

The interior area (no-man's land) of the module antenna MA may be elongated—i.e. narrow (5-8 mm) and long (20-25 mm). The slit (S) of the coupling frame (CF) is shown extending over one set of traces (for example, 10-16 traces) of the module antenna (on the left side thereof, as viewed), and into the no-man's land, covering substantially the entire area of the no-man's land. The slit (S) may be wide enough to also cover some inner traces on the top and bottom (as viewed) of the module antenna (MA). In other words, in the central area of the module antenna, the slit may be slightly larger than the non-man's land. The slit in the coupling frame may extend completely over the traces on one side (left, as viewed) of the module antenna, then continue into and across the non-man's land, and may overlap the innermost trace of each of the sets of traces on the other three sides (top, bottom and right, as viewed) of the module antenna. The slit (S) may extend along the center of the module antenna, extending from one edge of the module antenna (bottom) to an inner track on the opposite side (top). The module antenna may have 10 to 16 laser-etched conductive lines.

The coupling frame CF may be larger than the module antenna MA, for example having a length of at least approximately 30 mm and a height of at least approximately 20 mm. An overall area covered by the coupling frame may be 30 mm×20 mm=600 mm². The coupling frame may be at least twice as large (in overall area) as the module antenna, including at least three times as large, at least five times as large, and at least ten times as large as the module antenna.

As illustrated, the slit S of the coupling frame extends across the first set of antenna traces on the left (as viewed) side of the module antenna, continuing through the central area (no-mans land) of the module antenna which has no traces to the set of traces on the opposite, right (as viewed) side of the module antenna. The end of the slit may overlap one or more of the innermost traces of the set of traces on the right side of the module antenna.

The slit (S) may have a width corresponding to the vertical (as viewed in the figure) interior width of the antenna (the height of non-man's land), or the distance between the innermost trace of the top (as viewed) set of traces and the innermost trace of the bottom (as viewed) set of traces. In other words, the slit may cover at least a substantial portion of the entire central area of the antenna, including at least 50%, at least 60%, at least 90%, and at least 100% (the slit may be larger than the no-man's land) thereof. The slit may extend (to the right) past the central area devoid of traces (no man's land) further across some or all of the traces on the right side of the antenna.

For optimum performance, the slit (S) in the coupling frame may need to overlap or run adjacent to the inner traces of the module antenna (MA). In this case the slit (S) would traverse over one set of traces of the module antenna (MA) and run parallel to two sides of the module antenna (MA). This can be accomplished by widening the slit or by narrowing the height of the void central area of the antenna. FIG. 12 shows the slit running along or adjacent the inner tracks of the module antenna.

FIGS. 13A,B show an example of a single coupling frame (CF) 1320 disposed over a single transponder chip module (TCM) 1310. These figures clearly show that the coupling frame (CF) may be much larger (in area) than the transponder chip module (TCM). And, in this example, the coupling frame is circular (disc-like). In this variation, the coupling frame (or component of a payment object carrying or functioning as the coupling frame) may be in a first position (FIG. 13A) with the slit (S) 1330 traversing (overlapping) the traces of the module antenna (MA) 1312 to enable communication, and may be rotated to a second position (FIG. 13B) so that the slit (S) does not traverse the traces of the module antenna to disable communication.

FIGS. 14A,B show an example of a single coupling frame (CF) 1420 having a slit (S) 1430 disposed over two transponder chip modules (TCM-1 and TCM-2) 1410A and 1410B. In this example, the coupling frame (CF) is circular (disc-like), similar to what was shown in FIG. 13. In this example, the transponder chip modules TCM-1 and TCM-2 may be disposed in a circular (disc-like) carrier (component of a payment object) 180° apart from one another. The concept disclosed herein may be extended to more than two transponder chip module disposed at different positions within a component of the payment object.

In this variation, the coupling frame (or component of a payment object carrying or functioning as the coupling frame) may be in a first position (FIG. 14A) with the slit (S) 1430 of the coupling frame (CF) 1420 traversing a portion of the module antenna (MA-1) 1412A of the first transponder chip module TCM-1 to enable communication between the first transponder chip module (TCM-1) 1410A and an external reader, and in this position the slit (S) 1430 does not traverse the traces of the module antenna (MA-2) 1412B of the second transponder chip module (TCM-2) 1410B so as to inhibit (disable) communication between the second transponder chip module TCM-2 and the external reader.

Figure 14B:
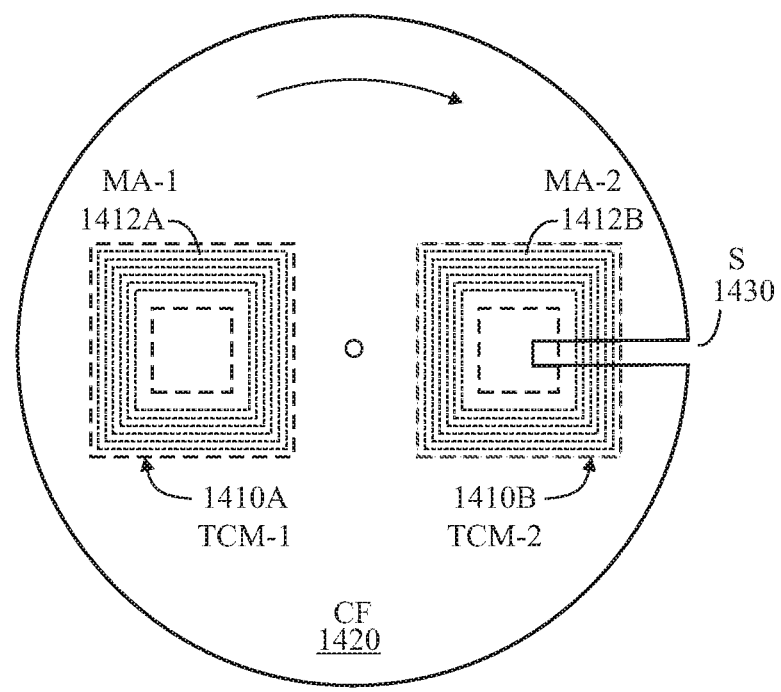

The coupling frame CF may be rotated to a second position (FIG. 14B) so that the slit S of the coupling frame CF traverses a portion of the module antenna MA-2 of the second transponder chip module TCM-2 to enable communication between the second transponder chip module TCM-2 and an external reader, and in this position the slit S does not traverse the module antenna MA-1 of the first transponder chip module TCM-1 so as to inhibit (disable, suppress) communication between the first transponder chip module TCM-1 and the external reader.

Laminated Metal Layer Card Constructions with Multiple Offset Slits

FIG. 15A shows a typical arrangement of a metal layer (ML) 1520 (or metal card body MCB) of a smartcard 1500A having a slit (S) 1530 extending from an outer (left, as viewed) edge to an opening (MO) 1508 for a transponder chip module (TCM, not shown). As discussed herein, the metal layer may not have an opening for the transponder chip module (TCM), and the slit (S) should extend over (overlap) a portion (such as one side of) the module antenna (MA, not shown) of the transponder chip module (TCM). The slit (S) is shown extending from the left (as viewed) side of the smartcard to the position of (or opening for) the transponder chip module (TCM). The slit (S) may have a width (vertical dimension in the figure) of approximately 50 μm, and may be positioned approximately halfway up (vertically) the transponder chip module (or opening therefore). The metal layer (ML) may be approximately the same overalls size as the smartcard (SC). The slit (S) enables the metal layer (ML) to function as a coupling frame (CF). The slit (S) represents a mechanical weakness, and may lead to problems when the card is repeatedly flexed.

FIG. 15B is a diagram showing, schematically, an arrangement where there may be two or more metal layers in a smartcard (or comparable RFID device), each layer having a slit extending from an outer edge to an opening for (or position of) a transponder chip module (TCM). In this illustration, the module antenna (MA) is indicated by dashed lines. The transponder chip module (TCM) may measure 11.8 mm high (vertical, as viewed)×13.0 mm wide (horizontal, as viewed).

A first slit S1 may be disposed in a first metal layer (ML1) of the smartcard, extending from the left (as viewed) edge thereof to the position of the transponder chip module (TCM), overlapping the left (as viewed) side of the module antenna (MA). The slit S1 may have a width of approximately 50 μm, and may be positioned towards the top of the transponder chip module (TCM), such as approximately 4.5 mm above a centerline (CL) of the transponder chip module (TCM). The slit S1 may be straight, curved, or angled.

A second slit S2 may be disposed in a second metal layer (ML2) of the smartcard, extending from the left (as viewed) edge thereof to the position of the transponder chip module (TCM), overlapping the left (as viewed) side of the module antenna (MA). The slit S2 may have a width of approximately 50 μm, and may be positioned towards the bottom of the transponder chip module (TCM), such as approximately 4.5 mm below a centerline (CL) of the transponder chip module (TCM). The slit S2 may be straight, curved, or angled. The slits S1 and S2 both extend from the position of the transponder chip module to the left edge of the card, but are offset from one another.

If the first metal layer (ML1) is a top layer of the smartcard (or other device), and the first slit may be visible to a user, a "fake" slit, or trench that does not extend completely through the metal layer (ML1) may be provided at the position of the second slit (S2) for aesthetic purposes. The trench may extend, for example only approximately 5-100 μm into a first (top) metal layer (ML1) that has a thickness of approximately 200-300 μm.

FIG. 15B also shows a third slit S3, which may be disposed in a third metal layer (ML3) of the smartcard, extending from the bottom (as viewed) edge thereof to the position of the transponder chip module (TCM), overlapping the bottom (as viewed) side of the module antenna (MA). The slit S3 may have a width of approximately 50 μm. The slit S3 may be straight, curved, or angled.

Other locations for slits in metal layers are possible, such as extending over the right (as viewed) or top (as viewed) sides of the module antenna (MA) from an outer edge of a metal layer, to function as a coupling frame (CF). The third metal layer (ML3) may be disposed between the first metal layer (ML1) and the second metal layer (ML2). Its slit (S3) may not be visible from either the front or back of the card.

The slits S1, S2 and S3 all overlap a portion of the module antenna (MA) 1514, so that the metal layers M1, M2 and M3 may function as coupling frames. When these metal layers are laminated together, there is a non-conductive adhesive therebetween so that the slits do not become electrically shorted out. In subsequent descriptions of laminated card bodies, the second metal layer may be between the first and third metal layers.

In this and in other embodiments, a metal layer or metal card body may have a slit in order to function as a coupling frame. In the case of another metal layer, or a metal backing insert, or the like, which is fixed to the metal layer or metal card body, and which spans the slit, a non-conductive adhesive therebetween prevents the additional metal layer or metal backing insert from shorting the slit. A metal backing insert may have a slit so that it also functions as a coupling frame.

An RFID device such as a smartcard or key fob may comprise multiple metal layers, each layer having a slit or discontinuity extending from an outer edge thereof to a position corresponding to the location of a transponder chip module which may be an opening for accepting the transponder chip module, wherein the slit in each layer overlaps a module antenna of the transponder chip module and is located in a different position or orientation than the other slits so that the slits of the various layers are not aligned with one another. A front metal layer may be continuous, not having a slit or discontinuity, and may be shielded from the other metal layers by a shielding layer.

Some Embodiments

Some embodiments of RFID devices having metal layers with slits to function as coupling frames to enhance contactless modes of operation are discussed herein. These embodiments may be shown having dual-interface (an array of contact pads for contact mode of operation, in addition to module antenna and coupling frame for contactless mode), but generally the contact mode (and contact pads) may not form part of the invention, per se.

Metal Laminated Card

FIG. 16A is a diagrammatic view of a metal laminated smartcard (RFID device) 1600A, generally comprising (from top-to-bottom, as viewed):

- an 8 pin transponder chip module (TCM) 1610
- a first, top (front) metal layer (ML1) 1620A which may have a thickness of approximately 300 μm or 320 μm. A slit (S1) 1630A is shown extending from the left edge of the card to an opening (MO) 1608A for the transponder chip module (TCM). The front layer may comprise titanium.
- a layer of non-conductive adhesive 1622 which may have a thickness of approximately 20 μm (if the front layer is 320 μm). A thicker layer (40 μm) or two 20 μm layers of adhesive may be used if the front layer is 300 μm).
- a second, middle (inter-) metal layer (ML2) 1620B which may have a thickness of approximately 200 μm. A slit (S2) 1630B is shown extending from the bottom edge of the card to an opening (MO) 1608B for the transponder chip module (TCM). The inter-layer may comprise titanium.
- a layer of non-conductive adhesive 1624 which may have a thickness of approximately 20 μm
- a third, bottom metal layer (ML3) 1620C which may have a thickness of approximately 200 μm. A slit (S3) 1630C is shown extending from the left edge of the card to the opening for the transponder chip module (TCM). The bottom layer may comprise titanium.
- a module cover (MC) 1616 which may comprise a non-conductive material such as ceramic having a thickness of approximately 200 μm may be inserted into the opening in the bottom metal layer (ML3).

The bottom metal layer ML3 may not have an opening MO, but rather may simply have a position defined for the transponder chip module, and the slit S3 may extend into the position to overlap the module antenna. The cover (MC) may not be required.

FIG. 16A, and some other figures, are illustrative of a "stackup" of at least two metal layers having slits, in a smartcard construction. Generally, the slits of the metal layers are deployed in different positions or orientations from one another so that the slits are not aligned with one another and so that, consequently, an area without a slit of one layer may support or reinforce the slit (or slit area) of an another, such as adjacent, layer.

Slits Front and Back

The slits on the front and back sides may have a width of approximately 50 micron. The slits may be narrower, down to 25 approximately micron or below by use of laser cutting. By defining a narrow slit, the slit may remain open (unfilled) and become discreet. In addition, depending on the material used as a coupling frame within laminated metal card, the slit may have different widths on each side the coupling frame. This is due to the nature of laser cutting of the material whereby a taper may be formed. The face of the coupling frame incident to the laser beam will normally develop a wider slit relative the exit face, therefore the slit may have a tapered cross sectional profile. The slits S1 and S2 both extend from the position of the transponder chip module to the left edge of the card, but are offset from one another.

Preventing Shorting of the Slits

Use of extremely narrow slits may present technical problems with electrical shorting of the slit by debris from the laser process, this may define a minimum width of slit for a given thickness of metal in a laminated metal card (e.g. minimum slit width of 50 micron for a 300 micron thick metal coupling frame). An additional consideration is electrical shorting of the slit during use of the card.

In order to prevent electrical shorting of the slit, the coupling frame may be coated in a non-conductive material. This coating may also cover the exposed surfaces of the slit and thereby prevent electrical shorting by materials or fluids that may ingress into the slit. For example a diamond-like-carbon (DLC) coating that is electrically insulating may be applied to a thickness in the range 1-10 micron as a decorative surface finish. The applied coating may also be selected/designed to reduce the overall width of the slit. For example a slit of 25 micron width with overall 4 micron DLC coating may be reduced in width to approximately 17 micron after coating.

Shielded Laminated Smartcard

FIG. 16B shows a shielded, laminated metal laminated shielded card (SC) 1600B having two coupling frame metal layers and a front face (ML1) which is a continuous metal layer (no slit). Some of the metal layers are the same (or similar) to those shown in the construction of FIG. 16A. Notably different, however, is that the top metal layer (ML1) does not have a slit (there is no "S1" in this embodiment). The second metal layer (ML2) has a slit (S2), and the third metal layer (ML3) has a slit (S3), as in the construction of FIG. 16A, and the various layers may be held together (laminated) with layers of adhesive, as shown. The dimensions of the various layers may be similar to those in the construction of FIG. 16A.

The front face (ML1) 1620A, as shown, does not have a slit, and may interact with the reader electromagnetic field and produce induced eddy currents within its body. These eddy currents will normally produce a counter-field resulting in reduction or blocking of the communication between the transponder chip module and reader. To offset this, a shielding layer (SL) 1640 of suitably chosen magnetic material may be placed between the front continuous metal layer and the coupling frame layers (ML2, ML3) of the card. A layer of adhesive 1622 having a thickness of 20 μm may be disposed between the front metal layer ML1 and the shielding layer SL. A layer of adhesive 1623 having a thickness of 20 μm may be disposed between the shielding layer SL and the second metal layer ML2.

The front metal layer (ML1) may have a thickness of 200 µm, rather than 300 µm (or 320 µm) as in the construction of FIG. 16A. The shielding layer (SL) may have a thickness of approximately 50-200 µm, such as 100 µm (which was gained by making the front layer thinner than in the construction of FIG. 16A). In this manner the coupling frames will be shielded from the attenuating front metal layer and continue to function in conjunction with the transponder chip module (TCM).

The front metal layer (ML1) may be continuous, not having a slit or discontinuity, and is shielded from the other at least two metal layers (ML2, ML3) by a shielding layer (SL).

Other elements of the FIG. 16B embodiment, such as the second metal layer ML2 and third metal layer ML3 may be substantially similar or identical to corresponding (similarly numbered) elements in the embodiment of FIG. 16A. Generally, the top metal layer ML1 of FIG. 16A is replaced by a metal layer ML1 without a slit and a shielding layer SL.

The module antenna (MA) of the transponder chip module (TCM) may reside in a plane that lies below the continuous front metal layer (ML1). The module antenna (MA) may be surrounded on all edges (sides) by magnetic shielding material (not shown) to reduce the attenuation from eddy currents in the front metal layer (ML1). In this manner the performance of the magnetic shielding material may be maximized and the coupling of the transponder chip module (TCM) with the coupling frame layers (ML2, ML3) may be improved Key Fob FIG. 17 is a diagrammatic view of a key fob laminated card (RFID device), generally comprising (from top-to-bottom, as viewed):

- an 8 pin transponder chip module (TCM) 1710
- a first, top (front) metal layer (ML1) 1720A which may have a thickness of approximately 300 µm. A slit (S1) 1730A is shown extending from the bottom edge of the card to an opening for the transponder chip module (TCM). The slit S1 may have an enlarged portion (opening) so that a corresponding portion of an underlying layer may be visible to a user.
- a layer of adhesive 1722 which may have a thickness of approximately 20 µm which may have an opening aligned with the enlarged portion (opening) of the slit S1 in the top metal layer (M1).
- a second, middle (inter-) metal layer (ML2) 1720B which may have a thickness of approximately 400 µm. A slit S2 1730B is shown extending from the right edge of the card to the opening for the transponder chip module (TCM). This layer may be anodized aluminum, a portion of which may be visible through the openings in the overlying adhesive layer and top metal layer (ML1). The metal layer 1720B has an opening 1708B for accepting the transponder chip module TCM.
- a layer of adhesive 1724 which may have a thickness of approximately 20 µm
- a third, bottom metal layer (ML3) 1720C which may have a thickness of approximately 300 µm. A slit S3 1730C is shown extending from the top edge of the card to the opening for the transponder chip module (TCM). The slit S3 may have an enlarged portion (opening) so that a corresponding portion of the overlying second anodized metal layer (ML2) may be visible to a user (through a corresponding opening in the intervening adhesive layer). The metal layer 1720C has an opening 1708C for accepting the transponder chip module TCM.
- a module cover (MC) 1716 which may comprise ceramic having a thickness of approximately 300 µm may be inserted into the opening in the bottom metal layer (ML3).

The enlarged portions of the slits S1 and S3 in the top and bottom metal layers ML1 and ML3 allow for corresponding portions of top and bottom surfaces of the metal inter-layer ML2 to be seen (visible to a user). The metal layer ML2 may be colored, and may be engraved (such as laser engraving), through the enlarged openings, with a logo or some security feature(s). Similar features (enlarged openings allowing underlying layers to be seen) may be applied to smartcards. The enlarged openings may be filled with a non-conductive material (so as not to short out the slits), including transparent materials.

Smartcard with Metal Body

A metal layer or card body may be provided with a slit (or a slit in each metal layer) to that the layer or card body acts as a coupling frame. The coupling frame may be characterized as the primary of a transformer, and the module antenna in the transponder chip module acting as the secondary of the transformer.

A laminated card has a distinct advantage over a solid metal card in that the metal layers can be of different materials, and the weight of the card can be optimized, such as at approximately 20 grams.

A visible slit may detract from the appearance of the card, and may also compromise the mechanical stability of the card. A typical card has a thickness of approximately 0.78 mm (780 µm).

The slit may be filled with a dielectric oxide. The slit may be hidden (or disguised) with a DLC (diamond-like carbon) coating. For example, a slit of 30 microns or less (i.e. width of the laser beam) may be coated with DLC having a thickness of 6 microns. The width of the slit may then be reduced in size by at least 12 microns. So, in essence, the slit resulting may be only 18 microns wide or less. However, DLC provides a gloss finish. To further conceal the slit, the metal layer or card body (such as titanium) may be sand blasted (or glass bead) blasted, such as before DLC or PVD (plasma vapor deposition) coating, and the finish will may turn out to be matte (not glossy) so that the slit is nearly impossible to see.

Alternatively, a pattern of lines may be provided, such as by burnishing the front of the card, to "camouflage" the slit.

Solid Metal Cards

The metal card body features a slit adjacent to the pocket accommodating the transponder chip module that extends to the outer edge of the card body, thereby rendering the card body as a coupling frame. The slit forms an electrical discontinuity that directs induced eddy currents, when the card is placed in a reader electromagnetic field, in a path that passes near or overlaps the transponder module antenna.

The solid metal card body may feature a cavity extending through the card at the module position to accommodate the chip IC and chip encapsulation and to facilitate an optimum overlap between the antenna tracks and the coupling frame.

The electrical discontinuity to form the slit may be a cut extending through the card body. A typical ID class metal card may have thickness 760 µm±76 µm. The depth of the slit may be reduced by milling or etching a recess in the rear surface of the card to a given depth (e.g. 400 µm) and allow for a reduced slit width to be formed. A process such as laser cutting may be used to define a slit width as low as, for example, 25 µm. By defining a narrow slit the slit may remain open (unfilled) and become discreet.

Due to the nature of laser cutting of the material whereby a taper is formed. The face of the coupling frame incident to the laser beam will normally develop a wider slit relative to the exit face, therefore the slit will have a tapered cross sectional profile.

Tapered Slits

FIG. 18A shows a metal layer (ML) or metal card body (MCB) 1820 into which a slit (S) 1830 may be laser-cut. For example, a laser cut slit in a 300 µm thick metal layer, which may serve as a card body, may be tapered, exhibiting a narrower width, such as 25 µm on one side (which may be visible to a user) and wider, such as 55 µm, on the other side.

FIG. 18A shows that a subsequent pulsed vapor deposition (PVD) of diamond-like carbon (DLC) coating 1832 may be applied to the card body as a decorative or protective later. By tuning the thickness of the applied coating, the width of the slit and its appearance may be concealed further. For example, application of a 6 µm DLC coating to a metal card bearing a slit of 25 µm width may result in an apparent slit widths of approximately 44 µm on one side and 12-13 µm on the other side, after coating.

Non-Conductive Stripe

Rather than having a slit, a discontinuity in the form of a non-conductive strip may be formed, such as by anodizing corresponding stripe of the metal. See US 20100078329 (2010 Apr. 1; Mirsky et al.). Also ALOX™ technology (MCL Micro Components Ltd., Israel).

For a solid metal card the slit may be replaced by an electrically isolating track (or non-conductive stripe) within the metal card body formed by, for example, selective anodic oxidation of the metal. This process may be applied to any metal or metal alloy card body that bears an electrically resistive oxide (e.g. aluminium, titanium, magnesium). The surfaces of the card may be masked and a window exposed in the mask by traditional lithographic processes or selective laser etching of the mask layer. The window may define the position, width and shape of the non-conductive stripe. The card body may be then processed to produce an electrically resistive region that runs through the card body as defined by the mask window. In this manner a discontinuity may be defined and form the required electrical discontinuity to permit the function of the card body as a coupling frame. An advantage of this method is that the slit region remains filled with material. This adds mechanical strength to the card body.

To further enhance the mechanical strength of the card in the slit region, the non-conductive strip (NCS) may have a non-linear shape, for example a wave shape. This type of NCS may be covered or colored for decorative effect. In particular, oxides such as aluminium oxide form a porous structure that readily accepts coloring agents. This may be used to selectively color the NCS distinct from the card body. It is noted that the use of these techniques may be applied to laminated metal cards for any of the outer or inner layers of the card.

Some Embodiments

As described herein, different metal layers of a smartcard may have slits oriented in different directions with respect to the overall card body, the slits shown therein originating at an outer edge of the card body and extending to within a position on the card body associated with the transponder chip module (TCM) such that the slit (S) overlaps at least a portion of, such as one side of) the module antenna (MA). Different layers may have slits oriented in different directions (extending from different sides of the card body). Cards having solid metal bodies will now be described.

Solid Metal Card (Version 1)

FIG. 19A is a diagrammatic view (perspective exploded) of a solid metal card (RFID device) 1900A, generally comprising:
- an 8 pin transponder chip module (TCM) 1910 (The module does not form part of the card body per se, rather it is disposed in the card body)
- a metal card body (MCB) 1920 which may have an overall thickness of approximately 800 µm. A slit (S1) 1930 is shown extending from the left edge of the card to an opening (MO) 1908 for the transponder chip module (TCM). The metal card body (MCB) may comprise titanium. The metal card body may be milled out, or thinned, from the back of the card, so that an area ("slit area") to the left of the module opening and including the slit S1 is recessed and may have a thickness of only approximately 400 µm. The titanium card body may be DLC black coated after milling.
- a metal backing insert (MBI) 1950 or plate which may have a thickness of approximately 360 µm and corresponding in size to the milled area (recess) on the back of the card body. The MBI spans the slit (S1) and reinforces the card at the slit area. The metal backing insert (MBI) may comprise titanium, and may be DLC black coated. A layer of adhesive 1932 which may have a thickness of approximately 20 µm may secure the metal backing insert (MBI) into the milled recess in the slit area.
- a module cover (MC) 1916 which may comprise a non-conductive material such as ceramic having a thickness of approximately 200 µm may be inserted into the module opening in the back of the card body and may be secured (retained) therein by a layer of adhesive 1934 which may have a thickness of approximately 20 µm. The module cover may be metal, but this is not recommended.

Solid Metal Card (Version 2)

FIG. 19B is a diagrammatic view (perspective exploded) of a solid metal card (RFID device) 1900B which may share some features and elements with the metal card 1900A. More particularly, the metal card 1900B may generally comprise:
- an 8 pin transponder chip module (TCM) 1910. (The module does not form part of the card body per se, rather it is disposed in the card body)
- a metal card body (MCB) 1920 which may have an overall thickness of approximately 800 µm. A slit (S1) 1930 is shown extending from the left edge of the card to an opening (MO) 1908 for the transponder chip module (TCM). The metal card body (MCB) may comprise titanium. The metal card body may be milled out, or thinned, from the back of the card, so that an area ("slit area") to the left of the module opening and including the slit (S1) is recessed and may have a thickness of only approximately 400 µm. The titanium card body may be DLC black coated after milling.
- the MCB may be formed as two metal layers, such as 400 µm thick each. A top one of the metal layers may have a slit (S) in a slit area. A bottom one of the layers may be cut-out in the area of the slit in the top layer to accept a metal backing insert (MBI), such as described hereinbelow.

In this embodiment, the back of the card may be further milled so that the thinned area surrounding the slit (S1) may extend further to the area of the transponder chip module (TCM), including surrounding the module opening. The thinned area on the back side of the card may be referred to as a "recessed area".

A metal backing insert (MBI) 1950 or plate may be provided which may have a thickness of approximately 360 µm and corresponding in size to the milled area (recess) on the back of the card body. The metal backing insert (MBI) may comprise tungsten or steel, and may be DLC black coated. A layer of adhesive 1932 which may have a thickness of approximately 20 µm may secure the metal backing insert (MBI) into the milled recess in the slit area. The MBI spans the slit (S1) and reinforces the card at the slit area.

In this embodiment, the metal backing insert (MBI) is larger than the MBI of the FIG. 19A embodiment, and covers not only the slit area but also the transponder area. The metal backing insert (MBI) may be provided with a module opening (MO) 1958, and may be provided with a slit (S2) 1952 extending from an edge of the MBI to the module opening. The slit S2 is shown extending to the right of the module opening MO, but it could as well extend upward or downward, but preferably not to the left. Note that the MBI is oriented in the card so that the slit (S2) does not extend to an edge of the card body, rather it is located in a central area of the card body.

A module cover (MC) 1916 which may comprise ceramic having a thickness of approximately 200 µm may be inserted into the module opening in the back of the card body and may be secured (retained) therein by a layer of adhesive 1936 which may have a thickness of approximately 20 µm.

This embodiment would seem to provide the best mechanical stability at the area of the slit S1, resisting flexing of the card. The metal backing insert (MBI) spans the slit S1, and may be approximately half the thickness of the overall card.

The metal card body may comprise two layers, each approximately 400 µm. A top layer may have the slit (S1), and the bottom layer may have an open area (corresponding to the aforementioned milled-out area) for accepting the metal backing insert (MBI).

The slit (S2) in the metal backing layer MBI is shown extending to the right, opposite from the slit (S1), but it may extend up or down, preferably not to the left—in other words, in any direction other than the slit (S1).

Generally, in various embodiments disclosed herein, there may be a "main" slit (S, S1) extending from an opening (MO) in a metal layer to the left edge of the smartcard, the left edge typically being the nearest edge to the transponder chip module (TCM). Additional slits (S2, S3) in other metal layers or elements (such as MBI) may extend from the opening (MO) in other directions, such as up, down or two the right. The general idea is that, if you have more than one slit, they should be either offset from one another (if extending in the same direction, such as S1 and S2 in FIG. 15B), or simply oriented differently (e.g., left or right or up or down) from one another to minimize compromising the mechanical integrity of the card. And, in some solid metal body embodiments, rather than having one card body (e.g., 800 µm thick), two metal layers (each 400 µm thick) can be joined to form the overall metal card body (MCB).

Solid Metal Card (Version 3)

FIG. 19C is a diagrammatic view (perspective exploded) of a solid metal card (RFID device) 1900C, generally comprising:

an 8 pin transponder chip module (TCM) 1910 (The module does not form part of the card body per se, rather it is disposed in the card body)

a metal card body (MCB) 1920 which may have an overall thickness of approximately 800 µm. A slit (S1) 1930 is shown extending from the left edge of the card to an opening (MO) 1908 for the transponder chip module (TCM). The metal card body (MCB) may comprise titanium. The metal card body may be milled out, or thinned, from the back of the card, so that an area ("slit area") to the left of the module opening and including the slit S1 is recessed and may have a thickness of only approximately 400 µm. The titanium card body may be DLC black coated after milling.

In this embodiment, the back of the card may be further milled so that the thinned area surrounding the slit (S1) may extend further to the area of the transponder chip module (TCM), including surrounding the module opening. The thinned area on the back side of the card may be referred to as a "recessed area".

a metal backing insert (MBI) 1950 or plate which may have a thickness of approximately 360 µm and corresponding in size to the milled area (recess) on the back of the card body. The metal backing insert (MBI) may comprise tungsten or steel, and may be DLC black coated. A layer of adhesive 1932 which may have a thickness of approximately 20 µm may secure the metal backing insert (MBI) into the milled recess in the slit area. The MBI spans the slit (S1) and reinforces the card at the slit area. The slit S2 in the MBI is shown extending in the opposite direction from the slit S1, in the manner of the MBI in FIG. 19B, but does not have an opening.

In this embodiment, the metal backing insert (MBI) is larger than the MBI of the FIG. 22A embodiment, and covers not only the slit area but also the transponder area. In this embodiment, the MBI may be provided without a module opening, and may be provided with a slit (S2) 1952 extending from an edge of the MBI to a position at the interior of the MBI so that the slit is under a portion of (and overlaps) the module antenna. Note that the MBI is oriented in the card so that the slit (S2) extends to an edge of the card body.

In this embodiment, a separate module cover (MC) is not needed since the MBI covers the module opening in the card.

Plastic-Metal-Plastic Cards

U.S. Pat. No. 8,672,232 discloses a card includes a first assembly comprised of multiple plastic layers attached via an adhesive to a metal layer. The multiple plastic layers forming the first assembly are laminated under a first selected temperature and pressure conditions to preshrink the multiple plastic layers, stress relieve the first assembly and render the first assembly dimensionally stable. The laminated first assembly is then attached to a metal layer via an adhesive layer to form a second assembly which is then laminated at a temperature below the first selected temperature to form a card which is not subjected to warpage and delamination. Claim 1 therein describes:

A method of making a card comprising the steps of:

forming a first assembly of a first predetermined thickness, said first assembly including at least two layers of plastic material;

firstly laminating the at least two layers of different plastic material at a first predetermined temperature and pressure for forming said first assembly;

wherein said first lamination step comprises preshrinking the at least two layers of plastic material and reducing subsequent dimensional changes of the layers forming the first assembly;

secondly forming a second assembly including said first assembly and a metal layer with an adhesive layer between the first assembly and the metal layer; and laminating the second assembly at a temperature which is lower than the first predetermined temperature.

A Production Method for Manufacturing DIF "Plastic-Metal-Plastic" Hybrid Cards

A typical smartcard may measure approximately 54 mm×86 mm. An overall sheet from which the plastic layers for the cards are manufactured may comprise a plurality, such as a 4×8 of card-size areas for manufacturing a plurality (such as 32 total) of plastic layers for the cards.

Pre-lamination may be used to offset the problem of shrinkage during final lamination, but this may depend on the size of the printed sheets used, i.e. the greater the sheet size (such 4×8-299 mm×489.7 mm) the greater the amount of shrinkage (e.g., in the y- and x-axes). Also, the material plays a pivotal role—for example, PVC shrinks more than PET or PETG.

Conventionally, two layers of plastic material, such as (i) an anti-scratch overlay and (ii) a printed graphic layer may be laminated together, i.e. "pre-laminated", before final lamination to either side (or to both sides) of a metal core.

As disclosed herein, at least two plastic layers, such as an overlay and a graphic layer, may be joined together by other than laminating, and may be referred to as a "sub-assembly" or a "plastic layer assembly"). A metal foil may be incorporated into the sub-assembly. These layers (and foil) may be different plastic materials (optionally, plus a metal foil), and may be joined together while in sheet form (multiple card areas). The printed plastic layer (or sheet) may be joined to an anti-scratch overlay film with an adhesive backing, or the layers may be collated or tacked together with one another (preferably outside of an area that will be printed) using an ultrasonic probe. By avoiding pre-lamination, there may be no pre-shrinking of the plastic layers involved. Ultimately, the sub-assemblies of joined plastic layers may be singulated (separated, reduced) into several card-size subassemblies (or plastic layer assemblies), and may be joined with a metal layer in card size format, and the resulting assembly (of subassemblies and metal layer) may be pre-pressed laminated together, before final lamination in a conventional press.

To avoid the problem of shrinkage, final lamination with the metal layer (which may be a coupling frame) will be a "card size" lamination step and not a sheet lamination process. Therefore, there will be no significant reduction on the overall dimensions of the plastic layers.

The techniques disclosed herein may be applicable to either (i) single interface (i.e., contact interface) cards, or to (ii) dual interface (i.e., contact and contactless interfaces) cards. The metal layer (ML) may have an opening to accommodate the mold mass of a chip module. In the case of dual interface cards, the metal layer may also be provided with a slit (S) extending from the opening to an outer edge of the metal layer so that the metal layer may function as a coupling frame (CF).

The metal layer or coupling frame may have a stepped opening (or recess) to accept a chip module. A larger portion of the opening may accommodate a module tape of a chip module, and the smaller opening may accommodate the mold mass of a chip module.

The opening in the metal layer may be filled with a plastic slug, plug, or the like, for two reasons. Firstly, during final lamination the plastic layers (printed stock and overlays, etc.) without the slug could (undesirably) flow into the area of the opening. Secondly, during milling of the recess area for the chip module, the milling tool should only touch plastic and not metal. Since the plastic plug will ultimately be removed or partially removed (by milling), and may not appear in the final product, it may be considered to be a "sacrificial" element.

To assemble the sub-assemblies and metal layer, a dry film adhesive may be placed on both sides of the metal layer or coupling frame. The card-size front and rear face subassemblies (or plastic layer assemblies) may then be pre-pressed against the adhesive layers and the metal core or coupling frame to form a card blank.

The resulting card blanks may be placed in a holding template (fixture) having a format such as 3×8, before final lamination in a conventional press. The cycle time for hot and cold lamination may be about 45 minutes.

The laminated card blanks may then be provided with a recess through the top subassembly of two or more plastic layers, and extending into the opening of the metal layer to accept a chip module. As mentioned above, the milling procedure should only be performed in the area of the plastic slug.

After implantation of the chip module, the card blank can be personalized.

FIG. 20A is a diagrammatic view of a DIF "Plastic-Metal-Plastic" Hybrid Card (RFID device), before lamination, generally comprising (from top-to-bottom, as viewed):

an 8 pin chip module 2010 which may be a transponder chip module (TCM). The chip module may be single interface (contact only), or dual-interface (contact and contactless). In the later case (dual interface), the chip module may be a transponder chip module having a module antenna. (A module antenna is not required in a contact only module.) In the main, a chip module which is a transponder chip module will be described, as exemplary.

a front clear overlay (plastic) layer 2062 which may have a thickness of approximately 50 μm. A recess or opening (shown in dashed lines "module recess") for accepting the module may be milled in this layer, after final lamination.

a front (plastic) printed core layer 2064 (displaying the logo "AMATECH") which may have a thickness of approximately 125 μm. A recess or opening (shown in dashed lines) for accepting the module may be milled in this layer, after final lamination.

the front clear overlay film with adhesive backing and front printed core may be adhesively attached together in sheet format and may constitute a front (plastic) subassembly (or plastic layer assembly) 2060.

a layer of adhesive 2022 which may have a thickness of approximately 20 μm a metal layer (ML) (or metal core) 2020 which may have a thickness of approximately 400 μm and which may be provided with an opening (MO) 2008 which may be a stepped recess extending through the metal layer. The metal layer may have a slit S (or a non-conductive stripe NCS) 2030 extending from the opening to an outer edge thereof so that the metal layer may function as a coupling frame (for a contactless interface). The metal layer or core may consist of several metal layers with slits. The slit is not necessary for a contact only chip module. The recess may be stepped, having a larger portion extending 100 µm into the metal layer, for a module tape of the chip module, and a smaller portion extending the rest of the way (additional 300 µm) through the metal layer for a mold mass of the chip module. This may ensure (in the case of contactless functionality) that the coupling frame appropriately overlaps the module antenna of the transponder chip module. The metal layer (ML) may comprise two metal layers, each having a thickness of approximately 200 µm. See FIG. 20B).

The opening MO 2008 in the metal layer ML 2020 may be filled with a plastic slug 2026.

a layer of adhesive 2024 which may have a thickness of approximately 20 µm a rear printed core 2074 which may have a thickness of approximately 125 µm. An opening or recess for the chip module may not be required in this layer.

a rear clear overlay 2072 which may have a thickness of approximately 50 µm. An opening or recess for the chip module may not be required in this layer.

a magnetic stripe may be disposed on the bottom (as viewed) surface of the rear clear overlay.

the rear clear overlay film with adhesive backing and rear printed core (including magnetic stripe) may be attached together and may constitute a rear (plastic) subassembly (or plastic layer assembly) 2070.

Card-size front and rear face subassemblies (plastic layer assemblies) may be pre-pressed against the adhesive layers and the metal core or coupling frame to form a card blank.

FIG. 20B is a diagrammatic view of an alternate construction of a DIF "Plastic-Metal-Plastic" Hybrid Card (RFID device) 2000B, before lamination. Generally, this embodiment differs from that of FIG. 20A in that the single metal layer (ML) 2020 having a thickness of approximately 400 µm is replaced by two metal layers (ML1, ML2) 2020A, 2020B each having a thickness of approximately 200 µm. There is a layer 2023 of adhesive between the two metal layers ML1 and ML2. More particularly, the card may comprise (from top-to-bottom, as viewed):

a front clear overlay (plastic) layer 2062 which may have a thickness of approximately 50 µm. A recess or opening (shown in dashed lines "module recess") for accepting the module may be milled in this layer, after final lamination.

a front (plastic) printed core layer 2064 (displaying the logo "AMATECH") which may have a thickness of approximately 125 µm. A recess or opening (shown in dashed lines) for accepting the module may be milled in this layer, after final lamination.

the front clear overlay film with adhesive backing and front printed core may be adhesively attached together in sheet format and may constitute a front (plastic) subassembly (or plastic layer assembly) 2060.

a layer of adhesive 2022 which may have a thickness of approximately 20 µm a first metal layer (ML1) 2020A which may have a thickness of approximately 200 µm and which may be provided with an opening (MO) 2008A extending through the metal layer. The metal layer may have a slit S (or a non-conductive stripe NCS) 2030A extending from the opening to an outer edge thereof so that the metal layer may function as a coupling frame (for a contactless interface).

a layer of adhesive 2023 which may have a thickness of approximately 20 µm a second metal layer (ML1) 2020B which may have a thickness of approximately 200 µm and which may be provided with an opening (MO) 2008B extending through the metal layer. The metal layer may have a slit S (or a non-conductive stripe NCS) 2030B extending from the opening to an outer edge thereof so that the metal layer may function as a coupling frame (for a contactless interface).

The openings MO 2008A and 200b in the metal layers ML1 2020A and ML2 2020B may be aligned with one another, and may be filled with a plastic slug 2026.

a layer of adhesive 2024 which may have a thickness of approximately 20 µm a rear printed core 2074 which may have a thickness of approximately 125 µm. An opening or recess for the chip module may not be required in this layer.

a rear clear overlay 2072 which may have a thickness of approximately 50 µm. An opening or recess for the chip module may not be required in this layer.

a magnetic stripe may be disposed on the bottom (as viewed) surface of the rear clear overlay.

the rear clear overlay film with adhesive backing and rear printed core (including magnetic stripe) may be attached together and may constitute a rear (plastic) subassembly (or plastic layer assembly) 2070.

FIG. 20C shows an exemplary slug 2026 for fitting in the stepped recess (MO, 2008). Note that the plug resembles (but may be shorter/shallower than) a chip module, having an upper wider portion 2027 (corresponding to the module tape of a chip module) and a lower narrower portion 2028 (corresponding to the mold mass of a chip module).

FIG. 20D shows an exemplary chip module, which may be an antenna module (AM) or a transponder chip module (TCM), comprising a module tape (MT) and mold mass (MM) encapsulating a chip (IC). In the case of a dual-interface (contact and contactless) chip module, which may be referred to herein as a transponder chip module (TCM), a module antenna may (MA) be incorporated into the chip module.

Manufacturing a Plastic-Metal-Plastic Card

Smartcards bearing a metal core or metal face may be laminated to one or more layers of plastic. The layers of plastic in the card stack may comprise one or more materials including, but not limited to, Polyvinyl Chloride (PVC), Polycarbonate (PC), Polyethylene terephthalate (PET) or Polyethylene Terephthalate Glycol-modified (PET-G). The construction of such a card typically requires the use of thermally activated adhesives at the interfaces between the plastic layers and metal and, optionally, between one or more plastic layers.

A smartcard with a metal core, together with plastic or other layers, may be assembled in a stack-up including one or more metal layers, for lamination at a required temperature. A challenge with this process is that typical plastic layers used in a smartcard construction are prone to shrinkage, plastic egress and other dimensional changes when heated above their glass transition temperature ($T_g$) or Vicat softening temperature (e.g. Vicat B standard). For example, PET-G may have a Vicat B temperature of approximately 82° C. The dimensional changes that occur during typical lamination conditions (e.g. 120° C., 45 minutes) can result in significant distortion of the card stack-up at the edges of the finished card and at the locations of any cavities or voids. In addition, in order to construct a smartcard one or more of the plastic layers of the card may bear printed graphics. Dimensional changes in a printed layer of the card can result in visible distortion of the printed graphics.

Under this aspect of the invention one or more of the plastic layers used for smartcard construction may be heated to a value T1a above their $T_g$ or Vicat temperatures, and then cooled. This process may be repeated at alternate temperatures T1b, T1c, etc., forming a cycle. The heating of the plastic layer(s) may be carried out under pressure in sheet form, roll-to-roll, or on coils of plastic material bearing optional spacer layers to prevent sticking of layers to each other.

The thermal cycling process results in dimensional changes in the plastic layer(s). Following thermal cycling the material may be trimmed back to required shape or size, the use of thermal cycling may ensure dimensional stability of the plastic layers during further processing steps. At this stage one or more layers of plastic may be printed with the graphics required for the given smartcard design.

The dimensionally stable plastic layers can be laminated to each other and to the metal core or face of the smartcard. The use of adhesives with low activation temperature ensures that the lamination process to produce a final smartcard can be carried out a temperature T2<T1.

In practical terms, the pre-shrinking of the thermoplastic layers before printing may ensure that the plastic does not further shrink or expand during final lamination of the card stack-up with the metal core in a conventional press.

Selecting a front and rear plastic layer with a higher glass transition temperature than the adhesive layers has a significant advantage in avoiding further shrinkage or expansion of the plastic layer assemblies during the final lamination process.

And, contrary to the teachings of U.S. Pat. No. 8,672,232, the plastic layers of the first and second assembly can be of the same material, for example, the printed plastic layer can be made of polycarbonate, while the overlay film can also be polycarbonate. As noted in U.S. Pat. No. 8,672,232 . . .

A method of making a card comprising the steps of:
forming a first assembly of a first predetermined thickness, said first assembly including at least two layers of plastic material;
firstly laminating the at least two layers of different plastic material at a first predetermined temperature and pressure for forming said first assembly;
wherein said first lamination step comprises preshrinking the at least two layers of plastic material and reducing subsequent dimensional changes of the layers forming the first assembly;
secondly forming a second assembly including said first assembly and a metal layer with an adhesive layer between the first assembly and the metal layer; and
laminating the second assembly at a temperature which is lower than the first predetermined temperature.

Pre-shrinking is conventionally done in a conventional lamination press, subjecting the plastic layers to hot and cold cycles under extreme pressure (>20 bar). As disclosed herein, the plastic layers may be pre-shrunk in a belt laminator under insignificant pressure and merely tempering the material. Instead of a belt laminator to pre-shrink the plastic layers before printing, a conventional lamination press can be used.

The following materials and manufacturing steps may be utilized.

Pre-Shrinking of the Front and Rear Plastic Layer Prior to Printing

Materials
   Material Layer for Printing: Polycarbonate White
   Manufacturer: Bayer
   Product Code: ID 4-4
   Thickness: 150 microns
   Material Layer for Anti-scratch Overlay Film: Polycarbonate Clear
   Manufacturer: Bayer
   Product Code: ID 6-2
   Thickness: 50 microns
Production Step 1—Temperature Cycling
   Belt Laminator Parameters for Temperature Cycling the Plastic Layers:
   Temperature 125 degrees C.
   Pressure: 10 PSI/CM$^3$
   Speed 1.5 cm/sec
Production Step 2
   Print features onto the pre-shrunk white polycarbonate (PC) to produce the front and rear face graphic layers
Production Step 4
   Lightly tack or bond the printed 150 micron PC to the back of the Clear 50 micron overlay film with enough force from the back side of the printed layer that no imprint on the overlay film is visible.
Production Step 4
   Punch the pre-shrunk PC layers into card size plastic layer assemblies (ID1 size)
Production Step 5
   Tack the adhesive layers to the back side of the front and rear plastic layer assemblies (two layers: Printed layer and Overlay Film).
Production Step 6—Final Lamination
   Place the "card size" stack-up containing the front and rear plastic layers assemblies, the intermediate adhesive layers and the metal core (400 μm) into a laminator
   Lamination Parameters:
   Laminate using Standard PVC setting parameters
Temperature & Pressure Settings: 140° C. and 160 Bar pressure for 30 minutes.
Metal Prelams U.S. 62/712,216 filed 31 Jul. 2018 discloses techniques for manufacturing smartcards with metal prelams. As noted therein, in order to maximize manufacturing efficiency the smartcard constructions considered hitherto may be produced through use of multi-card arrays or formats, laminated in one or more steps, before cutting or milling of each individual card from the assembly. In this manner any format may be chosen to suit a given production environment and set of applicable machines. In the descriptions below a format of 2×8 cards is shown for illustration purposes but any alternative format may be equally considered. The manufacturing steps detailed below may result in the formation of an assembly of one or metal layers with plastic layers or other metal layers, or with inserts, in order to form a metal "prelam" (laminated article, or construction) that may be used in conjunction with other material layers in subsequent lamination steps to build the final smartcard construction. It is envisaged that all lamination steps may be consolidated into a single lamination process for some of the constructions detailed below, given the use of appropriate adhesives and materials. It is noted that the use of the term "metal prelam" along with the descriptions below of manufacturing sequences are not restricted to the use of multiple lamination steps.

Fiducial arrays may be provided. The fiducial arrays (FA) may be holes, crosses or other shapes that be cut through the respective sheet or surface marks. The fiducial arrays (FA) may be used to align artwork from printed graphics layers (PGL). The fiducial arrays (FA) may also be visible following completion of the card stack-up to assist with registration for isolation of the cards by, for example, CNC milling.

The application of inner plastic layers in the formation of the metal prelam may facilitate the lamination of pre-printed graphics layers in a second lamination step using the optimum conditions to prevent distortion of the printed artwork and allow adhesion to adjacent layer(s).

Following final lamination, the openings for the transponder chip module may be milled into each smartcard site. The cavity created for the TCM may penetrate both metal layers but not necessarily all lower plastic and adhesive layers of a finished smartcard stack-up, thereby leaving a region of plastic covering the TCM location at the rear side of the smartcard.

The application of a primer to the surface of the inner plastic layers (IPL) may facilitate direct inkjet or offset printing, for example, of the surface of the metal prelam. The print primer (PP) may be applied post-lamination of the metal prelam by screen printing or film transfer or the print primer may be in place on the surface of the IPL prior to lamination. This method facilitates the direct printing of graphics onto the metal prelam. It is noted that the print primer may also be applied directly to the metal surfaces with the omission of the IPL layers.

Manufacturing a Plastic-Metal-Plastic Smartcard for Digital Printing

Inlays for smartcards may typically be manufactured in "sheets" having a plurality of sites, each site corresponding to an individual smartcard. After various laminating steps, the sheets may be singulated (cut) into a plurality of individual ID-1 size smartcards. The sites may be arranged in an array, having a number of rows and columns, such as 2×8 (16 sites) or 3×7 (21 sites).

The module opening, or "pocket" for accepting a transponder chip module is typically created by milling. Milling plastic is relatively easy. Milling may be a bit more difficult for cards having metal layers or a metal card body.

HP Indigo digital presses use a light sensitive plate that attracts ink. Unlike conventional printing that uses a fixed (etched) plate that cannot change, the HP Indigo Photo Imaging Plate (PIP) is a dynamic light sensitive plate that can be re-imaged with different information on every revolution of the printing cylinder. The ink is attracted to the PIP by an electrical charge, rather than a physical transfer from ink tray to cylinder.

Digitally printing on a metal inlay in a format 2×8 or 3×7 may be achieved by laminating plastic sheets such as PVC to a metal inlay core layer having a thickness for example of 350 μm (14 mils). The laminated PVC layers brings the overall thickness to approximately 600 μm for digital printing, before a protective overlay layer is laminated to both sides of the pre-printed laminate.

A "shrouded" metal inlay for a smartcard may comprise a metal core with a thickness of approximately 350 μm, sandwiched between PVC layers having a thickness of approximately 125 μm each (total of PVC-metal core-PVC equals approximately 600 μm). (The PVC layers are disposed on the front and back surfaces of the metal core layer.) Later, after milling the opening for the chip module and printing, protective overlay layers may be applied, front and back (obverse and reverse), resulting in an overall thickness of approximately 760 μm. The resulting metal-embedded card may weigh approximately 14 grams.

To avoid later CNC milling of the module pocket having a metal layer in card format, the metal inlay can be laser cut to prepare the opening for later milling and implanting of the chip module. As discussed above the opening can be stuffed (or pre-filled) with a plastic slug. Alternatively the PVC layers may be directly laminated over the metal inlay with openings, and PVC may at least partially fill the opening. Subsequently, on a conventional "mill and stick" machine, the plastic can easily be milled and the chip module can be inserted into the plastic milled pocket, without having to mill through metal.

Corona treatment (Ion blast) to enable digital printing on PVC may expose an operator to electric shock. Beneficially, the metal layer (core) may not extend to edge of the inlay (i.e. the metal should not be exposed to the machine operator). Therefore, a plastic "gutter" frame is typically required around the metal edges, to avoid an electric shock.

PVC shrouded metal inlays having a thickness of 600 μm or greater would simplify the production of plastic-metal-plastic smartcards, significantly reducing the production cycle time.

While the invention(s) has/have been described with respect to a limited number of embodiments, these should not be construed as limitations on the scope of the invention(s), but rather as examples of some of the embodiments. Those skilled in the art may envision other possible variations, modifications, and implementations that are also within the scope of the invention(s), and claims, based on the disclosure(s) set forth herein.

What is claimed is:

1. Smartcard, comprising:
   a card body (CB) comprising a stackup of at least two metal layers, each of the metal layers (ML) having a discontinuity in the form of a slit (S) or nonconductive stripe (NCS) extending through the layer from an outer edge of the layer to an interior position thereof;
   wherein the slit of a given metal layer is positioned or oriented differently than the slit(s) of the other metal layer(s) so that the slits of the at least two metal layers are not aligned with one another;
   further comprising:
   a transponder chip module (TCM) disposed in the card body, said transponder chip module comprising an RFID chip (IC) and a module antenna (MA);
   wherein the slit in at least one of the metal layers overlaps the module antenna.

2. The smartcard of claim 1, wherein:
   at least one of the metal layers extends from edge-to-edge on the card body.

3. The smartcard of claim 1, wherein:
   the interior position of at least one of the metal layers is a module opening (MO) for receiving a transponder chip module (TCM).

4. The smartcard of claim 1, further comprising:
   a front metal layer which is continuous, not having a slit or discontinuity, shielded from the other at least two metal layers by a shielding layer (SL).

5. The smartcard of claim 1, wherein:
   the transponder chip module further comprises contact pads (CP); and
   the smartcard is dual interface, operable in both contact and contactless modes.

6. A metal smartcard capable of operating in at least a contactless mode comprising:
   a metal card body (MCB) having an opening (MO) for receiving a transponder chip module; and
   a slit (S) extending through the card body from an edge of the card body to the opening;
   wherein:
   when a transponder chip module (TCM) is disposed in the opening, the slit overlaps at least a portion of a module antenna (MA) in the transponder chip module.

7. The metal smartcard of claim 6, wherein:
the opening is stepped so that a portion of the transponder chip module having the module antenna extends beyond a smaller portion of the opening and overlaps the slit.

8. The metal smartcard of claim 6, further comprising:
a thinned area forming a recess on a back side of the card body in an area including the slit; and
a metal backing insert disposed in the recess, spanning the slit and reinforcing the card body at the slit area.

9. The metal smartcard of claim 6, wherein;
the metal backing insert comprises a slit (S2) extending from an edge of the backing insert to the opening.

10. The metal smartcard of claim 9, wherein:
the metal backing insert is oriented so that the slit (S2) does not extend to an edge of the card body, but rather is located in a central area of the card body.

11. The metal smartcard of claim 6, wherein:
the opening extends through the card body; and
further comprising a module cover (MC) disposed in the opening at the back of the card body.

12. A method of manufacturing a shrouded metal inlay for a smartcard, comprising:
providing a metal core layer having a plurality of sites, each site corresponding to an individual smartcard;
disposing PVC layers on the front and back of the metal core layer; and
digitally printing at least one of the PVC layers.

13. The method of claim 12, wherein:
the sites are arranged in an array having rows and columns.

14. The method of claim 12, wherein:
the metal core layer has a thickness of approximately 350 µm.

15. The method of claim 12, wherein:
the PVC layers each has a thickness of approximately 125 µm.

16. The method of claim 12, further comprising:
laminating protective overlay layers to both sides of the pre-printed laminate.

17. The method of claim 12, further comprising:
milling openings for accepting transponder chip modules.

18. The method of claim 12, further comprising:
cutting the sheets into a plurality of individual ID-1 size smartcards.

* * * * *